United States Patent
Tanaka

(10) Patent No.: US 7,528,685 B2
(45) Date of Patent: May 5, 2009

(54) LAMB WAVE TYPE HIGH FREQUENCY DEVICE

(75) Inventor: Satoru Tanaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 341 days.

(21) Appl. No.: 11/380,509

(22) Filed: Apr. 27, 2006

(65) Prior Publication Data

US 2006/0255884 A1    Nov. 16, 2006

(30) Foreign Application Priority Data

| May 11, 2005 | (JP) | ............................. 2005-138088 |
| Oct. 5, 2005 | (JP) | ............................. 2005-292129 |
| Oct. 7, 2005 | (JP) | ............................. 2005-294431 |
| Dec. 27, 2005 | (JP) | ............................. 2005-374470 |
| Feb. 6, 2006 | (JP) | ............................. 2006-028017 |

(51) Int. Cl.
*H03H 9/00* (2006.01)
*H03H 9/25* (2006.01)
*H03H 9/125* (2006.01)

(52) U.S. Cl. ..................................... 333/195; 333/193

(58) Field of Classification Search .................. 333/133, 333/186, 193, 195, 196
See application file for complete search history.

(56) References Cited

U.S. PATENT DOCUMENTS

| 6,466,108 | B2 * | 10/2002 | Matsuda et al. | ............ 333/193 |
| 7,015,776 | B2 * | 3/2006 | Takamine | ................... 333/195 |
| 7,245,193 | B2 * | 7/2007 | Funasaka | .................... 333/193 |
| 2005/0077982 | A1 | 4/2005 | Funasaka | |
| 2006/0158800 | A1 | 7/2006 | Takayama et al. | |

FOREIGN PATENT DOCUMENTS

| JP | A 61-136312 | 6/1986 |
| JP | A 02-250412 | 10/1990 |
| JP | A 08-181561 | 7/1996 |
| JP | 10-233645 | 9/1998 |
| JP | A 2001-332958 | 11/2001 |
| JP | 2002076820 A * | 3/2002 |
| JP | 2002223143 A * | 8/2002 |
| JP | 2003-258596 | 9/2003 |
| JP | A 2004-072204 | 3/2004 |
| JP | A 2004-222267 | 8/2004 |
| JP | A 2005-269284 | 9/2005 |

(Continued)

OTHER PUBLICATIONS

Nakagawa et al., Lamb Wave Type Substrate for Elastic Wave Devices, 33rd EM Symposium 2004, pp. 93-96 (English-language translation of relevant portion).

(Continued)

*Primary Examiner*—Dean O Takaoka
(74) *Attorney, Agent, or Firm*—Oliff & Berridge, PLC

(57) ABSTRACT

A lamb wave type high frequency device includes: an interdigital transducer (IDT) electrode having an electrode finger interdigitated therein; a pair of reflectors having an electrode finger and being disposed at both sides of a propagation direction of a lamb wave excited by the IDT electrode; and a piezoelectric substrate on a surface of which the IDT electrode and the reflectors are disposed, wherein a pitch of the electrode finger of the IDT electrode and a pitch of the electrode finger of the reflectors are different from one another.

12 Claims, 31 Drawing Sheets

FOREIGN PATENT DOCUMENTS

KR    2005-0021876    3/2005

OTHER PUBLICATIONS

Kanna et al., Frequency-Temperature Analysis of Surface Acoustic Waves Using Finite Method, Technical Report of IEICE, US99-20, (Jun. 1996), pp. 37-42 (English-language translation of relevant portion).

Nakagawa Y. et al., "Resonators Using Lamb Wave on AT Cut Quartz," The Institute of Electronics, Information and Communication Engineers, Technical Report of IEICE, 2004, vol. 104, No. 468, pp. 1-7.

* cited by examiner

RELATED ART

LAMB WAVE TYPE HIGH FREQUENCY DEVICE

BACKGROUND

1. Technical Field

The present invention relates to a lamb type wave high frequency device used for communication apparatuses.

2. Related Art

High frequency devices are well known as devices included in high frequency resonators or filters. Typical examples of the high frequency resonator include surface acoustic wave elements using Rayleigh wave or an SH wave, and lamb wave elements using a lamb wave, which is a bulk wave. Some bandwidth filters also use the same waves as described above.

For example, a Rayleigh wave type surface acoustic wave element is known in which an interdigital transducer (IDT) electrode is formed in the Z' axis direction, in which a surface acoustic wave is propagated, on the surface of a quartz crystal substrate called as an ST cut. The element is, for example, cited in a first example of related art.

A surface acoustic wave element using an STW cut quartz crystal substrate is also known, i.e. an SH wave type surface acoustic wave element in which a transverse wave propagated as a surface acoustic wave in the direction shifted by 90 degrees from the Rayleigh wave on the ST cut quartz crystal substrate. The element is, for example, disclosed in a third example of related art.

In addition to the surface acoustic wave, a lamb wave element is known that uses a bulk wave (a volume wave) propagating in a piezoelectric substrate by repeating reflections on the upper and lower surfaces thereof. The lamb wave element is known as the device particularly suitable for being used in high frequency since its phase velocity is faster than that of the surface acoustic wave. The element is, for example, sited in a second and fourth examples of related art.

In the lamb wave type element described above, it is known that a lamb wave can be efficiently excited using an AT cut quartz crystal substrate as a piezoelectric substrate, provided that the thickness H of the quartz crystal substrate and a wave length $\lambda$ of a lamb wave are set in the range of $0<2H/\lambda \leq 10$.

Analysis on frequency temperature characteristics of surface acoustic wave using finite element method, Technical Report of IEICE, US99-20 (1999-06), pp 37-42, Shigeo Kanna, is the first example of related art. Substrate for lamb wave type surface acoustic wave element, $33^{rd}$ EM Symposium 2004, pp. 93-96, Yasuhiko Nakagawa, Masayuki Momose, and Shouji Kakio, is the second example of related art. JP-A-10-233645 is the third example of related art. JP-A-2003-258596 is the fourth example of related art.

The Rayleigh wave type surface acoustic wave element cited in the first example of related art hardly copes with a high frequency range since its theoretical phase velocity is about 3100 m/s even though it shows excellent frequency temperature characteristics as the surface acoustic wave element.

The SH wave type surface acoustic wave device cited in the first example of related art employs tantalum or tungsten having a density larger than that of aluminum as an electrode material to improve frequency temperature characteristics. However, it causes a disadvantage in that loss in electric resistance increases and further the phase velocity decreases.

The lamb wave element cited in the second example of related art can achieve high phase velocity (high frequency). However, the element has a disadvantage in that a desired resonance characteristic is not achieved due to so-called a spurious, in which another oscillation mode arises during the excitation of a selected oscillation mode since the exciting strength of an oscillation mode to be selectively used is low.

Here, disadvantages of known lamb wave elements will be described as a lamb wave type high frequency resonator as an example so as to further make clear advantages of the invention.

FIGS. 55A and 55B show a structure of known lamb wave type high frequency resonators. FIG. 55A is a perspective view illustrating a schematic structure. FIG. 55B is a cross-sectional view taking along the line Q-Q of FIG. 55A. In FIGS. 55A and 55B, a lamb wave type high frequency resonator 100 is composed of an interdigital transducer (IDT) electrode 130, and reflectors 140 and 150 that are provided at both sides of the IDT electrode 130, and a piezoelectric substrate 120 made of quartz crystal. The IDT electrode 130 and the reflectors 140 and 150 are fabricated on the surface of the piezoelectric substrate 120. The IDT electrode 130 includes a pair of interdigital finger electrodes 131 and 132. The reflectors 140 and 150 are disposed at both sides of the propagation direction of a lamb wave excited by the IDT electrode 130 and include electrode fingers (150a and 150b are shown as a representative). Hereinafter, the interdigital finger electrode 131 at one side is called as a first interdigital finger electrode 131, while the interdigital finger electrode 132 at the other side is called as a second interdigital finger electrode 132.

In the IDT electrode 130, the first interdigital finger electrode 131 and the second interdigital finger electrode 132, both of which are shaped in a comb-teeth like, are interdigitated. Here, the distance from the edge of an electrode finger 131a to an electrode finger 151b of the first interdigital finger electrode 131 is set as the wavelength $\lambda$ of the lamb wave. Each width of the electrode fingers 131a and 131b is represented as Li.

The distance (may be called as a pitch) from the edge of the electrode finger 131a to the electrode finger 132a, which is interdigitated between the electrode fingers 131a and 131b, of the second interdigital finger electrode 132 is represented as Pi.

The distance (may be called as a pitch) from the edge of the electrode finger 150a to the electrode finger 150b in the reflector 150 is represented as Pr. Each width of the electrode fingers 150a and 150b is represented as Lr.

In the IDT electrode 130 and the reflectors 140 and 150, the pitches are set as to satisfy the relation of Pi=Pr, while the widths are set so as to satisfy the relation of Li=Lr.

Here, the following relation is satisfied: Hi=Hr, where Hi is each thickness of the electrode fingers 131a, 131b, and 132a of the IDT electrode 130, and Hr is each thickness of the electrode fingers 150a and 150b of the reflector 150.

The IDT electrode 130 and the reflector 140 are formed with the same electrode material such as aluminum (Al). Accordingly, the following relation is satisfied: pi=pr, where pi is the density of the electrode material of the IDT electrode 130 (may be called as the density of the IDT electrode), and pr is the density of the electrode material of the reflector 140 (may be called as the density of the reflector).

Next, impedance frequency characteristics, and conductance frequency characteristics of the lamb wave type high frequency resonator 100 structured as above will be described.

FIG. 56 is a graph illustrating an impedance frequency characteristic of the lamb wave type high frequency resonator 100 structured as above described (refer to FIG. 55). The horizontal axis shows frequency (presented by the value of $f/f_G$, where $f_G$ is the maximum G frequency, and f is the frequency of the resonator), while the vertical axis shows the absolute value (unit is Ω) of impedance. As shown in FIG. 56, responses of a number of oscillation modes (hereinafter, may be simply referred to as a mode), i.e. A to F, of a lamb wave are confirmed in the lamb wave type high frequency resonator 100. This possibly results in other modes being exhibited as a spurious since they are not suppressed if the frequency of mode E is used for an oscillator, easily causing failures such as abnormal oscillations or frequency jumps.

Subsequently, reasons why an oscillation mode causing a spurious cannot be suppressed by known design will be described based on frequency characteristics of the radiation conductance and a reflection coefficient of the reflector.

Each of FIGS. 57 to 59 is a graph illustrating frequency characteristics of the radiation conductance and the reflection coefficient in respective modes B, C, and E in FIG. 56. The horizontal axis shows frequency (presented by the value of $f/f_G$, where $f_G$ is the maximum G frequency, and f is the frequency of a resonator), while the vertical axis shows the radiation conductance (unit is S) and the absolute value of the reflection coefficient of the reflector.

Here, the following symbols represent as follows: G is the radiation conductance of the IDT electrode 130 only; Gres is the radiation conductance of whole lamb wave type high frequency resonator including the reflector; and Γ is the reflection coefficient of the reflector. In addition, the following terms are defined as follows: the maximum G frequency is the frequency when G shows the maximum; the maximum Gres frequency is the frequency when Gres shows the maximum; a reflection frequency band is the frequency range in which the absolute value of Γ is 0.5 and more; and a reflection center frequency is the frequency when the absolute value of Γ shows the maximum.

The larger G and Gres, the lamb wave is more intensively excited; the larger the absolute value of Γ, the lamb wave is more intensively reflected by the reflector. As shown in FIGS. 57 to 59, the maximum value of Gres is larger than the maximum value of G in modes B, C, and E, when the IDT electrode 130, and reflectors 140 and 150 are structured as above described. The reason why the maximum value of Gres in the modes B, C, and E become larger as described above is that the maximum G frequency is within the reflection frequency band. This means that each mode excited by the IDT electrode 130 is more extensively excited due to the efficient reflection by the reflectors 140 and 150.

As described above, according to the known technique, every mode shown in FIG. 56 is extensively excited by the reflectors 140 and 150, causing problems such as abnormal oscillations, and frequency jumps if the technique is employed to oscillator applications. In addition, if it is employed to filter applications, there arises a problem of ripples in frequency bands. Therefore, it is preferable that the maximum G frequency of mode excluding desired one is out of the reflection frequency band.

SUMMARY

An advantage of the invention is to provide a lamb wave type high frequency resonator in which the excitation of a mode to be used is intensified and a spurious is suppressed.

According to a first aspect of the invention, a lamb wave type high frequency device includes: an IDT electrode in which an electrode finger is interdigitated; a pair of reflectors that have an electrode finger and disposed at both sides of a propagation direction of a lamb wave excited by the IDT electrode; and a piezoelectric substrate on a surface of which the IDT electrode and the reflectors are disposed. A pitch of the electrode finger of the IDT electrode and a pitch of the electrode finger of the reflectors are different from one another.

According to the structure, high frequency can easily be achieved since the lamb wave can be excited. Since the pitch of the electrode finger is different, which is conventionally the same, in the reflectors and the IDT electrode, the mode to be selectively used can be intensively excited, and simultaneously the spurious can be suppressed.

It is preferable that two electrode fingers adjacent each other in the IDT electrode are interdigitated in the range of the wavelength λ of a lamb wave.

According to the structure, there is an effect in that the lamb wave type high frequency device can be downsized by reducing the number of electrode fingers included in reflectors since the spurious can effectively be suppressed by reflector design and a reflection wave produced by the IDT electrode can be utilized.

It is preferable that two sets of electrode fingers, one set of which is composed of two electrode fingers adjacent each other, among electrode fingers of the IDT electrode are interdigitated in the range of the wavelength λ of a lamb wave.

According to the structure, the spurious can effectively be suppressed since the spurious can effectively be suppressed by reflector design and reflection wave produced by the IDT electrode is balanced out.

According to a second aspect of the invention, a lamb wave type high frequency device includes: an IDT electrode in which an electrode finger is interdigitated; a pair of reflectors that have an electrode finger and disposed at both sides of a propagation direction of a lamb wave excited by the IDT electrode; and a piezoelectric substrate on a surface of which the IDT electrode and the reflectors are disposed. A pitch of the electrode finger of the IDT electrode and a pitch of the electrode finger of the reflectors are different from one another. An insulation film is deposited so as to cover the IDT electrode.

Accordingly, by depositing the insulation film covering the IDT electrode, the reflection coefficient of a reflection wave in the IDT electrode becomes small, enabling the reflection of the reflection wave to be lessened. As a result, the oscillation mode that exhibits a maximum G frequency out of a reflection frequency band is further suppressed, enabling the occurrence of the spurious to be reduced.

It is preferable that two electrode fingers adjacent each other in the IDT electrode are interdigitated in the range of the wavelength λ of a lamb wave, and an insulation film covering the IDT electrode is formed.

According to the structure, the spurious can be almost eliminated by further intensifying the excitation of the desired oscillation mode with a synergy effect created by the combination of the following two effects as described above: one is the effect obtained when two electrode fingers are interdigitated in the range of the wavelength λ of the lamb wave; and the other is the effect obtained when the insulation film covering the IDT electrode is formed.

It is preferable that two sets of electrode fingers, one set of which is composed of two electrode fingers adjacent each other, among electrode fingers of the IDT electrode are interdigitated in the range of the wavelength λ of a lamb wave, and an insulation film covering the IDT electrode is formed.

Accordingly, the spurious can be almost eliminated by further intensifying the excitation of the desired oscillation mode with a synergy effect created by the combination of the following two effects as described above: one is the effect obtained when four electrode fingers are interdigitated in the range of the wavelength λ of the lamb wave; and the other is the effect obtained when the insulation film covering the IDT electrode is formed.

It is preferable that Δt/λ, which is the value obtained by dividing Δt by the wavelength λ of a lamb wave, is set in the range of Δt/λ≦0.044, provided that Δt is the height difference in a concavity and a convexity of the surface of the insulation film.

When the insulation film is formed on the surface of the IDT electrode, a concavity and a convexity arise on the surface of the insulation film due to the presence or nonpresence of the electrode finger. By setting the height difference in a concavity and a convexity so as to be in the range described above, an influence, which is caused by a concavity and a convexity of the insulation film, to the reflection of the lamb wave can be eliminated. The reflection coefficient of the IDT electrode can be lessened to a negligible level. As a result, the reflection of a reflection wave seldom arises. Consequently, the oscillation mode that exhibits a maximum G frequency out of a reflection frequency band is further suppressed, enabling the spurious response to be reduced.

According to a third aspect of the invention, a lamb wave type high frequency device includes: an IDT electrode in which an electrode finger is interdigitated; a pair of reflectors that have an electrode finger and disposed at both sides of a propagation direction of a lamb wave excited by the IDT electrode; and a piezoelectric substrate on a surface of which the IDT electrode and the reflectors are disposed. A width of the electrode finger of the IDT electrode and a width of the electrode finger of the reflectors are different from one another.

According to the third aspect of the invention, a maximum G frequency of the oscillation mode to be used becomes around a reflection center frequency so that the mode is effectively reflected as compared with the lamb wave element by the known technique described above. As a result, a radiation conductance G becomes large, enabling the excitation to be intensified. This is because that the width of electrode finger of the IDT electrode and the width of electrode finger of the reflector are set different from one another. In addition, the excitation of modes excluding the desired one can be suppressed since their maximum G frequencies are out of the reflection frequency band of the reflector. As a result, the spurious can be eliminated.

It is preferable that two electrode fingers adjacent each other in the IDT electrode are interdigitated in the range of the wavelength λ of a lamb wave.

As described above, in a case where two electrode fingers are interdigitated in the range of the wavelength λ of the lamb wave, the reflection of the lamb wave arises in the IDT electrode. This resulting reflection wave in the IDT electrode can intensify the excitation of a desired oscillation mode. Thus, the excitation of the oscillation mode can be further intensified together with the effect obtained by the above-described setting in which the width of the electrode finger and the width of the electrode finger of the reflector are different from one another. Moreover, this makes it possible to reduce the number of electrode fingers of the reflector, resulting in the effect to downsize the lamb wave type high frequency resonator.

It is preferable that two sets of electrode fingers, one set of which is composed of two electrode fingers adjacent each other, among electrode fingers of the IDT electrode are interdigitated in the range of the wavelength λ of a lamb wave.

The oscillation mode that exhibits the maximum G frequency out of the reflection frequency band is further suppressed since the reflection wave in the IDT electrode is balanced out by disposing two sets of electrode fingers, i.e. four electrode fingers, in the range of wavelength λ. As a result, the occurrence of the spurious can be reduced by combining the effect obtained when the widths of electrode finger of the IDT electrode and the width of electrode finger of the reflector are set to be different from one another.

According to a fourth aspect of the invention, a lamb wave type high frequency device includes: an IDT electrode in which an electrode finger is interdigitated; a pair of reflectors that have an electrode finger and disposed at both sides of a propagation direction of a lamb wave excited by the IDT electrode; and a piezoelectric substrate on a surface of which the IDT electrode and the reflectors are disposed. A width of the electrode finger of the IDT electrode and a width of the electrode finger of the reflectors are different from one another. An insulation film is deposited so as to cover the IDT electrode.

Accordingly, by depositing the insulation film covering the IDT electrode, the reflection coefficient of a reflection wave in the IDT electrode becomes small, enabling the reflection of the reflection wave to be lessened. As a result, the oscillation mode that exhibits a maximum G frequency out of a reflection frequency band is further suppressed, enabling the occurrence of the spurious to be reduced.

It is preferable that two electrode fingers adjacent each other in the IDT electrode are interdigitated in the range of the wavelength λ of a lamb wave, and an insulation film covering the IDT electrode is formed.

According to the structure, the spurious can be almost eliminated by further intensifying the excitation of the desired oscillation mode with a synergy effect created by the combination of the following two effects as described above: one is the effect obtained when two electrode fingers are interdigitated in the range of the wavelength λ of the lamb wave; and the other is the effect obtained when the insulation film covering the IDT electrode is formed.

It is preferable that two sets of electrode fingers, one set of which is composed of two electrode fingers adjacent each other, among electrode fingers of the IDT electrode are interdigitated in the range of the wavelength λ of a lamb wave, and an insulation film covering the IDT electrode is formed.

Accordingly, the spurious can be almost eliminated by further intensifying the excitation of the desired oscillation mode with a synergy effect created by the combination of the following two effects as described above: one is the effect obtained when four electrode fingers are interdigitated in the range of the wavelength λ of the lamb wave; and the other is the effect obtained when the insulation film covering the IDT electrode is formed.

It is preferable that Δt/λ, which is the value obtained by dividing Δt by the wavelength λ of a lamb wave, is set in the range of Δt/λ≦0.044, provided that Δt is the height difference in a concavity and a convexity of the surface of the insulation film.

When the insulation film is formed on the surface of the IDT electrode, a concavity and a convexity arise on the surface of the insulation film due to the presence or nonpresence of the electrode finger. By setting the height difference in a concavity and a convexity so as to be in the range described above, an influence, which is caused by a concavity and a convexity of the insulation film, to the reflection of the lamb wave can be eliminated. The reflection coefficient of the IDT electrode can be lessened to a negligible level. As a result, the reflection of a reflection wave seldom arises. Consequently, the oscillation mode that exhibits a maximum G frequency out of a reflection frequency band is further suppressed, enabling the spurious response to be reduced.

According to a fifth aspect of the invention, a lamb wave type high frequency device includes: an IDT electrode in which an electrode finger is interdigitated; a pair of reflectors that have an electrode finger and disposed at both sides of a propagation direction of a lamb wave excited by the IDT electrode; and a piezoelectric substrate on a surface of which the IDT electrode and the reflectors are disposed. A thickness of the electrode finger of the IDT electrode and a thickness of the electrode finger of the reflectors are different from one another.

According to the third aspect of the invention, a maximum G frequency of the oscillation mode to be used becomes around a reflection center frequency so that the mode is effectively reflected as compared with the lamb wave element by the known technique described above. A radiation conductance G becomes large, enabling the excitation to be intensified. This is because that the thickness of electrode finger of the IDT electrode and the thickness of electrode finger of the reflector are set different from one another. In addition, the excitation of frequency modes excluding the desired one can be suppressed since their maximum G frequencies are out of the reflection frequency band of the reflector. As a result, the spurious can be suppressed.

It is preferable that two electrode fingers adjacent each other in the IDT electrode are interdigitated in the range of the wavelength $\lambda$ of a lamb wave.

As described above, in a case where two electrode fingers are interdigitated in the range of the wavelength $\lambda$ of the lamb wave, the reflection of the lamb wave arises hi the IDT electrode. This resulting reflection wave in the IDT electrode can intensify the excitation of a desired oscillation mode by the reflection wave in the IDT electrode. Thus, the excitation of the oscillation mode can be further intensified together with the effect obtained by the above-described setting in which the thickness of the electrode finger and the thickness of the electrode finger of the reflector are different from one another. Moreover, this makes it possible to reduce the number of electrode fingers of the reflector, resulting in the effect to downsize the lamb wave type high frequency resonator.

It is preferable that two sets of electrode fingers, one set of which is composed of two electrode fingers, among electrode fingers of the IDT electrode are interdigitated in the range of the wavelength $\lambda$ of a lamb wave.

The oscillation mode that exhibits the maximum G frequency out of the reflection frequency band is further suppressed since the reflection wave in the IDT electrode is balanced out by disposing two sets of electrode fingers, i.e. four electrode fingers, in the range of wavelength $\lambda$. As a result, the occurrence of the spurious can be reduced by combining the effect obtained when the thickness of electrode finger of the IDT electrode and the thickness of electrode finger of the reflector are set to be different from one another.

According to a sixth aspect of the invention, a lamb wave type high frequency device includes: an IDT electrode in which an electrode finger is interdigitated; a pair of reflectors that have an electrode finger and disposed at both sides of a propagation direction of a lamb wave excited by the IDT electrode; and a piezoelectric substrate on a surface of which the IDT electrode and the reflectors are disposed. A thickness of the electrode finger of the IDT electrode and a thickness of the electrode finger of the reflectors are different from one another. An insulation film is deposited so as to cover the IDT electrode.

Accordingly, by depositing the insulation film covering the IDT electrode, the reflection coefficient of a reflection wave in the IDT electrode becomes small, enabling the reflection of the reflection wave to be lessened. As a result, the oscillation mode that exhibits a maximum G frequency out of a reflection frequency band is further suppressed, enabling the occurrence of the spurious to be reduced.

It is preferable that two electrode fingers adjacent each other in the IDT electrode are interdigitated in the range of the wavelength $\lambda$ of a lamb wave, and an insulation film covering the IDT electrode is formed.

According to the structure, the width of electrode finger becomes wide in the same wavelength as compared with the structure in which two sets of the IDT electrodes, one set of which is composed of two electrodes, are interdigitated in the range of the wavelength $\lambda$ of the lamb wave. This width has an advantage to achieve higher frequency. In addition, the excitation of the spurious can further be suppressed by a synergy effect, as described as above, created by the combination of the following two effects: one is the effect obtained when two electrode fingers of the IDT electrode are interdigitated in the range of the wavelength $\lambda$ of the lamb wave; and the other is the effect obtained when the insulation film covering the IDT electrode is formed.

It is preferable that two sets of electrode fingers, one set of which is composed of two electrode fingers, among electrode fingers of the IDT electrode are interdigitated in the range of the wavelength $\lambda$ of a lamb wave, and an insulation film covering the IDT electrode is formed.

Accordingly, the response of the spurious can be almost eliminated by further suppressing the excitation of the spurious with a synergy effect created by the combination of the following two effects as described above one is the effect obtained when four electrode fingers are interdigitated in the range of the wavelength $\lambda$ of the lamb wave; and the other is the effect obtained when the insulation film covering the IDT electrode is formed.

It is preferable that $\Delta t/\lambda$, which is the value obtained by dividing $\Delta t$ by the wavelength $\lambda$ of a lamb wave, is set in the range of $\Delta t/\lambda \leq 0.044$, provided that $\Delta t$ is the height difference in a concavity and a convexity of the surface of the insulation film.

When the insulation film is formed on the surface of the IDT electrode, a concavity and a convexity arise on the surface of the insulation film due to the presence or nonpresence of the electrode finger. By setting the height difference in a concavity and a convexity so as to be in the range described above, an influence, which is caused by a concavity and a convexity of the insulation film, to the reflection of the lamb wave can be eliminated. The reflection coefficient of the IDT electrode can be lessened to a negligible level. As a result, the reflection of a reflection wave seldom arises. Consequently, the oscillation mode that exhibits a maximum G frequency out of a reflection frequency band is further suppressed, enabling the occurrence of the spurious to be reduced.

According to a seventh aspect of the invention, a lamb wave type high frequency device includes: an IDT electrode in which an electrode finger is interdigitated; a pair of reflectors that have an electrode finger and disposed at both sides of a propagation direction of a lamb wave excited by the IDT electrode; and a piezoelectric substrate on a surface of which the IDT electrode and the reflectors are disposed. A density of electrode material forming the IDT electrode and a density of electrode material forming the reflectors are different from one another.

According to the seventh aspect of the invention, a maximum G frequency of the oscillation mode to be used becomes around a reflection center frequency so that the mode is effectively reflected as compared with the lamb wave element by the known technique described above. A radiation conductance G becomes large, enabling the excitation to be intensified. This is because that the density of electrode material forming the IDT electrode and the density of electrode material forming the reflector are set different from one another. In addition, the excitation of frequency modes excluding the desired one can be suppressed since their maximum G frequencies are out of the reflection frequency band of the reflector. As a result, the spurious can be suppressed.

It is preferable that two electrode fingers adjacent each other among the electrode fingers in the IDT electrode are interdigitated in the range of the wavelength λ of a lamb wave.

As described above, in a case where two electrode fingers are interdigitated in the range of the wavelength λ of the lamb wave, the reflection of the lamb wave arises in the IDT electrode. This resulting reflection wave in the IDT electrode can intensify the excitation of a desired oscillation mode. Thus, the excitation of the oscillation mode can be further intensified together with the effect obtained by the above-described setting in which the density of the electrode material of the IDT electrode and the density of the electrode material of the reflector are different from one another. Moreover, this makes it possible to reduce the number of electrode fingers of the reflector, resulting in the effect to downsize the lamb wave type high frequency resonator.

It is preferable that two sets of electrode fingers, one set of which is composed of two electrode fingers, among electrode fingers of the IDT electrode are interdigitated in the range of the wavelength λ of a lamb wave.

The oscillation mode that exhibits the maximum G frequency out of the reflection frequency band is further suppressed since the reflection wave in the IDT electrode is balanced out by disposing two sets of electrode fingers, i.e. four electrode fingers, in the range of wavelength λ. As a result, the occurrence of the spurious can be reduced by combining the effect obtained when the density of electrode material of the IDT electrode and the density of electrode material of the reflector are set to be different from one another.

According to an eighth aspect of the invention, a lamb wave type high frequency device includes: an IDT electrode in which an electrode finger is interdigitated; a pair of reflectors that have an electrode finger and disposed at both sides of a propagation direction of a lamb wave excited by the IDT electrode; and a piezoelectric substrate on a surface of which the IDT electrode and the reflectors are disposed. A density of electrode material forming the IDT electrode and a density of electrode material forming the reflectors are different from one another. An insulation film covering the IDT electrode is formed.

Accordingly, by depositing the insulation film covering the IDT electrode, the reflection coefficient of a reflection wave in the IDT electrode becomes small, enabling the reflection of the reflection wave to be lessened. As a result, the oscillation mode that exhibits a maximum G frequency out of a reflection frequency bard is further suppressed, enabling the spurious to be reduced.

It is preferable that two electrode fingers adjacent each other in the IDT electrode are interdigitated in the range of the wavelength λ of a lamb wave, and an insulation film covering the IDT electrode is formed.

According to the structure, the width of electrode finger becomes wide in the same wavelength as compared with the structure in which two sets of the IDT electrodes, one set of which is composed of two electrodes, are interdigitated in the range of the wavelength λ of the lamb wave. This width has an advantage to achieve high frequency. In addition, the excitation of the spurious can further be suppressed by a synergy effect, as described as above, created by the combination of the following two effects: one is the effect obtained when two electrode fingers of the IDT electrode are interdigitated in the range of the wavelength λ of the lamb wave; and the other is the effect obtained when the insulation film covering the IDT electrode is formed.

It is preferable that two sets of electrode fingers, one set of which is composed of two electrode fingers, among electrode fingers of the IDT electrode are interdigitated in the range of the wavelength λ of a lamb wave, and an insulation film covering the IDT electrode is formed.

Accordingly, the occurrence of the spurious can be almost eliminated by further suppressing the excitation of the spurious with a synergy effect created by the combination of the following two effects as described above: one is the effect obtained when four electrode fingers are interdigitated in the range of the wavelength λ of the lamb wave; and the other is the effect obtained when the insulation film covering the IDT electrode is formed.

It is preferable that $\Delta t/\lambda$, which is the value obtained by dividing $\Delta t$ by the wavelength λ of a lamb wave, is set in the range of $\Delta t/\lambda \leq 0.044$, provided that $\Delta t$ is the height difference in a concavity and a convexity of the surface of the insulation film.

When the insulation film is formed on the surface of the IDT electrode, a concavity and a convexity arise on the surface of the insulation film due to the presence or nonpresence of the electrode finger. By setting the height difference in a concavity and a convexity so as to be in the range described above, an influence, which is caused by a concavity and a convexity of the insulation film, to the reflection of the lamb wave can be eliminated. The reflection coefficient of the IDT electrode can be lessened to a negligible level. As a result, the reflection of a reflection wave seldom arises. Consequently, the oscillation mode that exhibits a maximum G frequency out of a reflection frequency band is further suppressed, enabling the occurrence of the spurious to be reduced.

It is preferable that the piezoelectric substrate is made of quartz crystal.

By using a quartz crystal substrate as the piezoelectric substrate, a temperature frequency characteristic can be achieved in which frequency varies little with temperature change as compared with a Rayleigh wave type surface acoustic wave element using a quartz crystal substrate of ST cut, and an SH wave type surface acoustic wave element using STW cut quartz crystal, which are known technique as aforementioned. In addition, a lamb wave type high frequency resonator can be achieved in which the spurious is suppressed by combination of the aspects of the invention described above.

BRIEF DESCRIPTION OF THE DRAWINGS

The invention will be described with reference to the accompanying drawings, Wherein like numbers refer to like elements, and wherein:

FIG. 55A is a perspective view illustrating a schematic structure;

FIG. 55B is a cross-sectional view;

DESCRIPTION OF EXEMPLARY EMBODIMENTS

Hereinafter, exemplary embodiments will be described by taking a lamb wave type high frequency resonator as an example with reference to accompanying drawings.

The following items are paid attention to solve problems by varying each of them: the pitch, width, and thickness of the electrode finger of the IDT electrode and reflector that are included in the lamb wave type high frequency resonator; and the density of the electrode material.

In a case where the pitches of the electrode fingers in the IDT electrode and reflector are different from one another.

First Embodiment

Figure 1:
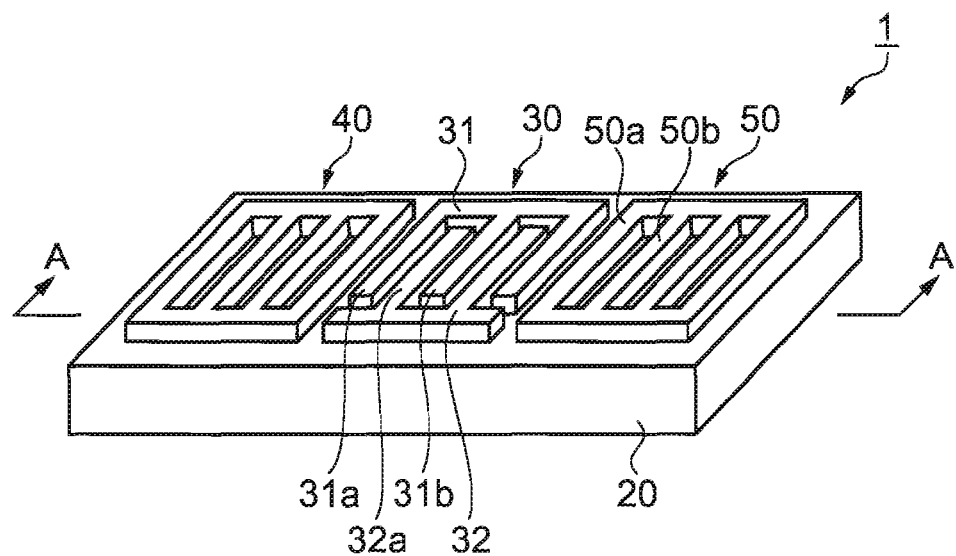
FIG. 1 is a perspective view illustrating a lamb wave type high frequency resonator according to a first embodiment of the invention.
Figure 2:
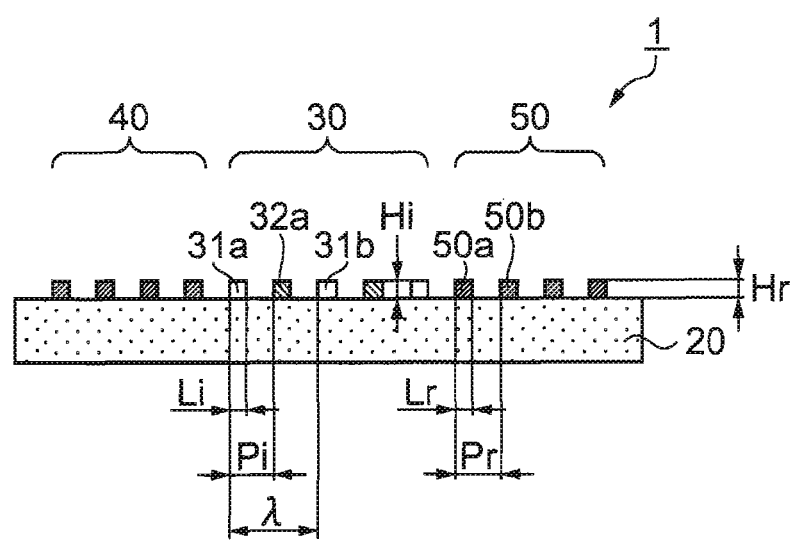
FIG. 2 is a cross-sectional view of the lamb wave type high frequency resonator according to the first embodiment of the invention taking along the line A-A in FIG. 1.

FIG. 1 is a perspective view illustrating a lamb wave type high frequency resonator 1 according to a first embodiment. FIG. 2 is a cross-sectional view taken along the line A-A in FIG. 1.

In FIGS. 1 and 2, the lamb wave type high frequency resonator 1 is composed of an IDT electrode 30 including a pair of interdigital finger electrodes 31 and 32, a pair of reflectors 40 and 50 including electrode fingers 50a and 50b, and a piezoelectric substrate 20 made of quartz crystal. The IDT electrode 30, and the reflectors 40 and 50 are fabricated on the surface of the piezoelectric substrate 20. The reflectors 40 and 50 are disposed at both sides of the propagation direction of a lamb wave excited by the IDT electrode 30. Hereinafter, an interdigital finger electrode 31 at one side is called as a first interdigital finger electrode 31, while an interdigital finger electrode 32 at the other side is called as a second interdigital finger electrode 32.

In the IDT electrode 30, the first interdigital finger electrode 31 and the second interdigital finger electrode 32 are interdigitated. Here, the distance from the edge of an electrode finger 31a to an electrode finger 31b, both of which are shaped in a comb-teeth like and included in the first interdigital finger electrode 31, is set as the wavelength λ of the lamb wave. Each width of the electrode fingers 31a and 31b is represented as Li.

The distance (may be called as a pitch) from the edge of the electrode finger 31a to an electrode finger 32a, which is interdigitated between the electrode fingers 31a and 31b, of the second interdigital finger electrode 32 is represented as Pi. The width of the electrode finger 32a is also represented as Li.

The distance (may be called as a pitch) from the edge of the electrode finger 50a to the electrode finger 50b in the reflector 50 is represented as Pr. Each width of the electrode fingers 50a and 50b is represented as Lr.

The width and pitch of other electrode fingers, which are not described above, included in the IDT electrode 30, and other electrode fingers included in the reflectors 50 and 40 are set in the same relation while their descriptions are omitted.

Here, relations are set as follows: the electrode finger width Li of the IDT electrode 30 and the electrode finger width Lr of the reflector 50 satisfy the relation of Li=Lr; and the pitch Pi of the IDT electrode 30 and the pitch Pr of the reflector 50 satisfy the relation of Pi≠Pr.

A lamb wave is excited by inputting an input drive signal having a given frequency to the IDT electrode 30 structured as described above, propagating in the longitudinal direction of the piezoelectric substrate 20 with repeating reflections on the front and back surfaces of the piezoelectric substrate 20 to be reflected by the reflectors 40 and 50.

The frequency characteristics of the radiation conductance and the reflection coefficient of the reflector 50, of the lamb wave type high frequency resonator 1 of the embodiment will be described below.

Figure 3:
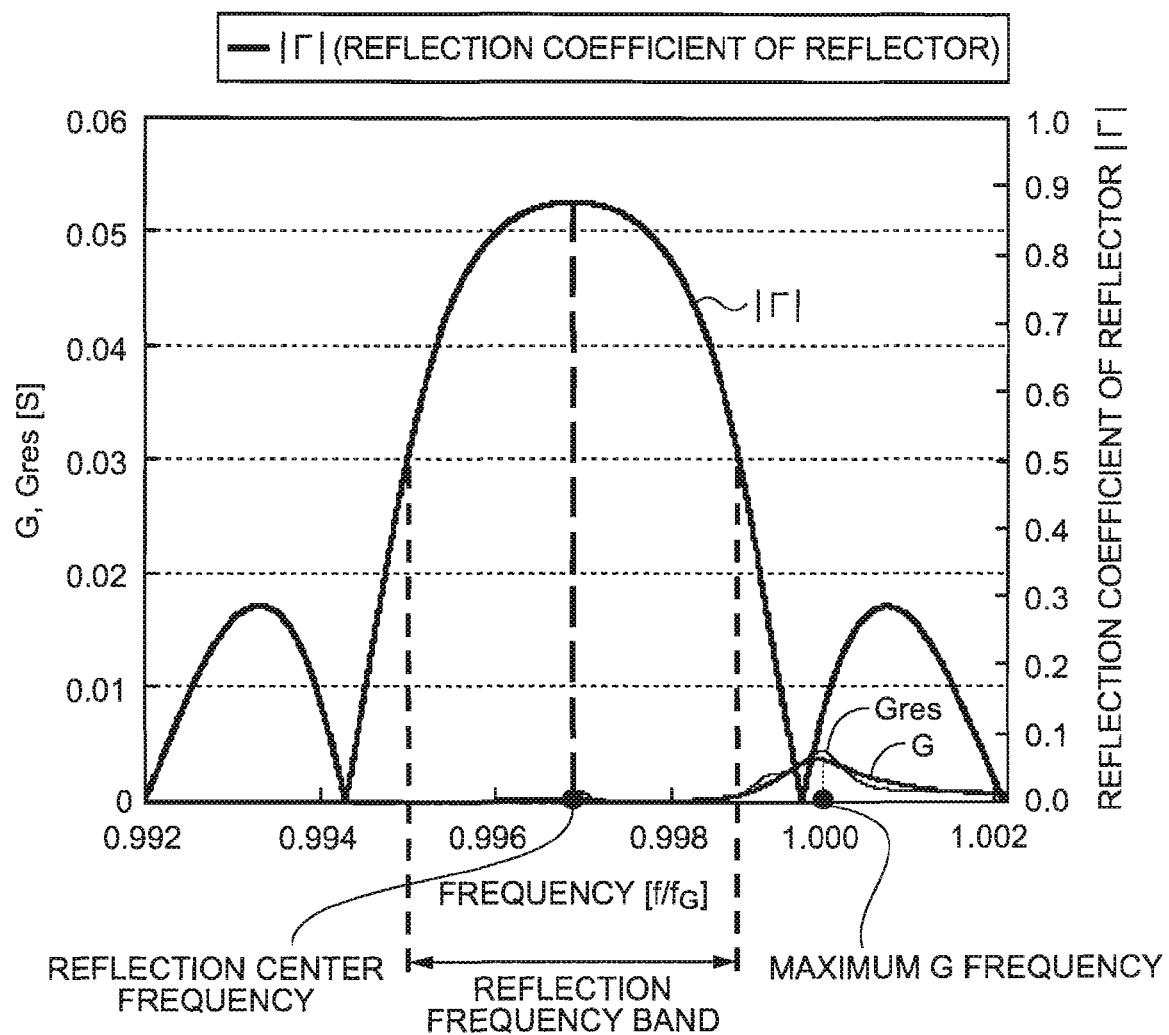
FIG. 3 is a graph illustrating frequency characteristics of a radiation conductance and a reflection coefficient of a reflector, in mode B of the lamb wave type high frequency resonator according to the first embodiment of the invention.
Figure 4:
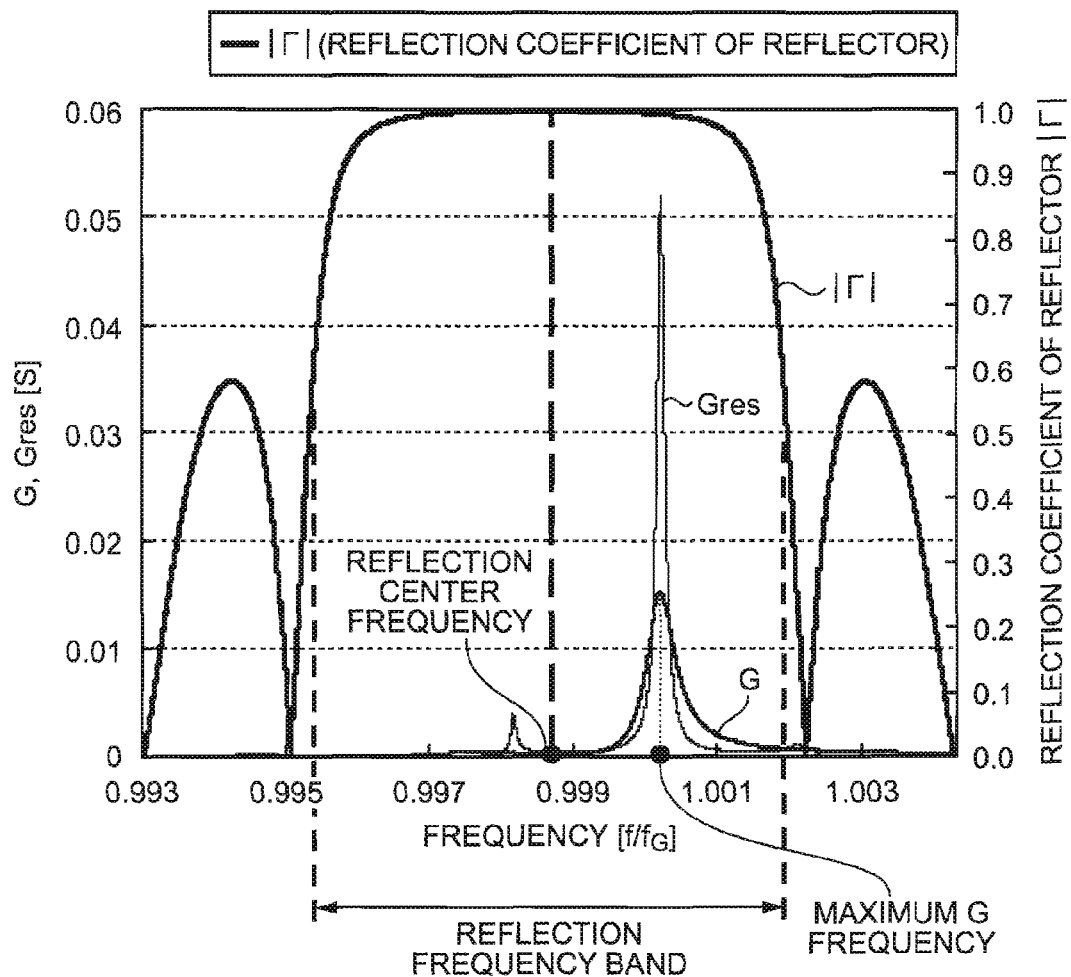
FIG. 4 is a graph illustrating frequency characteristics of a radiation conductance and a reflection coefficient of the reflector, in mode E of the lamb wave type high frequency resonator according to the first embodiment of the invention.

FIG. 3 shows the frequency characteristics of the radiation conductance and the reflection coefficient of the reflector 50 in mode B, provided that the pitches of the reflector 50 and IDT electrode 30 satisfy the relation of Pr/Pi=1.0046. FIG. 4 shows the frequency characteristics of the radiation conductance and the reflection coefficient of the reflector 50 in mode E with the same condition as described above.

Figure 57:
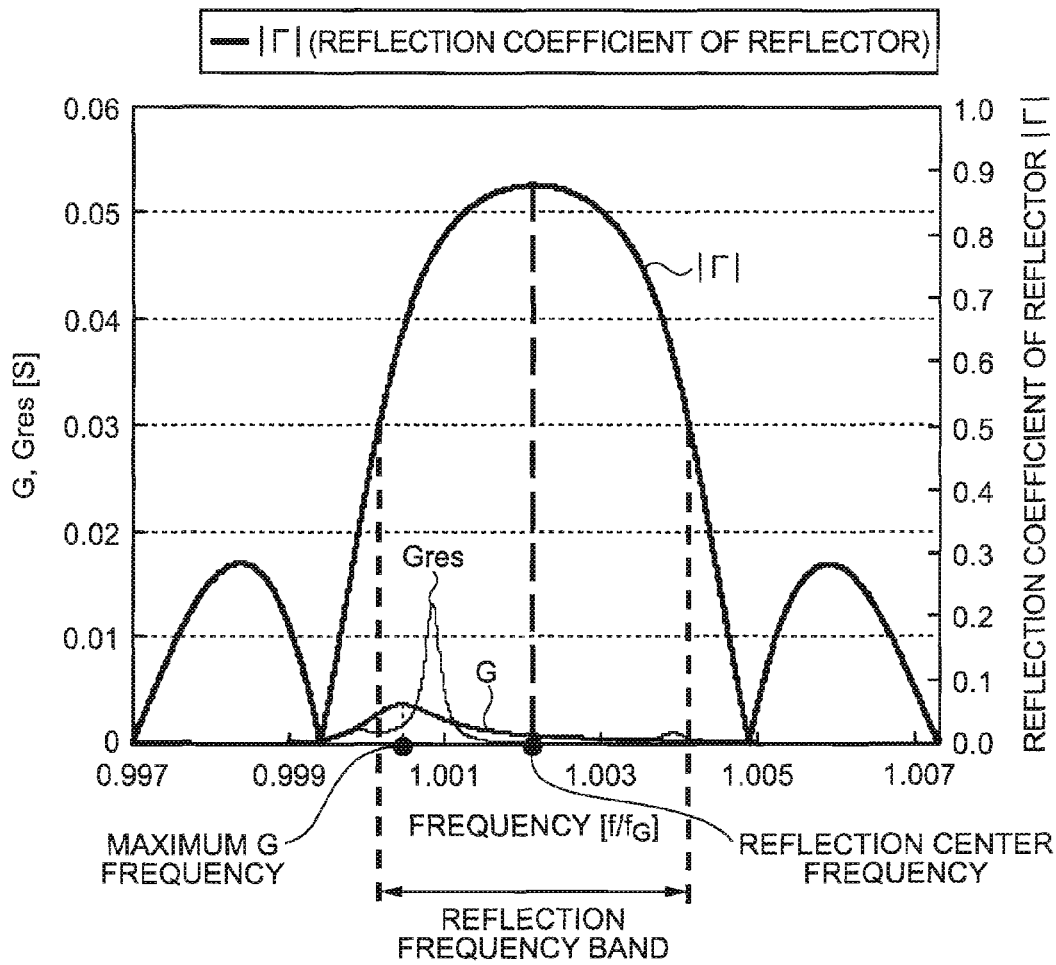
FIG. 57 is a graph illustrating a relation of a frequency characteristic of a radiation conductance and a frequency characteristic of a reflection coefficient in mode B of the lamb wave type high frequency resonator according to related art.

As shown in FIG. 3, the reflection center frequency is shifted to a low frequency side as compared with the known design shown in FIG. 57 when the pitches of the reflector 50 and IDT electrode 30 satisfy the relation of Pi≠Pr. Since the maximum G frequency of mode B is out of the reflection frequency band as described above, the excitation of mode B can be suppressed. Namely, the mode B can be suppressed from being exhibited as a spurious.

Figure 59:
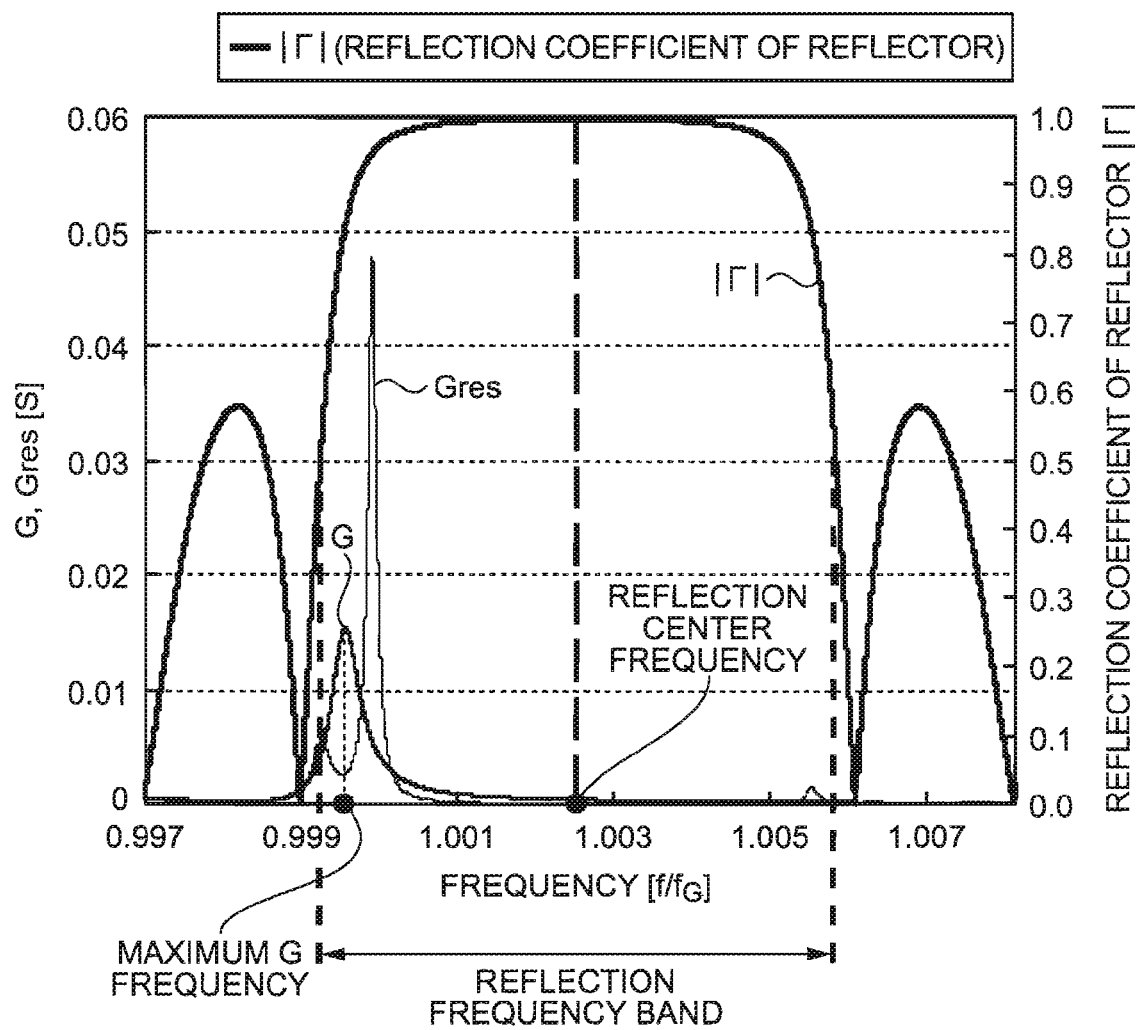
FIG. 59 is a graph illustrating a relation of a frequency characteristic of a radiation conductance and a frequency characteristic of a reflection coefficient in mode E of the lamb wave type high frequency resonator according to related art.

In contrast, as for the mode E, the maximum G frequency is within the reflection frequency band as shown in FIG. 4 even though the pitches of the reflector 50 and the IDT electrode 30 are designed so as to satisfy the relation of Pi≠Pr. As a result, the Gres is larger than that of the known design shown in FIG. 59, resulting in the mode B being intensively excited. Namely, the mode to be used can be intensively excited. As described above, if the design is carried out so that the maximum G frequency of the mode to be used is within the reflection frequency band, and the spurious is out of the frequency band, only the excitation of mode to be used can be intensified; simultaneously the spurious can be suppressed.

Figure 5:
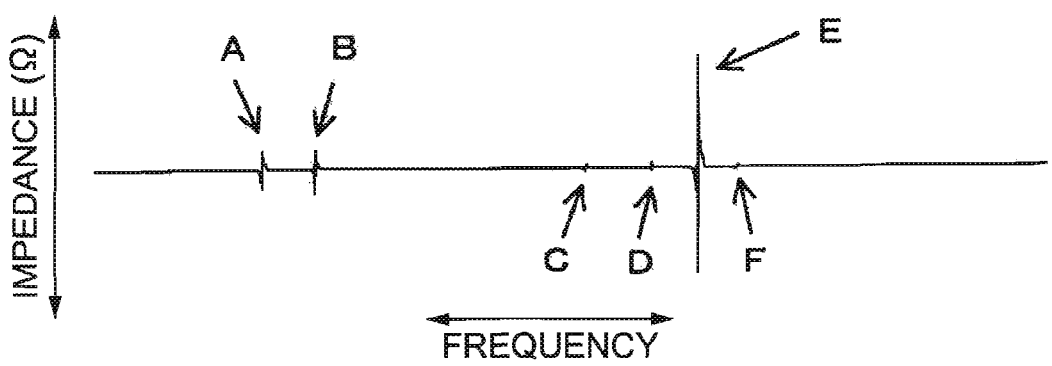
FIG. 5 is a graph illustrating an impedance frequency characteristic of the lamb wave type high frequency resonator according to the first embodiment of the invention.

FIG. 5 shows the impedance frequency characteristic of the lamb wave type high frequency resonator 1 of the embodiment, provided that the pitches of electrodes in the reflector 50 and the IDT electrode 30 satisfy the relation of Pr/Pi=1.0046 as described above.

As shown in FIG. 5, only the mode E of the lamb wave is extensively excited; modes A, B, C, D, and F, other than mode E, are suppressed. Consequently, in a case where oscillators are structured by using the lamb wave type high frequency resonator 1, oscillators having high reliability without abnormal oscillations and frequency jumps can be achieved. In addition, it is known that reflection arises in the IDT electrode 30 in the structure in which two electrode fingers of the IDT electrode 30 are included in the range of the wavelength of a lamb wave. Utilizing the resulting reflection wave allows the excitation to be more intensified, reducing the number of electrode fingers in the reflectors 40 and 50. As a result, the lamb wave type high frequency resonator 1 can be downsized.

Second Embodiment

Next, a lamb wave type high frequency resonator according to a second embodiment of the invention will be described with reference to accompanying drawings. As compared with the first embodiment (refer to FIGS. 1 and 2), the second embodiment differs in the stricture of the electrode finger of the IDT electrode, and is featured in that four electrode fingers of the IDT electrode are interdigitated in the range of the wavelength λ of the lamb wave.

Figure 6:
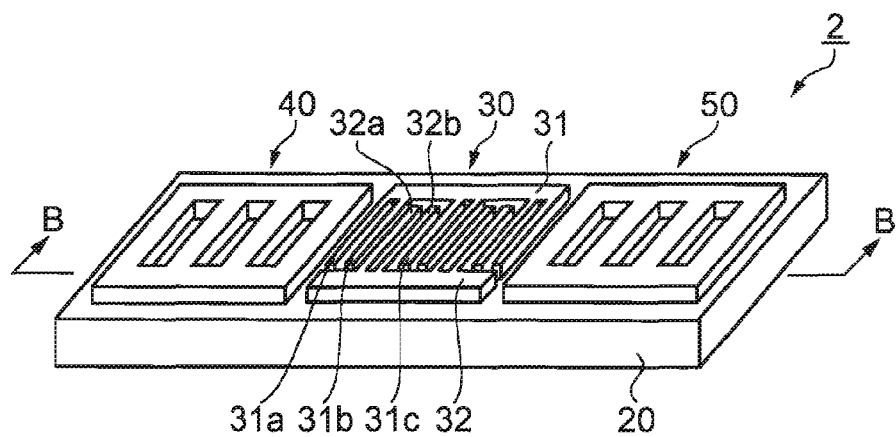
FIG. 6 is a perspective view illustrating a lamb wave type high frequency resonator according to a second embodiment of the invention.
Figure 7:
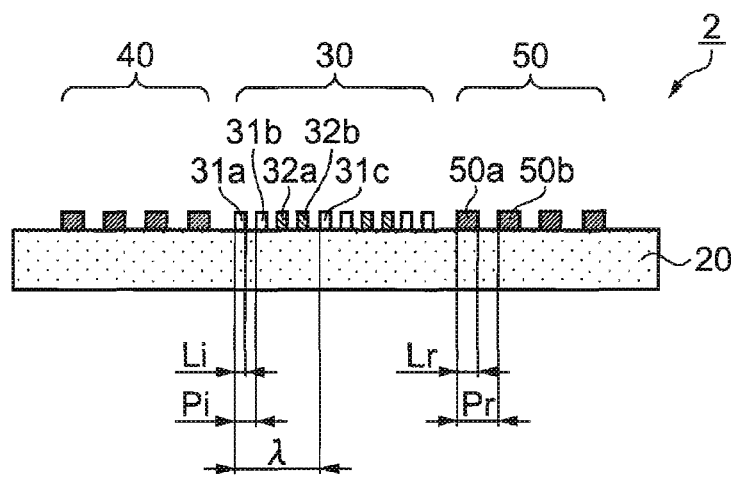
FIG. 7 is a cross-sectional view of the lamb wave type high frequency resonator according to the second embodiment of the invention taking along the line B-B in FIG. 6.

FIGS. 6 and 7 show the structure of the lamb wave type high frequency resonator of the second embodiment. FIG. 6 is a perspective view. FIG. 7 is a cross-sectional view taken along the line B-B in FIG. 6. In FIGS. 6 and 7, a lamb wave type high frequency resonator 2 is composed of the IDT electrode 30, the reflectors 40 and 50 disposed at both sides of the IDT electrode 30, and the piezoelectric substrate 20 made of quartz crystal. The IDT electrode 30 and the reflectors 40 and 50 are fabricated on the surface of the piezoelectric substrate 20. This basic arrangement is the same as that in the first embodiment.

Here, from the edge of the first interdigital finger electrode 31, two electrode fingers 31a and 31b are fabricated in parallel with each other in the right direction in the figure. Between the electrode finger 31b and the electrode finger 31c, the electrode fingers 32a and 32b of the second interdigital finger electrode 32 are interdigitated in parallel with each other. The distance from the edge of the electrode finger 31a to the electrode finger 31c is set as the wavelength λ of the lamb wave. Each width of the electrode fingers 31a, 31b, 31c, 32a, and 32b is represented as Li.

In addition, the distance (may be called as a pitch) from the edge of the electrode finger 31a to the electrode 31b is represented as Pi.

Note that other electrodes included in the first interdigital finger electrode 31 and the second interdigital finger electrode 32 are fabricated so as to satisfy the same relations.

Accordingly, in the IDT electrode 30, four electrode fingers 31a, 31b, 32a, and 32b are interdigitated in the range of the wavelength λ of the lamb wave. The pitch Pi between electrodes is ¼ of the wavelength λ.

The distance (may be called as a pitch) from the edge of the electrode finger 50a to the electrode finger 50b in the reflector 50 is represented as Pr. Each width of the electrode fingers 50a and 50b is represented as Lr.

The widths and pitches between electrodes of other electrode fingers included in the reflector 50 and electrodes included in the reflector 40 are set in the same relation while their descriptions are omitted.

Here, relations are set as follows: the electrode finger width Li of the IDT electrode 30 and the electrode finger width Lr of the reflector 50 satisfy the relation of Li=Lr; and the pitch Pi of the IDT electrode 30 and the pitch Pr of the reflector 50 satisfy the relation of Pi≠Pr.

Figure 8:
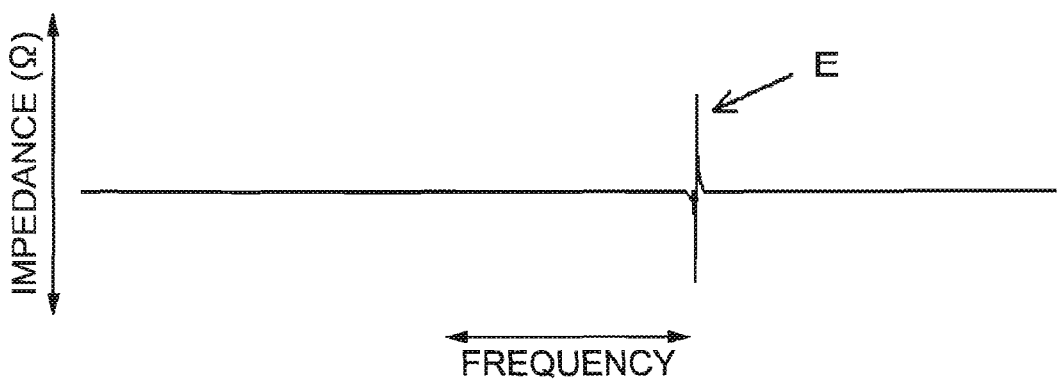
FIG. 8 is a graph illustrating an impedance frequency characteristic of the lamb wave type high frequency resonator according to the second embodiment of the invention.

Next, the impedance frequency characteristic of the lamb wave type high frequency resonator 2 structured as above will be described. In FIG. 8, the characteristic is exemplified, provided that the pitches of the reflector 50 and the IDT electrode 30 satisfy the relation of Pr/Pi=1.0046.

As is apparent from FIG. 8, only mode E is extensively excited; modes A, B, C, D, and F, other than mode E, are suppressed. Accordingly, design, in which the pitch Pr of electrode fingers included in the reflectors 40 and 50 is different from the pitch Pi of electrode fingers included in the IDT electrode 30, allows the excitation of mode to be selectively used to be intensified, and simultaneously the spurious to be suppressed. In addition, it is known that a structure, in which four electrode fingers of the IDT electrode 30 are in the range of the wavelength of a lamb wave, balances out a reflection wave in the IDT electrode 30. Consequently, the mode having the maximum G frequency out of the reflection frequency band is further suppressed, resulting in the occurrence of spurious being almost eliminated. As a result, in a case where oscillators are structured by using the lamb wave type high frequency resonator 2, oscillators having high reliability without abnormal oscillations and frequency jumps can be achieved.

Third Embodiment

Next, a lamb wave type high frequency resonator according to a third embodiment of the invention will be described with reference to accompanying drawings. The third embodiment is featured in that insulation film is formed so as to cover the upper surface of the IDT electrode 30 described in the first and second embodiments. The IDT electrode 30 and the reflectors 40 and 50 can be structured as the same as those in the first and second embodiments. Here, the structure based on the first embodiment (refer to FIGS. 1 and 2) is exemplified. Common parts are given the same numerals and only different parts will be described.

Figure 9:
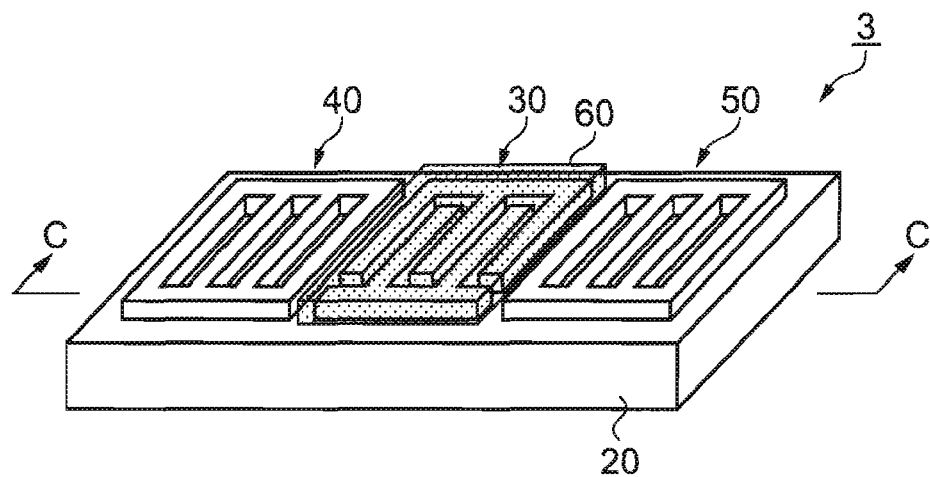
FIG. 9 is a perspective view illustrating a lamb wave type high frequency resonator according to a third embodiment of the invention.
Figure 10:
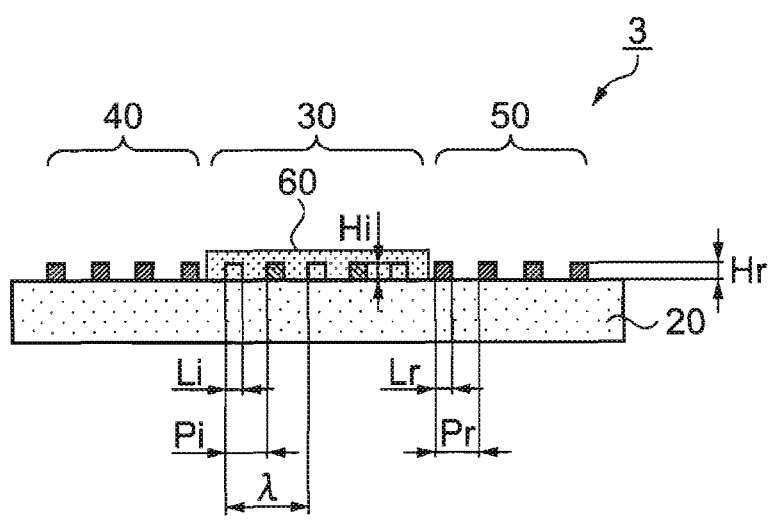
FIG. 10 is a cross-sectional view of the lamb wave type high frequency resonator according to the third embodiment of the invention taking along the line C-C in FIG. 9.

FIGS. 9 and 10 show a lamb wave type high frequency resonator 3 of the third embodiment. FIG. 9 is a perspective view. FIG. 10 is a cross-sectional view taken along the line C-C in FIG. 9. In FIGS. 9 and 10, an insulation film 60 is deposited on the surface of the IDT electrode 30 so as to cover the whole IDT electrode 30. The insulation film 60 is made of $SiO_2$.

Note that the pitch Pi of the IDT electrode 30 and the pitch Pr of the reflector 50 are set to satisfy the relation of Pi≠Pr. Each thickness of the electrode fingers 31a and 32a is represented as Hi.

The thickness of the insulation film 60 will be minutely described with reference to FIG. 11.

Figure 11:
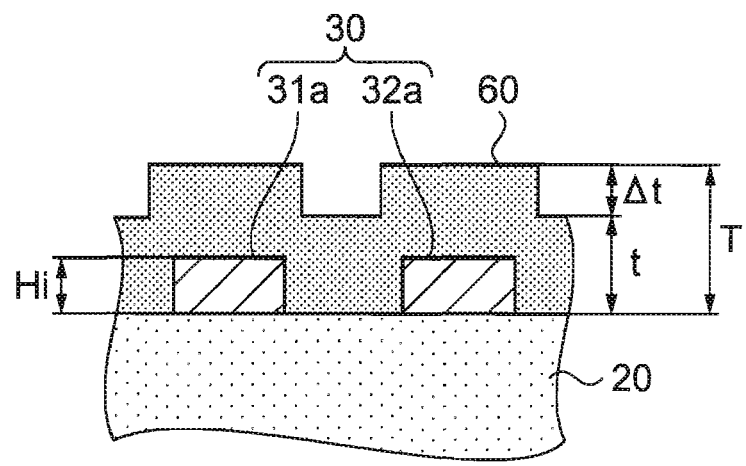
FIG. 11 is a partial cross-sectional view schematically illustrating an insulation film of the lamb wave type high frequency resonator according to the third, sixth, ninth, and twelfth embodiment of the invention.

FIG. 11 is a partial cross-sectional view schematically illustrating a deposited condition of the insulation film 60. In FIG. 11, the upper surfaces of the electrode fingers 31a and 32a are higher than the part excluding the electrode fingers 31a and 32a since the insulation film 60 is deposited so as to cover the upper surface of the IDT electrode 30. Here, T is the height of the upper surface of the insulation film above the electrode fingers 31a and 32a from the surface of the piezoelectric substrate 20, t is the height of the insulation film 60 above the parts excluding the electrode fingers 31a and 32a, and the difference of the height T and the height t, i.e. the difference of a concavity and a convexity of the surface of the insulation film 60 is represented as Δt=T-t. The value of Δt/λ, i.e. Δt is divided by the wavelength λ of the lamb wave, is set in the range of Δt/λ≦0.044.

Figure 12:
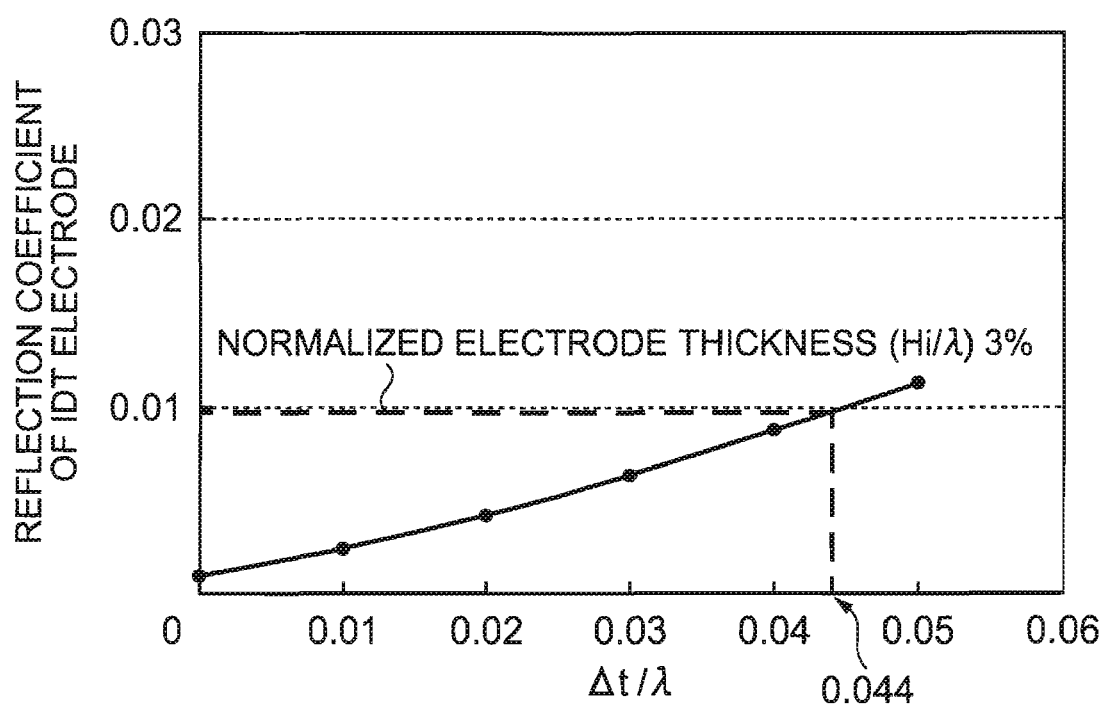
FIG. 12 is a graph illustrating a relation between Δt/λ and a reflection coefficient of an IDT electrode of the lamb wave type high frequency resonator according to the third, sixth, ninth, and twelfth embodiment of the invention.
Figure 13:
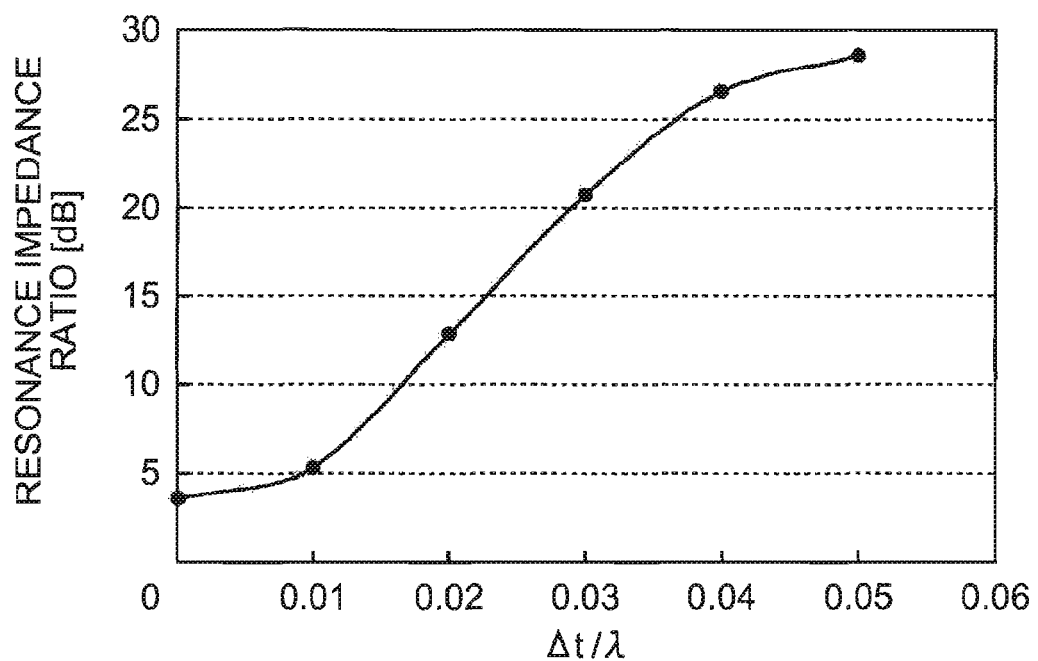
FIG. 13 is a graph illustrating a relation between Δt/λ and a resonance impedance ratio of the lamb wave type high frequency resonator according to the third, sixth, ninth, and twelfth embodiment of the invention.

FIG. 12 shows the relation of Δt and the reflection coefficient of the IDT electrode. In the figure, the reflection coefficient of the IDT electrode 30, provided that a normalized electrode thickness (Hi/λ) is 3% suitable for fabricating the IDT electrode 30, is shown as an indication to determine the optimum range of Δt. FIG. 13 shows the relation of Δt and a resonance impedance ratio (ratio of resonance frequency to antiresonance frequency)(dB) of the lamb wave type high frequency resonator 3 composed of only the IDT electrode 30. In FIG. 12, the smaller Δt (the surface of the insulation film 60 becomes flat), the smaller the reflection coefficient of the IDT electrode 30. As a result, as is apparent from FIG. 13, the resonance impedance ratio becomes smaller. In addition, since the reflection coefficient of the IDT electrode 30 is smaller than the coefficient in a case where the normalized electrode thickness is 3%, if Δt/λ≦0.044, the spurious caused by the reflection in the IDT electrode 30 can be effectively suppressed.

Figure 14:
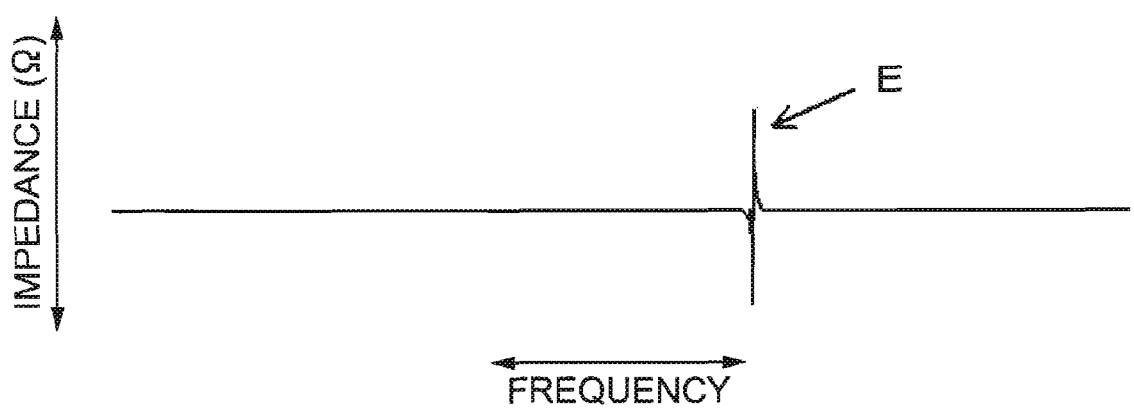
FIG. 14 is a graph illustrating an impedance frequency characteristic of the lamb wave type high frequency resonator according to the third embodiment of the invention.

FIG. 14 is a graph illustrating the impedance frequency characteristic of the lamb wave type high frequency resonator 3, provided that Δt/λ=0.005. As is apparent from FIG. 14, only mode E of the lamb wave is extensively excited; modes A, B, C, D, and F, other than mode E, are suppressed. Accordingly, the design, in which the pitch Pr of electrode finger included in the reflectors 40 and 50 is different from the pitch Pi of electrode finger included in the IDT electrode 30, allows the excitation of mode to be selectively used to be intensified, and simultaneously the spurious to be suppressed. In addition, by fabricating the insulation film 60 on the IDT electrode 30 so as to satisfy the relation of Δt/λ≦0.044, the reflection coefficient of the IDT electrode becomes very small, so that the reflection is almost eliminated. Accordingly, the mode, which has the maximum G frequency out of the reflection frequency band, of the lamb wave is further suppressed, resulting in the spurious response being almost eliminated. As a result, in a case where oscillators are structured by using the lamb wave type high frequency resonator 3, oscillators having extremely high reliability without abnormal oscillations and frequency jumps can be achieved.

While the third embodiment is described based on that the insulation film 60 is deposited on the structure in which two electrode fingers of the IDT electrode 30 are in the range of the wavelength λ of the lamb wave, it is obvious that the spurious can be effectively suppressed in the structure in which four electrode fingers are in the range of the wavelength λ.

In a case where the widths of the electrode fingers in the IDT electrode and reflector are different from one another.

Fourth Embodiment

Figure 15:
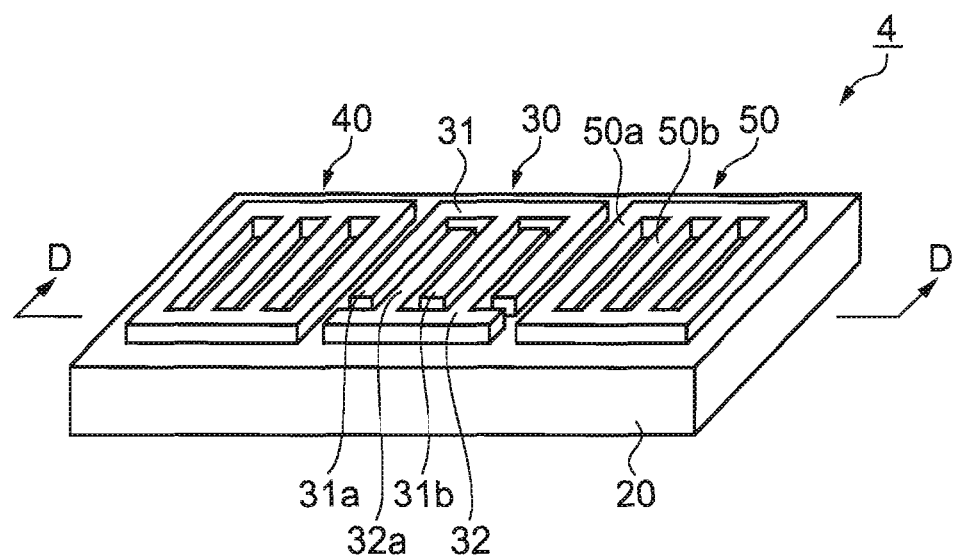
FIG. 15 is a perspective view illustrating a lamb wave type high frequency resonator according to a fourth embodiment of the invention.
Figure 16:
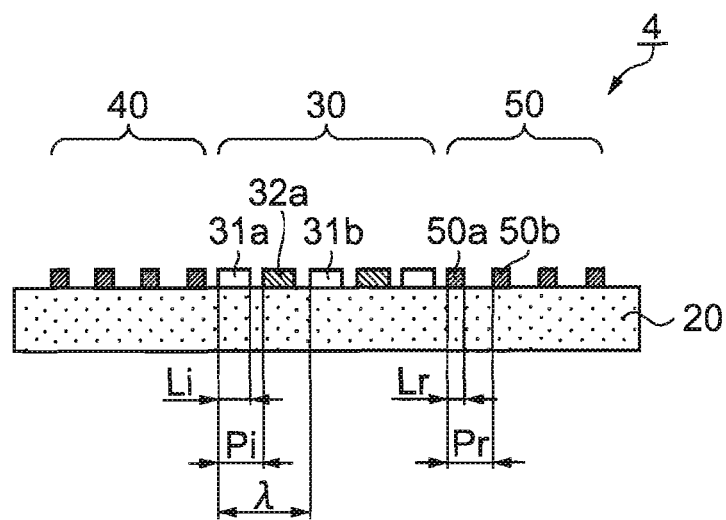
FIG. 16 is a cross-sectional view of the lamb wave type high frequency resonator according to the fourth embodiment of the invention taking along the line D-D in FIG. 15.

FIG. 15 is a perspective view illustrating a lamb wave type high frequency resonator 4 according to a fourth embodiment. FIG. 16 is a cross-sectional view taken along the line D-D in FIG. 15. In FIGS. 15 and 16, the lamb wave type high frequency resonator 4 is composed of the IDT electrode 30 including a pair of interdigital finger electrodes 31 and 32, a pair of reflectors 40 and 50, which is disposed at both sides of the propagation direction of the lamb wave excited by the IDT electrode 30, and the piezoelectric substrate 20 made of quartz crystal. The reflector 50 includes the electrode fingers 50a and 50b. The IDT electrode 30, and the reflectors 40 and 50 are fabricated on the surface of the piezoelectric substrate 20. Hereinafter, the interdigital finger electrode 31 at one side is called as the first interdigital finger electrode 31, while the interdigital finger electrode 32 at the other side is called as the second interdigital finger electrode 32.

In the IDT electrode 30, the first interdigital finger electrode 31 and the second interdigital finger electrode 32 are interdigitated. Here, the distance from the edge of the electrode finger 31a to the electrode finger 31b, both of which are shaped in a comb-teeth like and included in the first interdigital finger electrode 31, is set as the wavelength λ of the lamb wave. Each width of the electrode fingers 31a and 31b is represented as Li.

The distance (may be called as a pitch) from the edge of the electrode finger 31a to the electrode finger 32a, which is interdigitated between the electrode fingers 31a and 31b of the second interdigital finger electrode 32, is represented as Pi. The width of the electrode 32a is also represented as Li.

The distance (may be called as a pitch) from the edge of the electrode finger 50a to the electrode finger 50b in the reflector 50 is represented as Pr. Each width of the electrode fingers 50a and 50b is represented as Lr.

Note that the widths and pitches of other electrode fingers, which are not described above, included in the IDT electrode 30, other electrode fingers included in the reflector 50, and the electrode fingers included in the reflector 40, are set in the same relation while their descriptions are omitted.

Here, relations are set as follows: the electrode finger width Li of the IDT electrode 30 and the electrode finger width Lr of the reflector 50 satisfy the relation of Li≠Lr; and the pitch Pi between electrodes of the IDT electrode 30 and the pitch Pr between electrodes of the reflector 50 satisfy the relation of Pi=Pr.

A lamb wave is excited by inputting an input drive signal having a given frequency to the IDT electrode 30 structured as described above, propagating in the longitudinal direction of the piezoelectric substrate 20 with repeating reflections on the front and back surfaces of the piezoelectric substrate 20 to be reflected by the reflectors 40 and 50.

Next, impedance frequency characteristics, and conductance frequency characteristics of the lamb wave type high frequency resonator 4 structured as above will be described.

Here, the reflector 50 is exemplified for description since the reflectors 40 and 50 function the same way.

Figure 17:
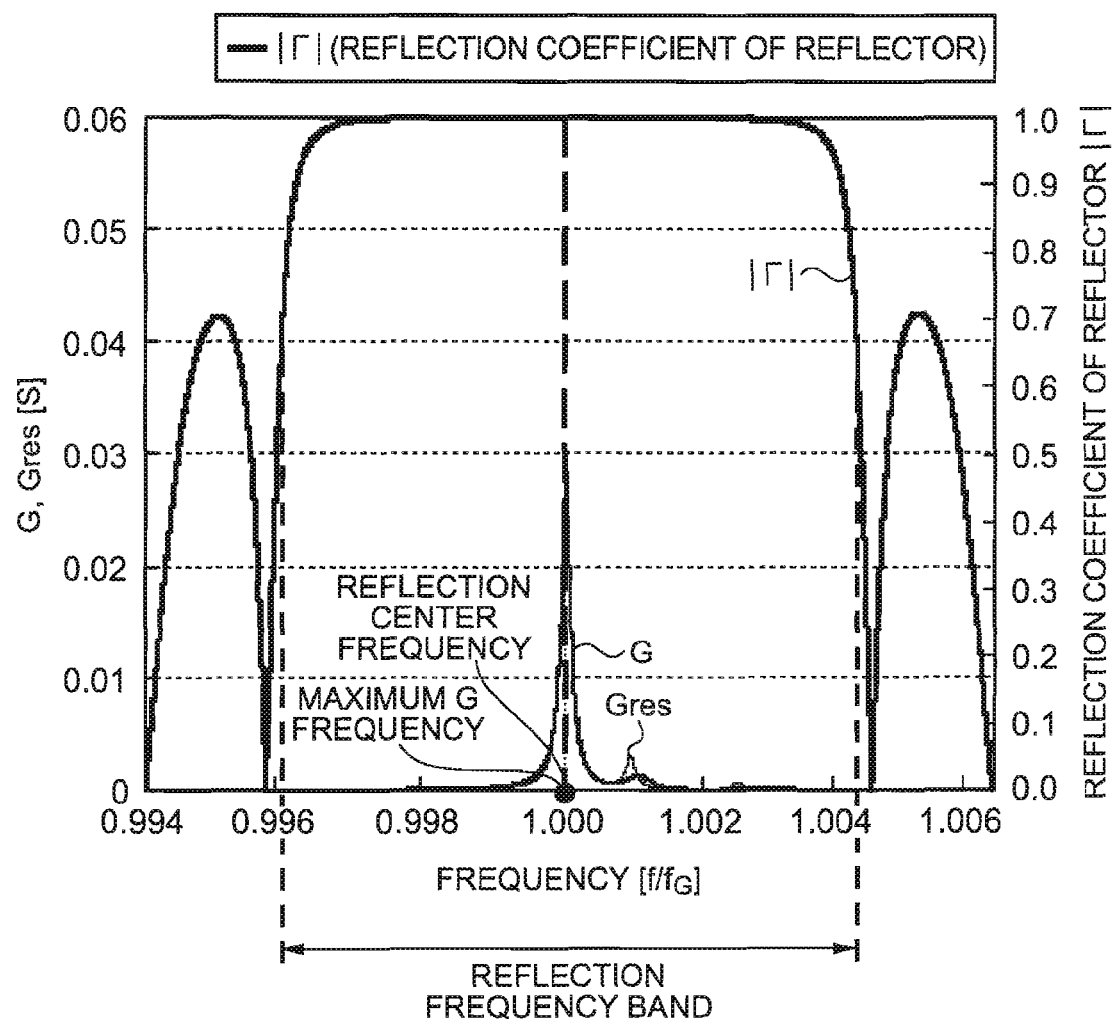
FIG. 17 is a graph illustrating frequency characteristics of a radiation conductance and a reflection coefficient of the reflector, in mode C of the lamb wave type high frequency resonator according to the fourth embodiment of the invention.

FIG. 17 is a graph illustrating the frequency characteristics of the radiation conductance and the reflection coefficient of the reflector 50 of the lamb wave type high frequency resonator 4 of the embodiment.

FIG. 17 is exemplified, provided that the width Li of the electrode fingers 31a, 31b, and 32a of the IDT electrode 30, and the width Lr of the electrode fingers 50a, and 50b of the reflector 50 satisfy the relation of Lr/Li=0.4.

Figure 19:
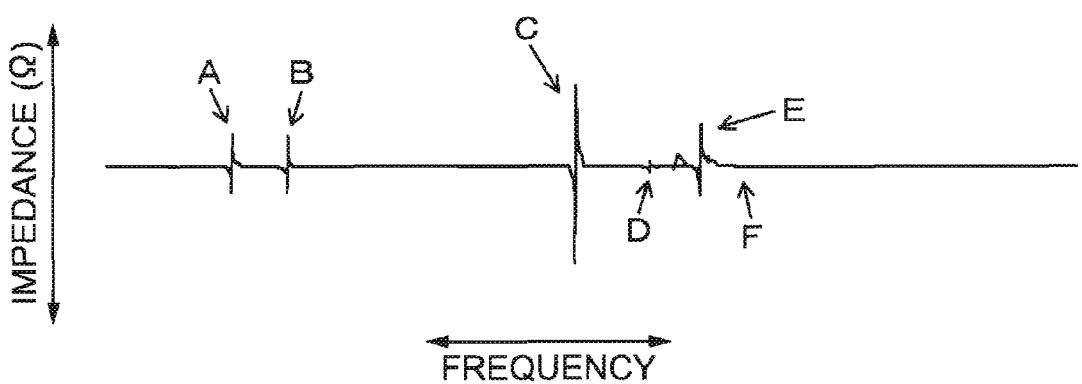
FIG. 19 is a graph illustrating an impedance frequency characteristic of the lamb wave type high frequency resonator according to the fourth embodiment of the invention.
Figure 58:
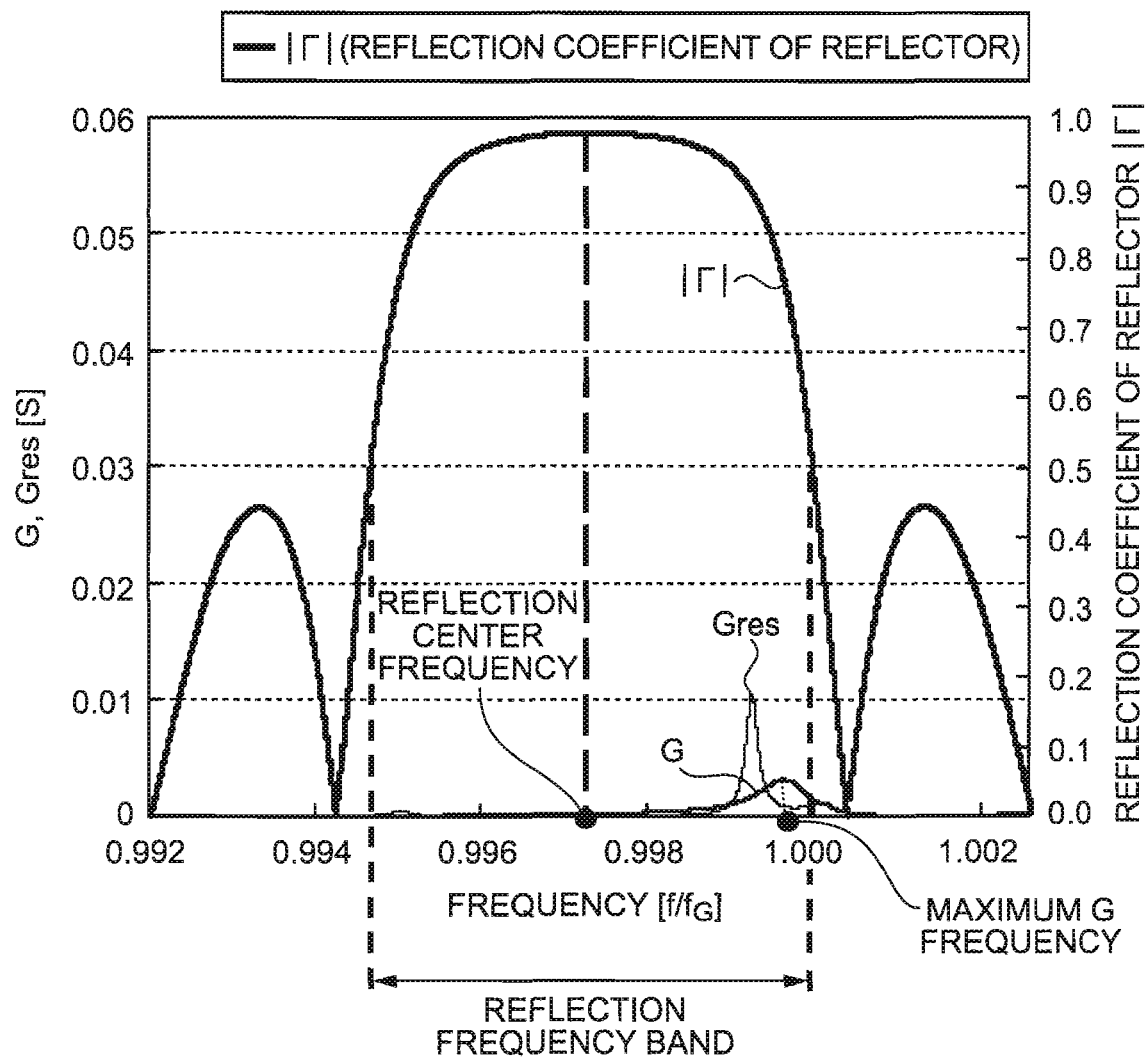
FIG. 58 is a graph illustrating a relation of a frequency characteristic of a radiation conductance and a frequency characteristic of a reflection coefficient in mode C of the lamb wave type high frequency resonator according to related art.

As shown in FIG. 17, the reflection center frequency nearly coincides with the maximum G frequency in a case where the mode C shown in FIG. 19 is the desired oscillation mode (hereinafter, only referred to as mode). In addition, the radiation conductance G of the IDT electrode 30 is larger than that of the known technique aforementioned (refer to FIG. 58). This indicates that the excitation is intensified. Namely, it indicates that the mode to be used can be intensively excited.

Figure 18:
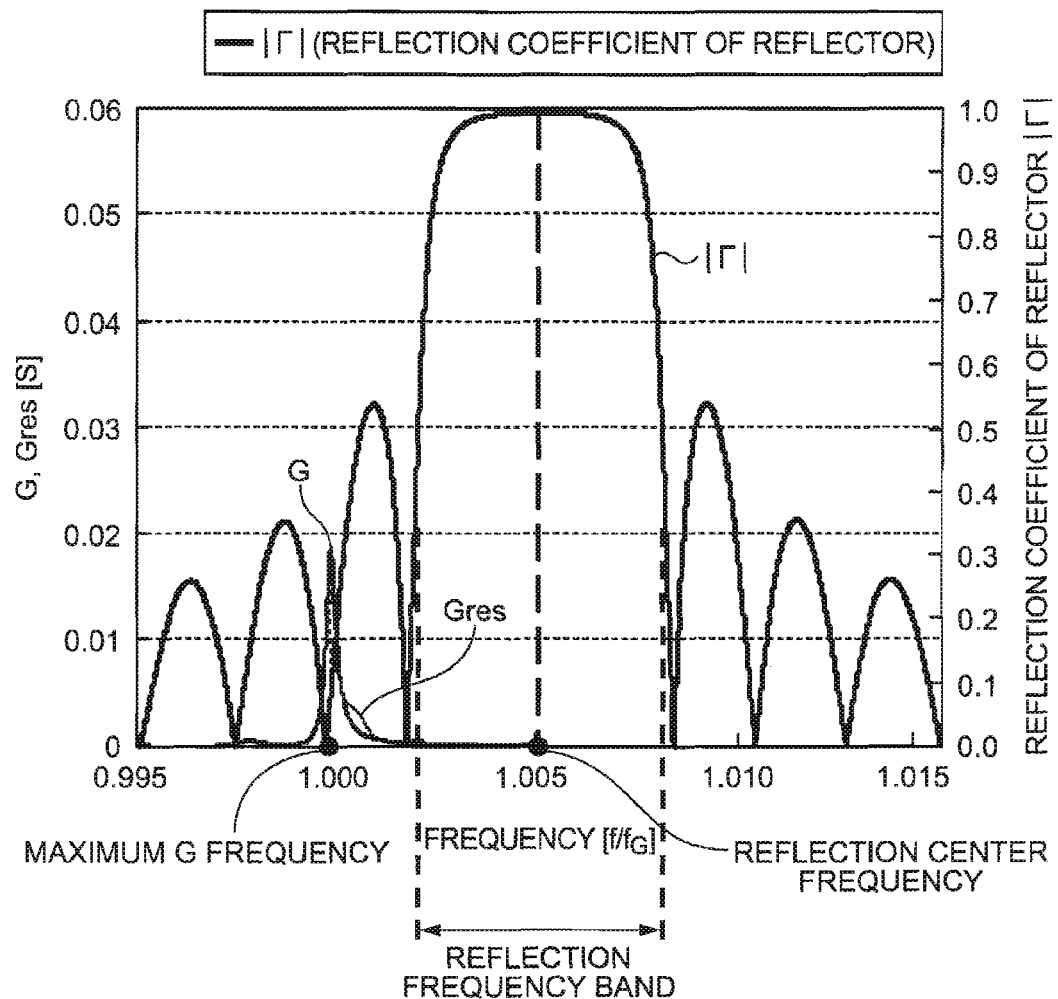
FIG. 18 is a graph illustrating frequency characteristics of a radiation conductance and a reflection coefficient of the reflector, in mode E of the lamb wave type high frequency resonator according to the fourth embodiment of the invention.

FIG. 18 is a graph illustrating the frequency characteristics of the radiation conductance and the reflection coefficient of the reflector 50, of the mode E shown in FIG. 19, provided that the IDT electrode 30 and the reflector 50 are structured as the same as those described above. As shown in FIG. 18, the excitation can be suppressed since the maximum G frequency is out of the reflection frequency band. Namely, the spurious can be suppressed.

While the embodiment is described based on the relation of Lr/Li=0.4 as an example, the ratio of the width Li of the electrode fingers 31a, 31b, and 32a of the IDT electrode 30, to the width Lr of the electrode fingers 50a and 50b of the reflector 50 is not limited to 0.4, but is applicable as long as Lr≠Li. Namely, the difference (ratio) is not limited. Further, Lr>Li may be acceptable.

By setting the widths of the electrode finger of the IDT electrode 30 and the reflector 50, both of which are fabricated on the surface of the piezoelectric substrate 20, as Lr≠Li, mass adding effect is changed that is the major factor to determine the maximum G frequency and the reflection frequency band. As a result, the maximum G frequency of the mode to be used is set to be within the reflection frequency band, while the spurious is set to arise out of the reflection frequency band.

FIG. 19 is a graph illustrating the impedance frequency characteristic of the lamb wave type high frequency resonator 4 of the embodiment. In FIG. 19, only the mode C is intensively excited, while modes other than the mode C are suppressed. Therefore, abnormal oscillations and frequency jumps can be suppressed.

According to the fourth embodiment, the reflection center frequency nearly coincides with the maximum G frequency, and the radiation conductance G of the IDT electrode 30 is larger as compared with the lamb wave element by the known technique aforementioned. As a result, the excitation of mode to be used can be intensified. This is because that the width Li of the electrode fingers 31a, 31b, and 32a of the IDT electrode 30 and the width Lr of the electrode fingers 50a and 50b of the reflector 50 (and fingers of the reflector 40) are set so as to be different from one another. In addition, the excitation of modes excluding the desired one can be suppressed since their maximum G frequencies are out of the reflection frequency band of the reflector. Consequently, the spurious can be suppressed so as to achieve a resonator having high reliability.

In addition, in a case where two electrode fingers 31a and 32a are interdigitated in the range of the wavelength λ of the lamb wave, the reflection of the lamb wave arises in the IDT electrode 30. This reflection of the lamb wave can intensify the excitation of a desired oscillation mode. Thus, the excitation of the mode can be further intensified together with the effect obtained by the above-described setting in which the width Li of the electrode fingers 31a, 31b, and 32a and the width Lr of the electrode fingers 50a and 50b of the reflector 50 are different from one another. Moreover, this makes it possible to reduce the number of electrode fingers of the reflectors 40 and 50, resulting in the effect to downsize the lamb wave type high frequency resonator 4.

Fifth Embodiment

Next, a lamb wave type high frequency resonator according to a fifth embodiment of the invention will be described with reference to accompanying drawings. As compared with the fourth embodiment (refer to FIGS. 15 and 16), the fifth embodiment differs in the structure of the electrode finger of the IDT electrode, and is featured in that four electrode fingers of the IDT electrode are interdigitated in the range of the wavelength λ of the lamb wave.

Figure 20:
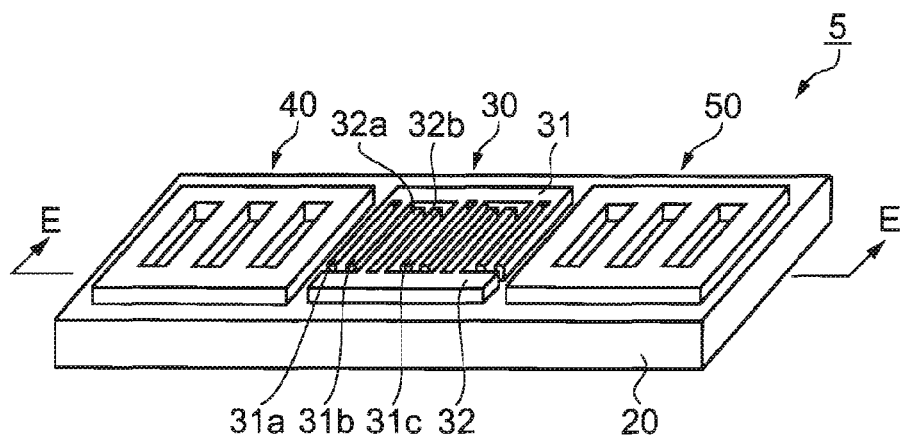
FIG. 20 is a perspective view illustrating a lamb wave type high frequency resonator according to a fifth embodiment of the invention.
Figure 21:
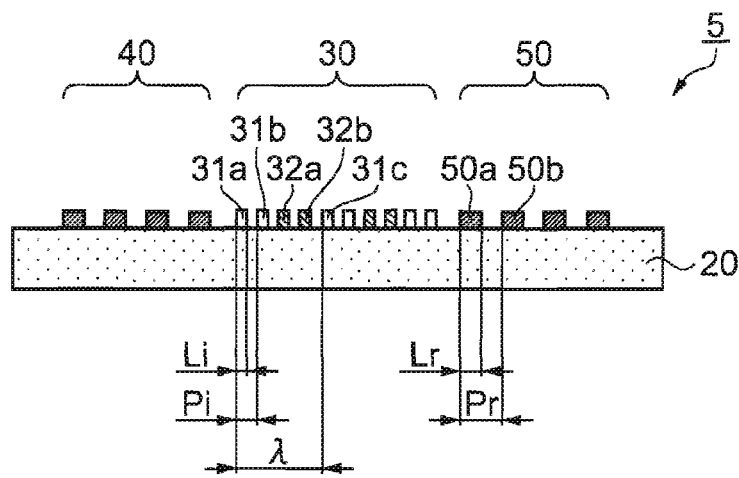
FIG. 21 is a cross-sectional view of the lamb wave type high frequency resonator according to the fifth embodiment of the invention taking along the line E-E in FIG. 20.

FIGS. 20 and 21 show the structure of the lamb wave type high frequency resonator of the fifth embodiment. FIG. 20 is a perspective view. FIG. 21 is a cross-sectional view taken along the line E-E in FIG. 20. In FIGS. 20 and 21, a lamb wave type high frequency resonator 5 is composed of the IDT electrode 30, reflectors 40 and 50 disposed at both sides of the IDT electrode 30, and the piezoelectric substrate 20 made of quartz crystal. The IDT electrode 30 and the reflectors 40 and 50 are fabricated on the surface of the piezoelectric substrate 20. This basic arrangement is the same as that in the fourth embodiment.

Here, from the edge of the first interdigital finger electrode 31, two electrode fingers 31a and 31b are fabricated in parallel with each other in the right direction in the figure. Between the electrode finger 31b and the electrode finger 31c, the electrode fingers 32a and 32b of the second interdigital finger electrode 32 are interdigitated in parallel with each other. The distance from the edge of the electrode finger 31a to the electrode finger 31c is set as the wavelength λ of the lamb wave. Each width of the electrode fingers 31a, 31b, 31c, 32a, and 32b is represented as Li.

In addition, the distance (may be called as a pitch) from the edge of the electrode finger 31a to the electrode 31b is represented as Pi.

Note that other electrodes included in the first interdigital finger electrode 31 and the second interdigital finger electrode 32 are fabricated so as to satisfy the same relations.

Accordingly, in the IDT electrode 30, four electrode fingers 31a, 31b, 32a, and 32b are interdigitated in the range of the wavelength λ of the lamb wave. The pitch Pi between electrodes is ¼ of the wavelength λ.

The distance (may be called as a pitch) from the edge of the electrode finger 50a to the electrode finger 50b in the reflector 50 is represented as Pr. Each width of the electrode fingers 50a and 50b is represented as Lr.

The widths and pitches of other electrode fingers included in the reflector 50, and electrode fingers included in the reflector 40, are set in the same relation while their descriptions are omitted.

Note that the width Li of electrode finger of the IDT electrode 30 and the width Lr of electrode finger of the reflector 50 are set to satisfy the relation of Li≠Lr.

Figure 22:
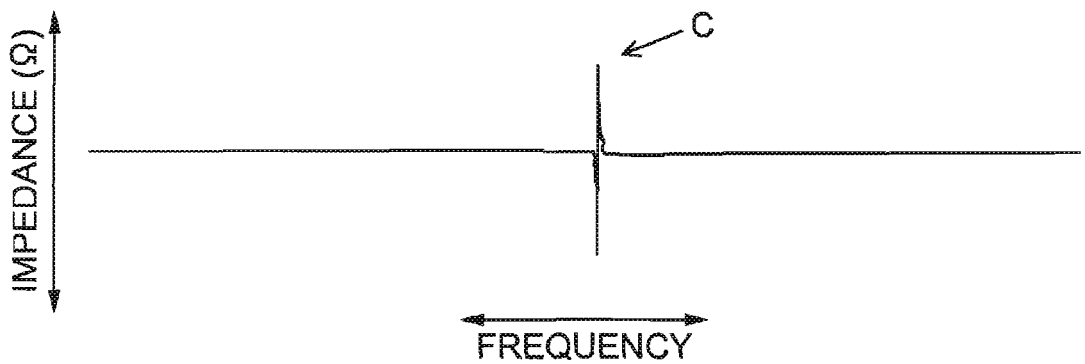
FIG. 22 is a graph illustrating an impedance frequency characteristic of the lamb wave type high frequency resonator according to the fifth embodiment of the invention.

Next, impedance frequency characteristics of the lamb wave type high frequency resonator 5 structured as above will be described. In FIG. 22, characteristics are exemplified, provided that Lr/Li=4.

FIG. 22 shows the impedance frequency characteristic of the lamb wave type high frequency resonator 5 of the embodiment. As shown in FIG. 22, only mode C is intensively excited, while the modes A, B, D, E, and F, which arise in the fourth embodiment (refer to FIG. 19), are suppressed.

Accordingly, in the fifth embodiment, the reflection wave in the IDT electrode 30 is balanced out by four electrode fingers, which are 31a and 31b included in the first interdigital finger electrode 31, and 32a and 32b included in the second interdigital finger electrode 32, interdigitated in the range of the wavelength λ of the lamb wave. As a result, the mode having the maximum G frequency out of the reflection frequency band is further suppressed, resulting in the spurious being almost eliminated. As a result, in a case where oscillators are structured by using the lamb wave type high frequency resonator 5, oscillators having high reliability without abnormal oscillations and frequency jumps can be achieved.

While the embodiment is described based on the relation of Lr/Li=4 as an example, the ratio of the electrode finger width Li of the IDT electrode 30, to the electrode finger width Lr of the reflector 50 is not limited to 4, but is applicable as long as Lr≠Li. Namely, the difference (ratio) is not limited.

Sixth Embodiment

Next, a lamb wave type high frequency resonator according to a sixth embodiment of the invention will be described with reference to accompanying drawings. The sixth embodiment is featured in that insulation film is formed so as to cover the upper surface of the IDT electrode 30 described in the fourth and fifth embodiments. The IDT electrode 30 and the reflectors 40 and 50 can be structured as the same as those in the fourth and fifth embodiments. Here, the structure based on the fourth embodiment (refer to FIGS. 15 and 16) is exemplined. Common parts are given the same numerals and only different parts will be described.

Figure 23:
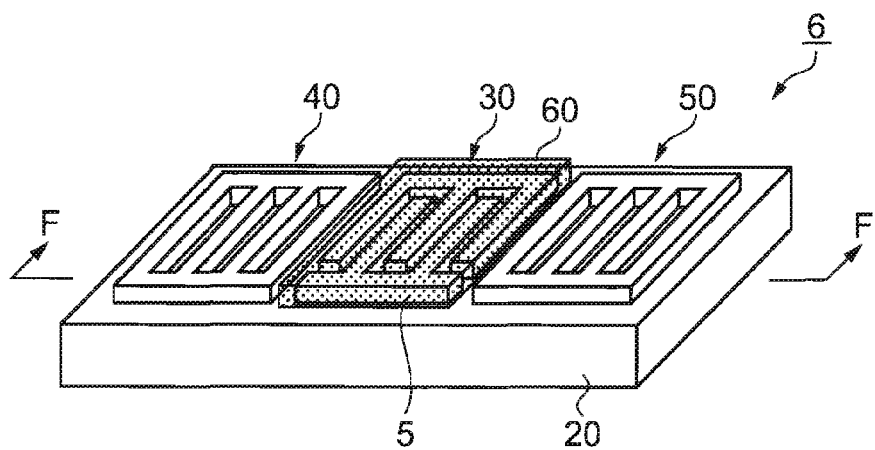
FIG. 23 is a perspective view illustrating a lamb wave type high frequency resonator according to a sixth embodiment of the invention.
Figure 24:
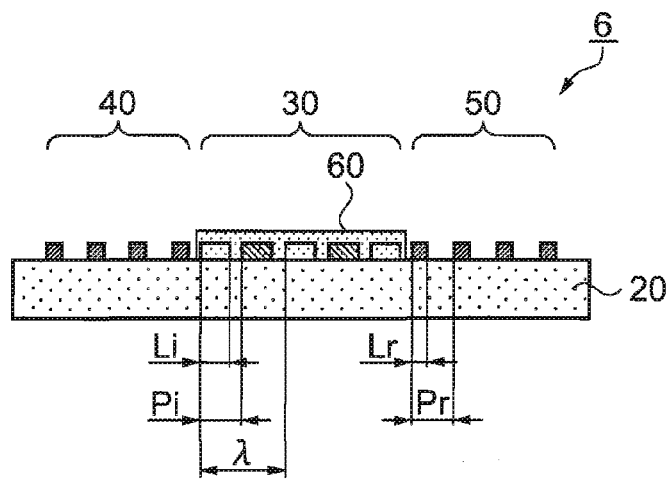
FIG. 24 is a cross-sectional view of the lamb wave type high frequency resonator according to the sixth embodiment of the invention taking along the line F-F in FIG. 23.

FIGS. 23 and 24 show a lamb wave type high frequency resonator 6 of the sixth embodiment. FIG. 23 is a perspective view. FIG. 24 is a cross-sectional view taken along the line F-F in FIG. 23. In FIGS. 23 and 24, the insulation film 60 is deposited on the surface of the IDT electrode 30 so as to cover the whole IDT electrode 30. The insulation film 60 is made of $SiO_2$. Note that the electrode finger width Li of the IDT electrode 30 and the electrode finger width Lr of the reflector 50 are set to satisfy the relation of Li≠Lr. Each thickness of the electrode fingers 31a and 32a is represented as Hi.

The detailed description on the film thickness of the insulation film 60 will be omitted since it was described in FIG. 11. In the embodiment, the value of Δt/λ, i.e. Δt is divided by the wavelength λ of the lamb wave, is set in the range of Δt/λ≦0.044. Here, Δt(=T-t) represents the difference of a concavity and a convexity of the surface of the insulation film 60 in FIG. 11.

The reflection coefficient of the IDT electrode can be reduced by depositing the insulation film 60 on the surface of the IDT electrode 30. Further, the reflection coefficient of the IDT electrode can be reduced by setting a concavity and a convexity of the surface to be in the range of Δt/λ≦0.044.

This is because that the more Δt/λ becomes smaller (a concavity and a convexity of the surface of the insulation film 60 are small, i.e. the surface of the insulation film 60 is flat and smooth), the reflection coefficient of the IDT electrode becomes smaller, resulting in the resonance impedance ratio being small, as described in the third embodiment with reference to FIGS. 12 and 13.

In addition, the reflection coefficient of the IDT electrode 30 is smaller than the coefficient in a case where the normalized electrode thickness is 3%, if Δt/λ≦0.044.

Figure 25:
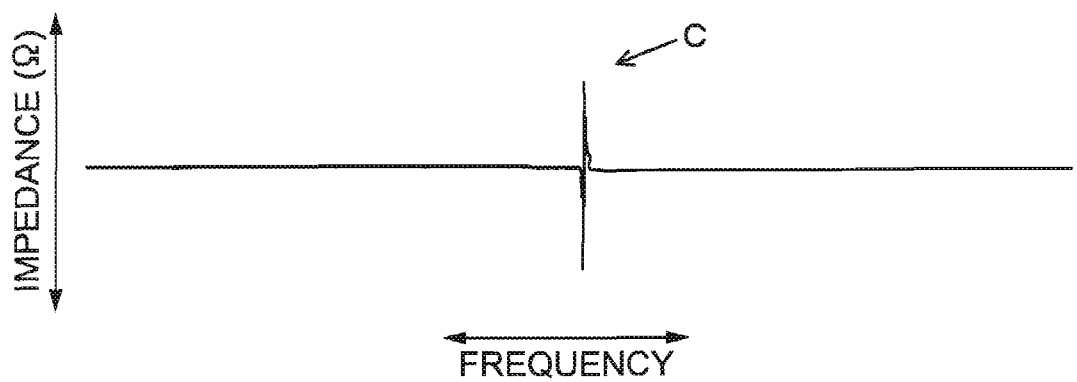
FIG. 25 is a graph illustrating an impedance frequency characteristic of the lamb wave type high frequency resonator according to the sixth embodiment of the invention.

FIG. 25 shows the impedance frequency characteristic of the lamb wave type high frequency resonator 6 of the sixth embodiment. Note that FIG. 25 shows graph, provided that Δt/λ=0.005. As shown in FIG. 25, only mode C is extensively excited; modes A, B, D, E, and F, excluding mode C, are suppressed and eliminated.

While not shown here, if the insulation film covering the whole IDT electrode 30 is employed to the fifth embodiment in which the IDT electrode 30 and the reflectors 40 and 50 are structured, modes other than the mode to be used can be suppressed from the same reason described above.

According to the sixth embodiment, depositing the insulation film 60 covering the upper surface of the IDT electrode 30 allows the reflection coefficient of the IDT electrode 30 to be small. Further, setting a concavity and a convexity of the surface of the insulation film 60 in the range of Δt/λ≦0.044 allows the reflection coefficient of the IDT electrode 30 to be extremely small, eliminating almost all of reflection. As a result, almost all of spurious can be eliminated. In addition, in a case where oscillators are structured by using the lamb wave type high frequency resonator 6, oscillators having high reliability without abnormal oscillations or frequency jumps can be achieved together with intensifying the excitation of the mode to be used by setting the relation of Li≠Lr, where Li is the electrode finger width of the IDT electrode 30 and Lr is the electrode finger width of the reflector 50.

In a case where the thicknesses of the electrode fingers in the IDT electrode and reflector are different from one another.

Seventh Embodiment

Figure 26:
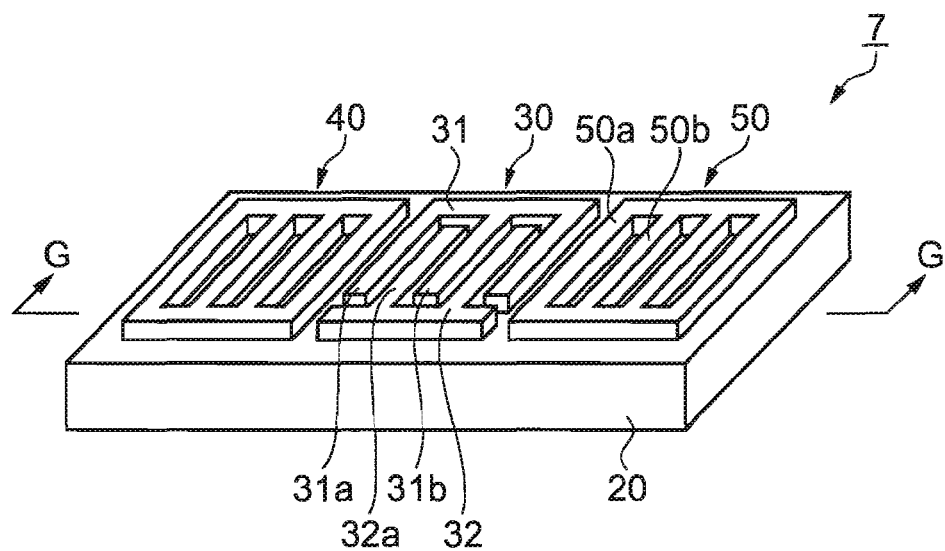
FIG. 26 is a perspective view illustrating a lamb wave type high frequency resonator according to a seventh embodiment of the invention.
Figure 27:
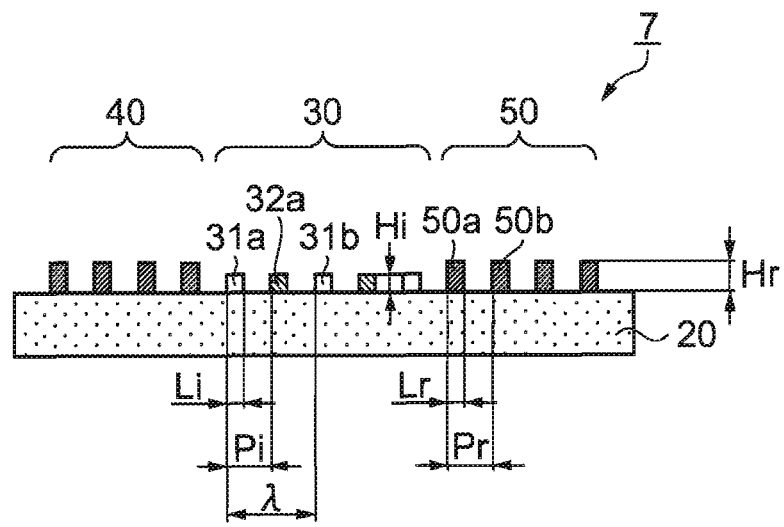
FIG. 27 is a cross-sectional view of the lamb wave type high frequency resonator according to the seventh embodiment of the invention taking along the line G-G in FIG. 26.

FIG. 26 is a perspective view illustrating a lamb wave type high frequency resonator 7 according to a seventh embodiment. FIG. 27 is a cross-sectional view taken along the line G-G in FIG. 26. In FIGS. 26 and 27, the lamb wave type high frequency resonator 7 is composed of the IDT electrode 30 including a pair of interdigital finger electrodes 31 and 32, the reflectors 40 and 50, which is disposed at both sides of the propagation direction of the lamb wave excited by the IDT electrode 30, and the piezoelectric substrate 20 made of quartz crystal. The reflector 50 includes electrode fingers 50a and 50b. The IDT electrode 30, and the reflectors 40 and 50 are fabricated on the surface of the piezoelectric substrate 20. Hereinafter, the interdigital finger electrode 31 at one side is called as the first interdigital finger electrode 31, while the interdigital finger electrode 32 at the other side is called as the second interdigital finger electrode 32.

In the IDT electrode 30, the first interdigital finger electrode 31 and the second interdigital finger electrode 32 are interdigitated. Here, the distance from the edge of the electrode finger 31a to the electrode finger 31b, both of which are shaped in a comb-teeth like and included in the first interdigital finger electrode 31, is set as the wavelength λ of the lamb wave. Each width of the electrode fingers 31a and 31b is represented as Li.

The distance (may be called as a pitch) from the edge of the electrode finger 31a to the electrode finger 32a, which is interdigitated between the electrode fingers 31a and 31b of the second interdigital finger electrode 32, is represented as Pi. The width of the electrode 32a is also represented as Li.

The distance (may be called as a pitch) from the edge of the electrode finger 50a to the electrode finger 50b in the reflector 50 is represented as Pr. Each width of the electrode fingers 50a and 50b is represented as Lr.

Here, the following relation is satisfied: Hi≠Hr, where Hi is each thickness of the electrode fingers 31a, 31b, and 32a of the IDT electrode 30, and Hr is each thickness of the electrode fingers 50a and 50b of the reflector 50.

The thicknesses of other electrode fingers, which are not described above, included in the IDT electrode 30, other electrode fingers of the reflector 50, and the electrode finger included in the reflector 40, are set in the same relation while their descriptions are omitted.

A lamb wave is excited by inputting an input drive signal having a given frequency to the IDT electrode 30 structured as described above, propagating in the longitudinal direction of the piezoelectric substrate 20 with repeating reflections on the front and back surfaces of the piezoelectric substrate 20 to be reflected by the reflectors 40 and 50.

Next, impedance frequency characteristics, and conductance frequency characteristics of the lamb wave type high frequency resonator 7 structured as above will be described.

Here, the reflector 50 is exemplified for description since the reflectors 40 and 50 function the same way.

Figure 28:
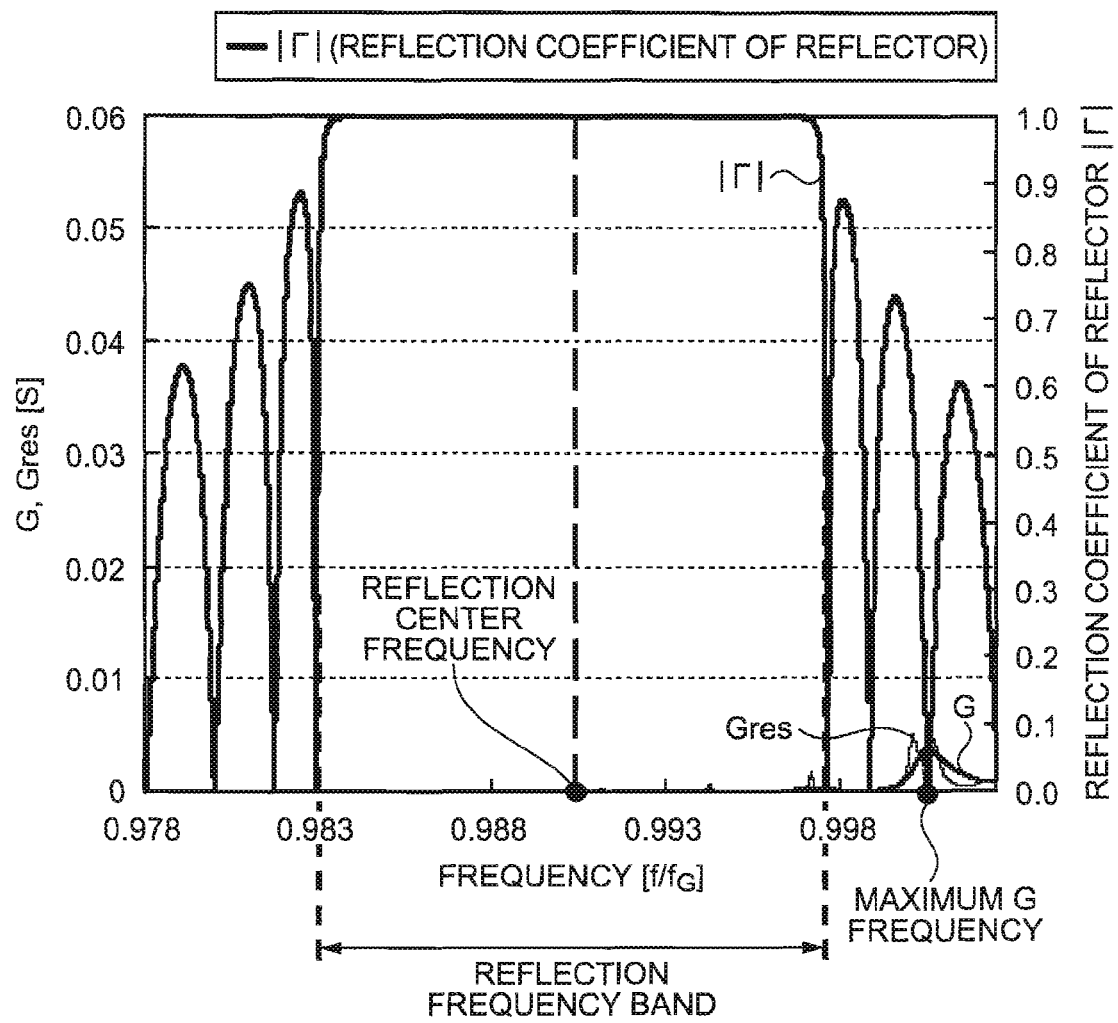
FIG. 28 is a graph illustrating frequency characteristics of a radiation conductance and a reflection coefficient of a reflector, in mode B of the lamb wave type high frequency resonator according to the seventh embodiment of the invention.

FIG. 28 is a graph illustrating the frequency characteristics of the radiation conductance and the reflection coefficient of the reflector 50 of the lamb wave type high frequency resonator 7 of the embodiment.

FIG. 28 is exemplified, provided that the thickness Hi of the electrode fingers 31a, 31b, and 32a of the IDT electrode 30, and the thickness Hr of the electrode fingers 50a, and 50b of the reflector 50 satisfy the relation of Hr/Hi=5.

Figure 30:
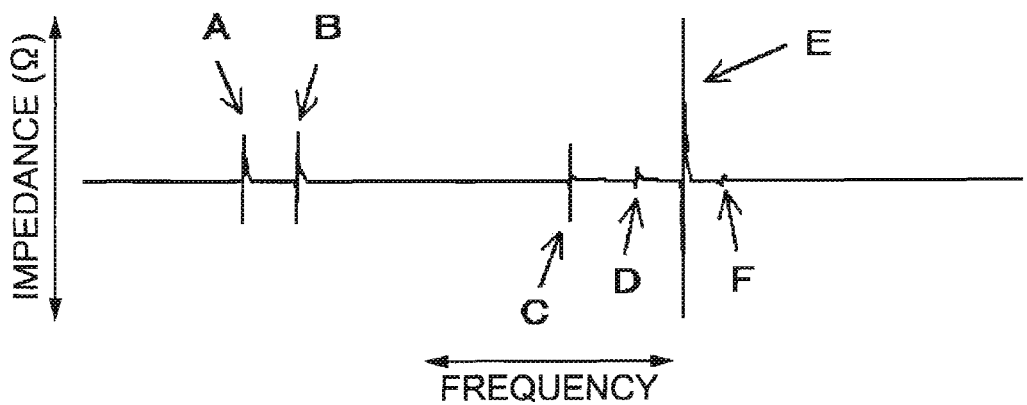
FIG. 30 is a graph illustrating an impedance frequency characteristic of the lamb wave type high frequency resonator according to the seventh embodiment of the invention.

As shown in FIG. 28, the reflection center frequency is shifted to a low frequency side as compared with the known design shown in FIG. 57 by setting the thicknesses of the electrode fingers 31a, 31b, and 32a so as to satisfy the relation of Hi≠Hr, in a case where the mode B shown in FIG. 30 is the desired oscillation mode (hereinafter, only referred to as mode). Accordingly, the maximum G frequency is out of the reflection frequency band. As a result, the spurious can be depressed.

Figure 29:
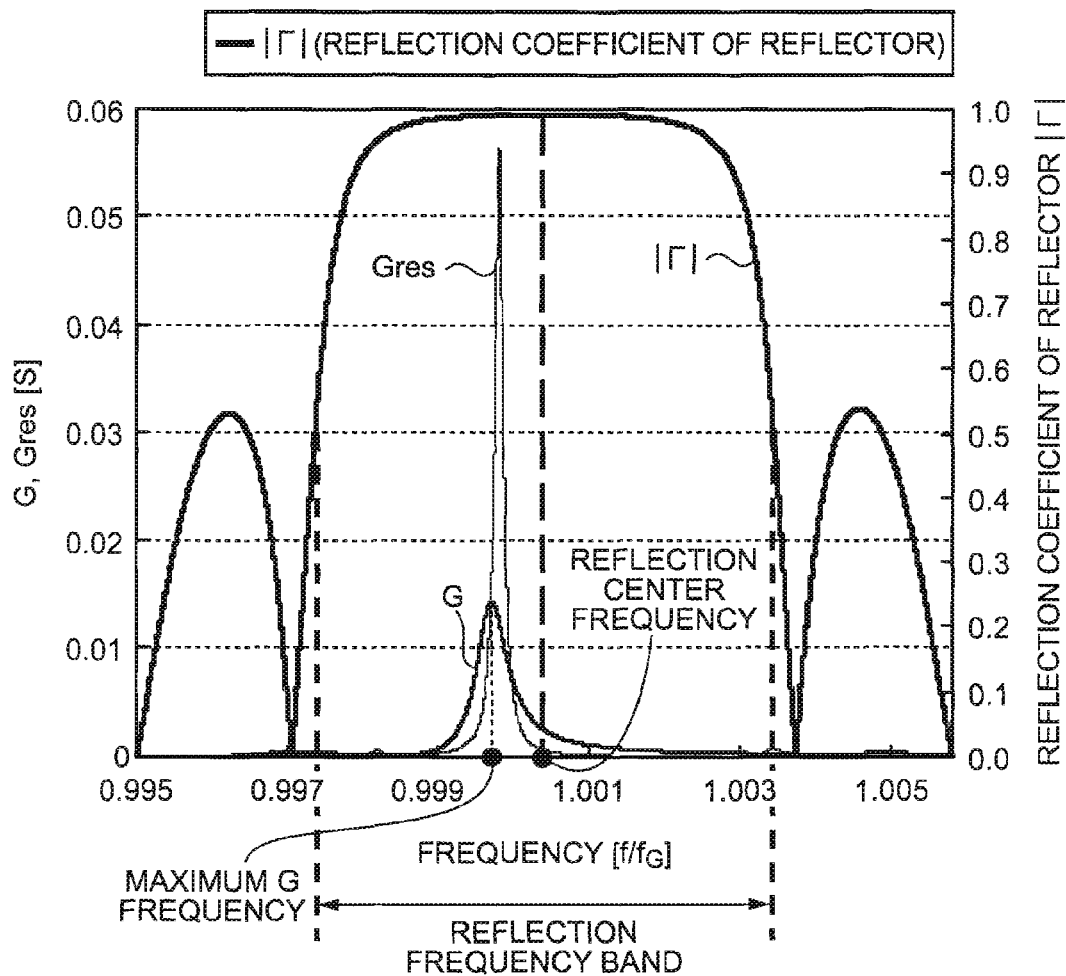
FIG. 29 is a graph illustrating frequency characteristics of a radiation conductance and a reflection coefficient of the reflector, in mode E of the lamb wave type high frequency resonator according to the seventh embodiment of the invention.

FIG. 29 is a graph illustrating the frequency characteristics of the radiation conductance and the reflection coefficient of the reflector 50, in mode E shown in FIG. 30, provided that the IDT electrode 30 and the reflector 50 are structured as the same as those described above. As for the mode E, the maximum G frequency is within the reflection frequency band as shown in FIG. 29 even though the electrode finger width Hi of the reflector 50 is designed so as to satisfy the relation of Hi≠Hr. As a result, the Gres is larger than that of the known design (refer to FIG. 59), resulting in the mode E being intensively excited. Namely, the excitation of mode to be used can be intensified.

While the embodiment is described based on the relation of Hr/Hi=5 as an example, the ratio of the thickness Hi of the electrode fingers 31a, 31b, and 32a of the IDT electrode 30, to the thickness Hr of the electrode fingers 50a and 50b of the reflector 50 is not limited to 5, but is applicable as long as Hr≠Hi. Namely, the difference (ratio) is not limited. Further, Hr>Hi may be acceptable.

By setting the relation of the electrode fingers of the IDT electrode 30 and the reflector 50, both of which are fabricated on the surface of the piezoelectric substrate 20, as Hr≠Hi, mass adding effect is changed that is the major factor to determine the maximum G frequency and the reflection frequency band. As a result, the maximum G frequency of the mode to be used is set to be within the reflection frequency band, while the spurious is set to arise out of the reflection frequency band.

FIG. 30 is a graph illustrating the impedance frequency characteristic of the lamb wave type high frequency resonator 10 of the embodiment. In FIG. 30, only the mode E is intensively excited, while modes other than the mode E are suppressed. Therefore, abnormal oscillations and frequency jumps can be suppressed.

According to the seventh embodiment, the maximum G frequency of the mode to be used is set to be within the reflection frequency band, or the spurious is set to be out of the reflection frequency band as compared with the lamb wave element by the known technique described above. As a result, the mode to be used can be intensively excited. This is because that the thickness Hi of the electrode fingers 31a, 31b, and 32a of the IDT electrode 30 and the thickness Hr of the electrode fingers 50a and 50b of the reflector 50 (and fingers of the reflector 40) are set so as to be different from one another. Consequently, the spurious can be suppressed so as to achieve a resonator having high reliability.

In addition, in a case where two electrode fingers 31a and 32a are interdigitated in the range of the wavelength λ of the lamb wave, the reflection of the lamb wave arises in the IDT electrode 30. This reflection of the lamb wave can intensify the excitation of a desired oscillation mode. Thus, the excitation of the mode can be further intensified together with the effect obtained by the above-described setting in which the thickness Hi of the electrode fingers 31a, 31b, and 32a and the thickness Hr of the electrode fingers 50a and 50b of the reflector 50 are different from one another. Moreover, this makes it possible to reduce the number of electrode fingers of the reflectors 40 and 50, resulting in the effect to downsize the lamb wave type high frequency resonator 7.

Eighth Embodiment

Next, a lamb wave type high frequency resonator 8 according to an eighth embodiment of the invention will be described with reference to accompanying drawings. As compared with the seventh embodiment (refer to FIGS. 26 and 27), the eighth embodiment differs in the structure of the electrode finger of the IDT electrode, and is featured in that four electrode fingers of the IDT electrode are interdigitated in the range of the wavelength λ of the lamb wave.

Figure 31:
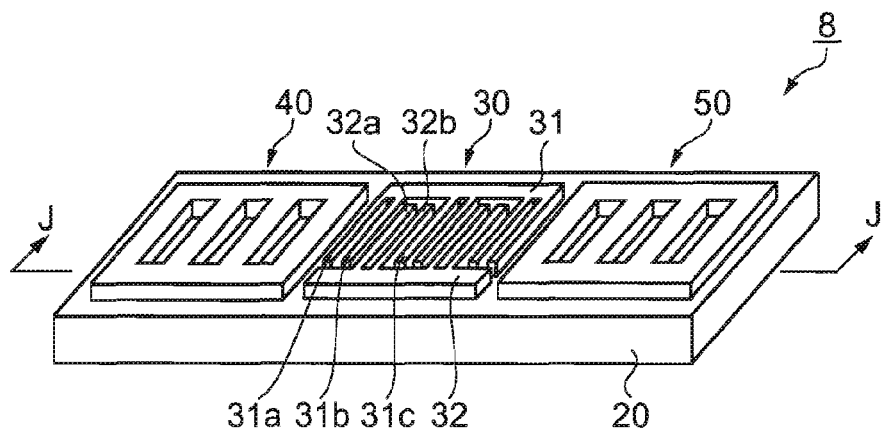
FIG. 31 is a perspective view illustrating a lamb wave type high frequency resonator according to an eighth embodiment of the invention.
Figure 32:
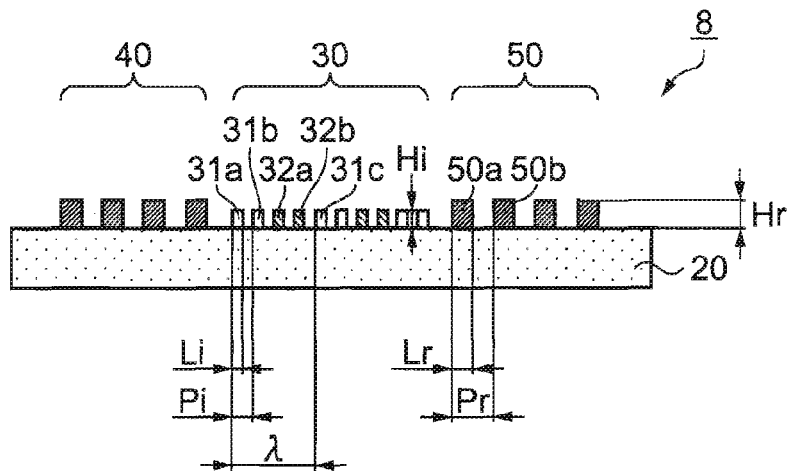
FIG. 32 is a cross-sectional view of the lamb wave type high frequency resonator according to the eighth embodiment of the invention taking along the line J-J in FIG. 31.

FIGS. 31 and 32 show the structure of the lamb wave type high frequency resonator of the eighth embodiment. FIG. 31 is a perspective view. FIG. 32 is a cross-sectional view taken along the line J-J in FIG. 31. In FIGS. 31 and 32, the lamb wave type high frequency resonator 8 is composed of the IDT electrode 30, reflectors 40 and 50 disposed at both sides of the IDT electrode 30, and the piezoelectric substrate 20 made of quartz crystal. The IDT electrode 30 and the reflectors 40 and 50 are fabricated on the surface of the piezoelectric substrate 20. This basic arrangement is the same as that in the seventh embodiment.

Here, from the edge of the first interdigital finger electrode 31, two electrode fingers 31a and 31b are fabricated in parallel with each other in the right direction in the figure. Between the electrode finger 31b and the electrode finger 31c, the electrode fingers 32a and 32b of the second interdigital finger electrode 32 are interdigitated in parallel with each other. The distance from the edge of the electrode finger 31a to the electrode finger 31c is set as the wavelength λ of the lamb wave. Each thickness of the electrode fingers 31a, 31b, 31c, 32a, and 32b is represented as Hi.

Note that other electrodes included in the first interdigital finger electrode 31 and the second interdigital finger electrode 32 are fabricated so as to satisfy the same relations.

The thickness of the electrode fingers 50a and 50b is represented as Hr. The thicknesses of other electrode fingers included in the reflector 50, the electrode finger included in the reflector 40, are set in the same of Hr while their descriptions are omitted.

Note that the thickness Hi of electrode finger of the IDT electrode 30 and the thickness Hr of electrode finger of the reflector 50 are set to satisfy the relation of Hi≠Hr.

Next, impedance frequency characteristics, and conductance frequency characteristics of the lamb wave type high frequency resonator 8 structured as above will be described.

Here, the reflector 50 is exemplified for description since the reflectors 40 and 50 function the same way.

Figure 33:
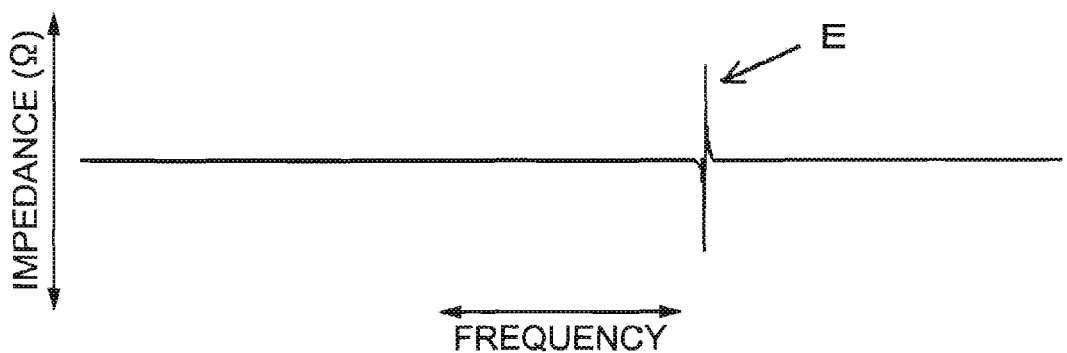
FIG. 33 is a graph illustrating an impedance frequency characteristic of the lamb wave type high frequency resonator according to the eighth embodiment of the invention.

FIG. 33 shows the impedance frequency characteristic of the lamb wave type high frequency resonator 8 of the embodiment, provided that Hr/Hi=5 as an example. As shown in FIG. 33, only mode E is intensively excited, while the modes A, B, C, D, and F, which arise in the seventh embodiment (refer to FIG. 30), are suppressed.

Accordingly, in the eighth embodiment, the reflection wave in the IDT electrode 30 is balanced out by four electrode fingers, which are 31a and 31b included in the first interdigital finger electrode 31, and 32a, and 32b included in the second interdigital finger electrode 32, interdigitated in the range of the wavelength λ of the lamb wave. As a result, the mode having the maximum G frequency out of the reflection frequency band is further suppressed, resulting in the spurious being almost eliminated. As a result, in a case where oscillators are structured by using the lamb wave type high frequency resonator 8, oscillators having high reliability without abnormal oscillations and frequency jumps can be achieved.

While the embodiment is described based on the relation of Hr/Hi=5 as an example, the ratio of the electrode finger thickness Hi of the IDT electrode 30, to the electrode finger thickness Hr of the reflector 50 is not limited to 5, but is applicable as long as Hr≠Hi. Namely, the difference (ratio) is not limited. Further, Hr<Hi may be acceptable.

Ninth Embodiment

Next, a lamb wave type high frequency resonator 9 according to a ninth embodiment of the invention will be described with reference to accompanying drawings. The ninth embodiment is featured in that insulation film is formed so as to cover the upper surface of the IDT electrode 30 described in the seventh and eighth embodiments. The IDT electrode 30 and the reflectors 40 and 50 can be structured as the same as those in the seventh and eighth embodiments. Here, the structure based on the seventh embodiment (refer to FIGS. 26 and 27) is exemplified. Common parts are given the same numerals and only different parts will be described.

Figure 34:
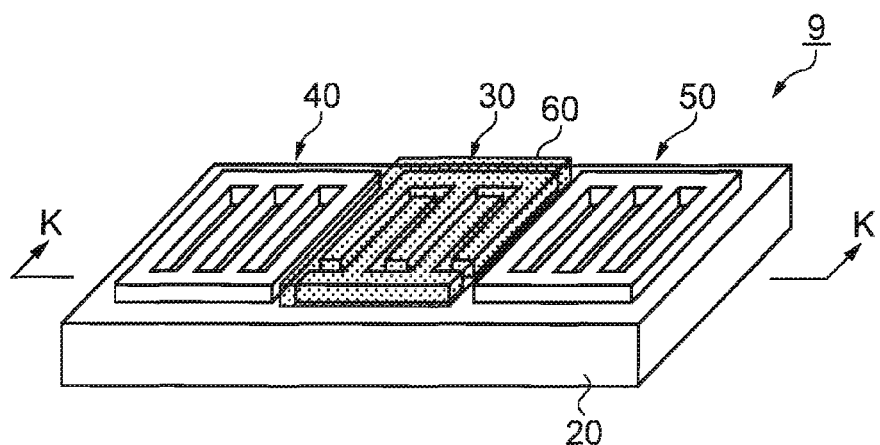
FIG. 34 is a perspective view illustrating a lamb wave type high frequency resonator according to a ninth embodiment of the invention.
Figure 35:
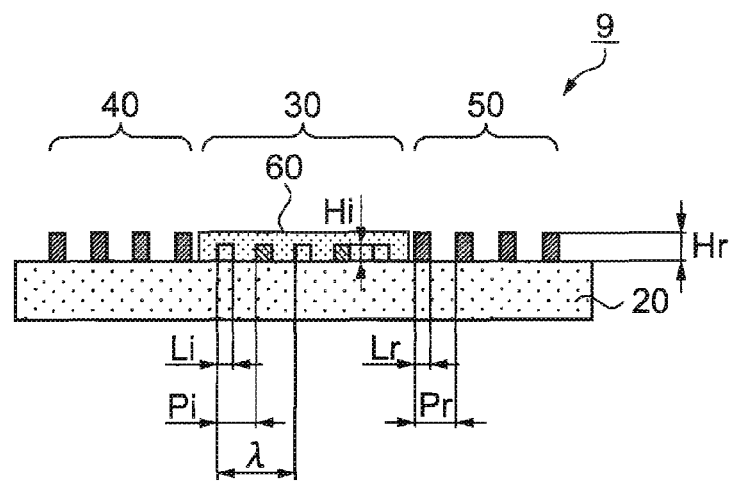
FIG. 35 is a cross-sectional view of the lamb wave type high frequency resonator according to the ninth embodiment of the invention taking along the line K-K in FIG. 34.

FIGS. 34 and 35 show the lamb wave type high frequency resonator 9 of the ninth embodiment. FIG. 34 is a perspective view. FIG. 35 is a cross-sectional view taken along the line K-K in FIG. 34. In FIGS. 34 and 35, the insulation film 60 is deposited on the surface of the IDT electrode 30 so as to cover the whole IDT electrode 30. The insulation film 60 is made of $SiO_2$. Note that the electrode finger thickness Hi of the IDT electrode 30 and the electrode finger thickness Hr of the reflector 50 satisfy the relation of Hi≠Hr.

The detailed description on the film thickness of the insulation film 60 will be omitted since it was described in FIG. 11. In the embodiment, the value of Δt/λ, i.e. Δt is divided by the wavelength λ of the lamb wave, is set in the range of Δt/λ≦0.044. Here, Δt(=T-t) represents the difference of a concavity and a convexity of the surface of the insulation film 60 in FIG. 11.

The reflection coefficient of the IDT electrode can be reduced by depositing the insulation film 60 on the surface of the IDT electrode 30. Further, the reflection coefficient of the IDT electrode can be reduced by setting a concavity and a convexity of the surface to be in the range of Δt/λ≦0.044.

This is because that the more Δt/λ becomes smaller (a concavity and a convexity of the surface of the insulation film 60 are small, i.e. the surface of the insulation film 60 is flat and smooth), the reflection coefficient of the IDT electrode becomes smaller, resulting in the resonance impedance ratio being small, as described in the third embodiment with reference to FIGS. 12 and 13.

In addition, the reflection coefficient of the IDT electrode 30 is smaller than the coefficient in a case where the normalized electrode thickness is 3%. if Δt/λ≦0.044.

Figure 36:
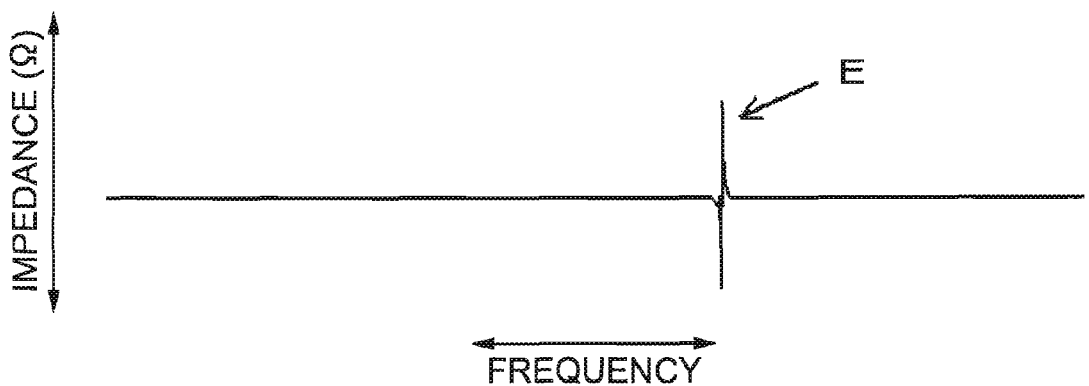
FIG. 36 is a graph illustrating an impedance frequency characteristic of the lamb wave type high frequency resonator according to the ninth embodiment of the invention.

FIG. 36 shows the impedance frequency characteristic of the lamb wave type high frequency resonator 9 of the ninth embodiment. Note that FIG. 36 shows a graph, provided that Δt/λ=0.005. As shown in FIG. 36, only mode E is extensively excited; modes A, B, C, D, and F, other than the mode E, are suppressed and eliminated.

In the eighth embodiment in which the IDT electrode 30 and the reflectors 40 and 50 are structured, if the insulation film is deposited on the IDT electrode, modes other than the mode to be used can be suppressed from the same reason described above.

According to the ninth embodiment, depositing the insulation film 60 covering the upper surface of the IDT electrode 30 allows the reflection coefficient of the IDT electrode to be small. Further, setting a concavity and a convexity of the surface of the insulation film 60 in the range of Δt/λ≦0.044 allows the reflection coefficient of the IDT electrode to be extremely small, eliminating almost all of reflection. As a result, the spurious can be almost suppressed. In addition, in a case where oscillators are structured by using the lamb wave type high frequency resonator 9, oscillators having high reliability without abnormal oscillations or frequency jumps can be achieved together with intensifying the excitation of the mode to be used by setting the relation of Hi≠Hr, where Hi is the electrode finger thickness of the IDT electrode 30 and Hr is the electrode finger thickness of the reflector 50.

In a case where the densities of electrode materials in the IDT electrode and reflector are different from one another.

Tenth Embodiment

Figure 37:
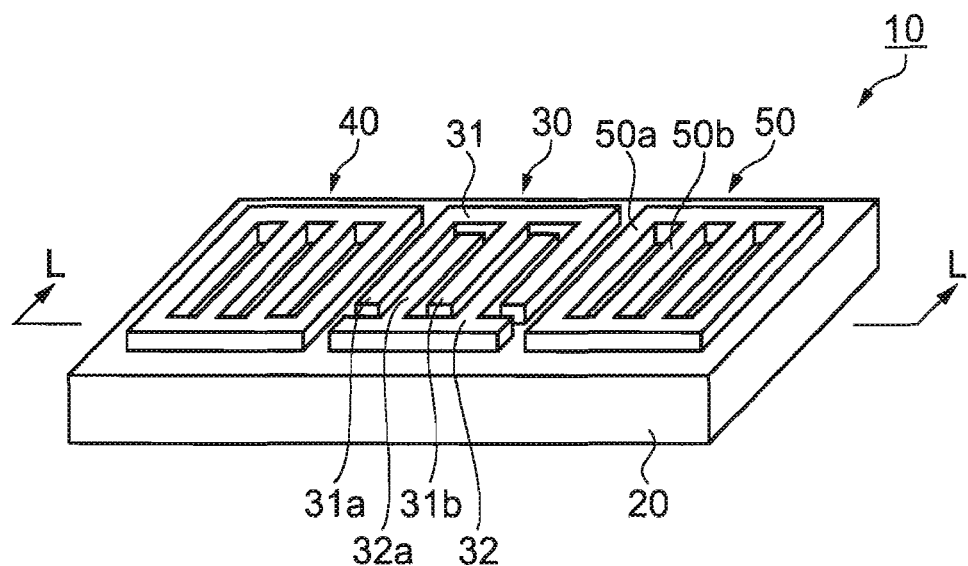
FIG. 37 is a perspective view illustrating a lamb wave type high frequency resonator according to a tenth embodiment of the invention.
Figure 38:
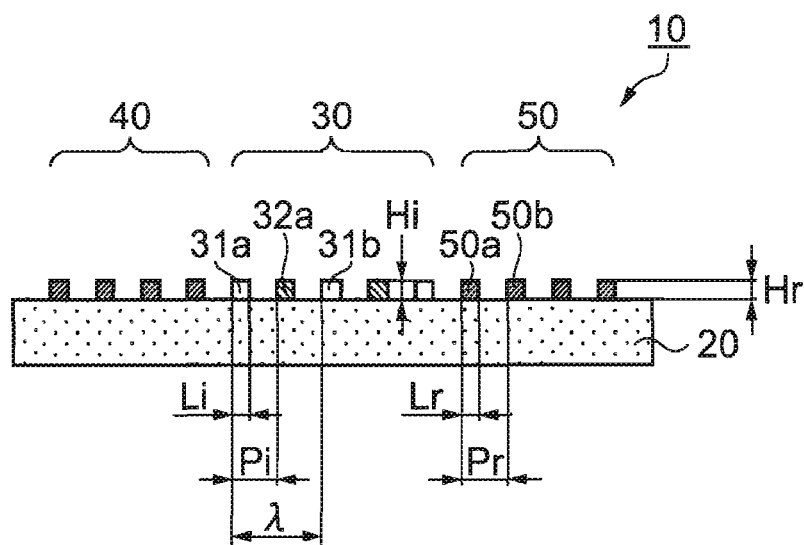
FIG. 38 is a cross-sectional view of the lamb wave type high frequency resonator according to the tenth embodiment of the invention taking along the line L-L in FIG. 37.

FIG. 37 is a perspective view illustrating a lamb wave type high frequency resonator 10 according to a tenth embodiment. FIG. 38 is a cross-sectional view taken along the line L-L in FIG. 37. In FIGS. 37 and 38, the lamb wave type high frequency resonator 10 is composed of the IDT electrode 30 including a pair of interdigital finger electrodes 31 and 32, the reflectors 40 and 50, which is disposed at both sides of the propagation direction of the lamb wave excited by the IDT electrode 30, and the piezoelectric substrate 20 made of quartz crystal. The reflector 50 includes electrode fingers 50a and 50b. The IDT electrode 30, and the reflectors 40 and 50 are fabricated on the surface of the piezoelectric substrate 20. Hereinafter, the interdigital finger electrode 31 at one side is called as the first interdigital finger electrode 31, while the interdigital finger electrode 32 at the other side is called as the second interdigital finger electrode 32.

In the IDT electrode 30, the first interdigital finger electrode 31 and the second interdigital finger electrode 32 are interdigitated. Here, the distance from the edge of the electrode finger 31a to the electrode finger 31b, both of which are shaped in a comb-teeth like and included in the first interdigital finger electrode 31, is set as the wavelength λ of the lamb wave. Each width of the electrode fingers 31a and 31b is represented as Li.

The distance (may be called as a pitch) from the edge of the electrode finger 31a to the electrode finger 32a, which is interdigitated between the electrode fingers 31a and 31b of the second interdigital finger electrode 32, is represented as Pi. The width of the electrode 32a is also represented as Li.

The distance (may be called as a pitch) from the edge of the electrode finger 50a to the electrode finger 50b in the reflector 50 is represented as Pr. Each width of the electrode fingers 50a and 50b is represented as Lr.

Here, the following relation is satisfied: Hi=Hr, where Hi is each thickness of the electrode fingers 31a, 31b, and 32a of the IDT electrode 30, and Hr is each thickness of the electrode fingers 50a and 50b of the reflector 50.

The thicknesses of other electrode fingers, which are not described above, included in the IDT electrode 30, other electrode fingers of the reflector 50, and the electrode fingers included in the reflector 40, are set in the same relation while their descriptions are omitted.

The IDT electrode 30 is made of aluminum (Al). The reflectors 40 and 50 are made of silver (Ag), copper (Cu), gold (Au), or the like. Here, pr and pi satisfy the relation of pr>pi, where pi is the density of the electrode material of the IDT electrode 30 and pr is the density of the electrode material of the reflectors 40 and 50.

A lamb wave is excited by inputting an input drive signal having a given frequency to the IDT electrode 30 structured as described above. The excited lamb wave propagates in the longitudinal direction of the piezoelectric substrate 20 with repeating reflections on the front and back surfaces of the piezoelectric substrate 20 to be reflected by the reflectors 40 and 50, Next, the frequency characteristics of the radiation conductance and the reflection coefficient of the reflector of the lamb wave type high frequency resonator structured as described above will be described.

Figure 39:
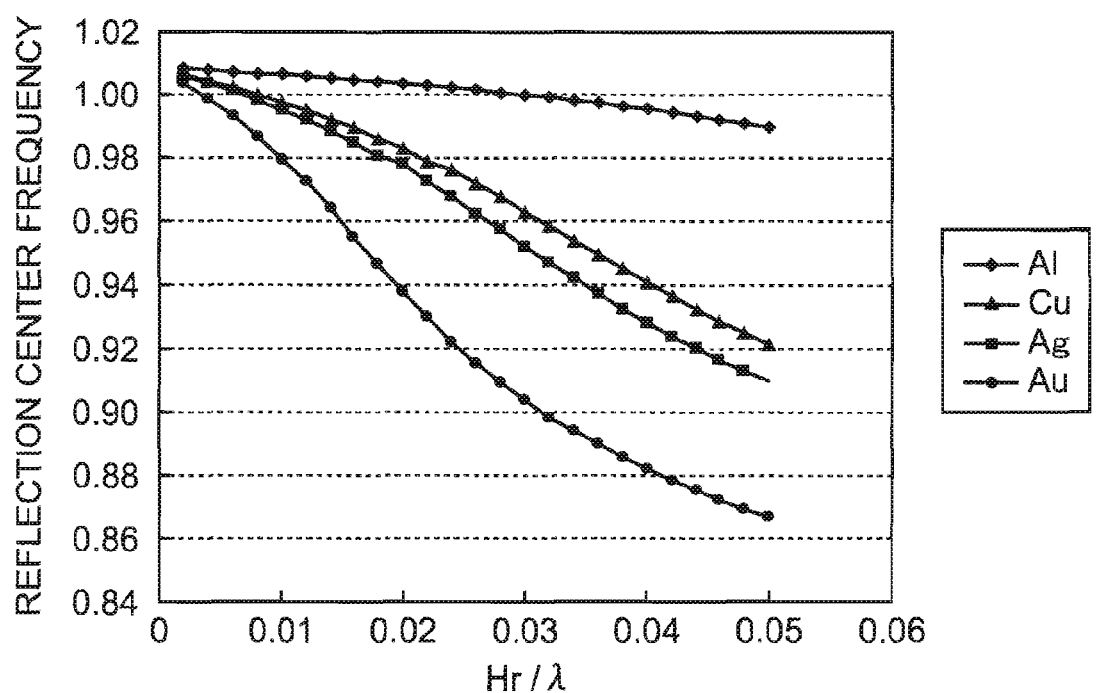
FIG. 39 is a graph illustrating a change of a reflection center frequency of a reflector with respect to electrode materials when an electrode thickness changes.
Figure 40:
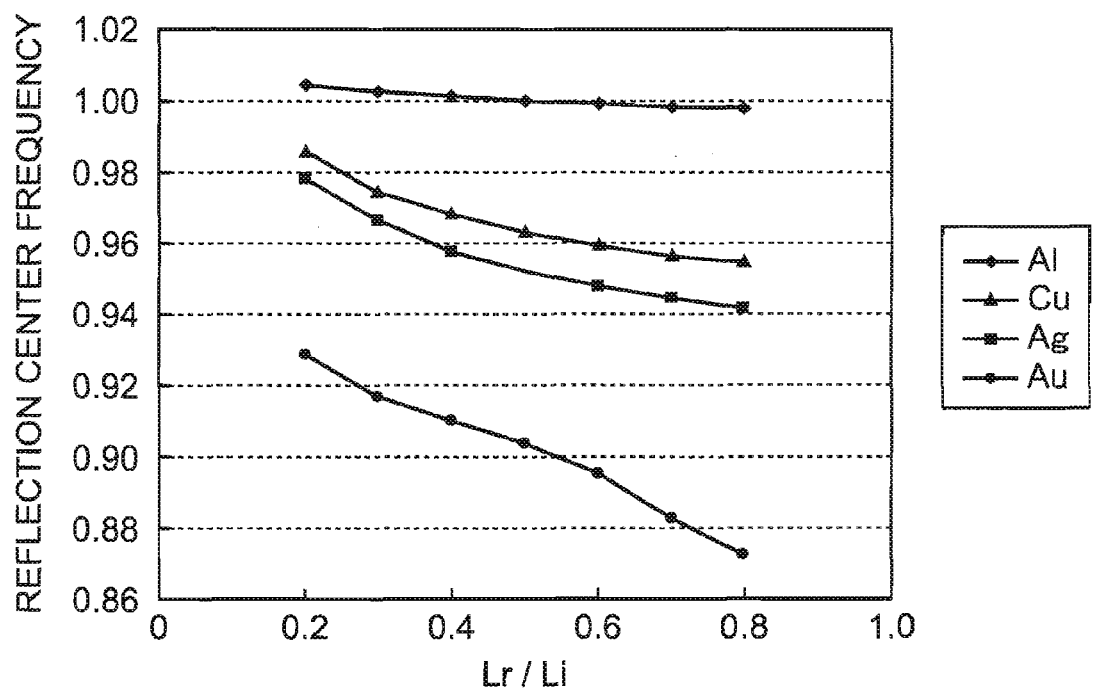
FIG. 40 is a graph illustrating a change of a reflection center frequency of a reflector with respect to electrode materials when an electrode width changes.
Figure 41:
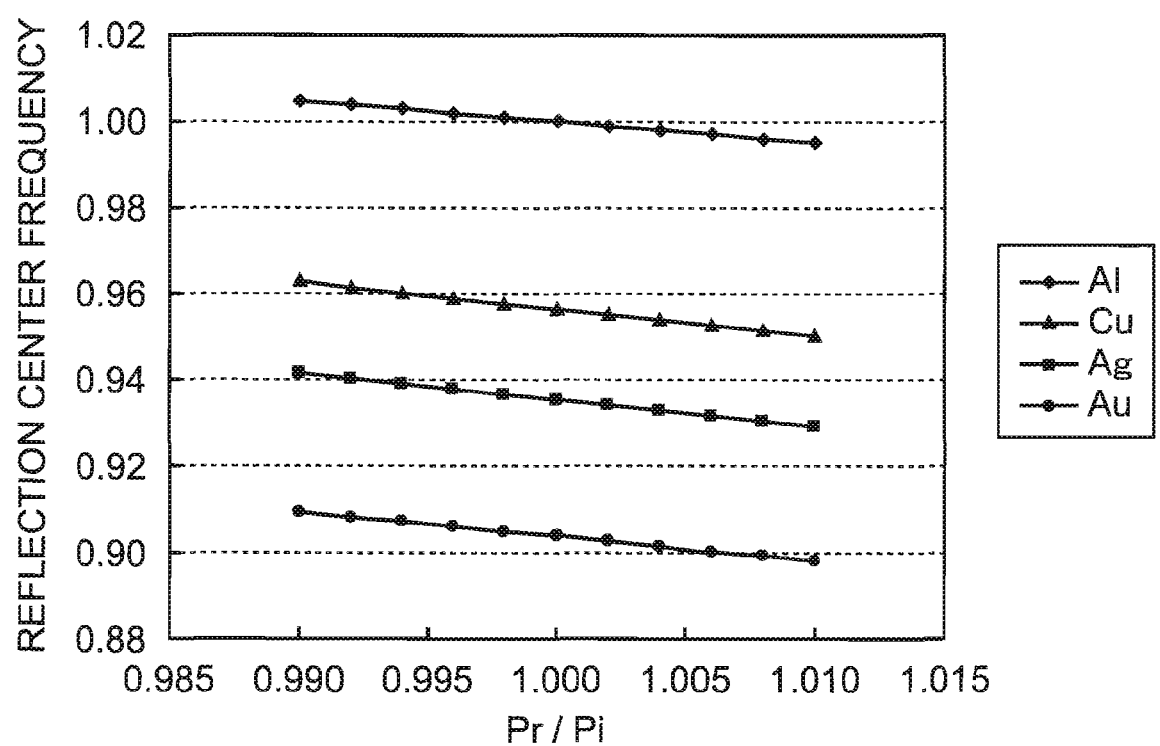
FIG. 41 is a graph illustrating a change of a reflection center frequency of a reflector with respect to electrode materials when a pitch between electrodes changes.

FIGS. 39 to 41 show the change of the reflection center frequency of the reflector when the following electrode materials are used for the reflector: Al, which is typically used for the electrode material, Cu, Ag, and Au, which three materials have a different density from that of Al. FIG. 39 shows the change of the reflection center frequency of the reflector when the electrode thickness Hr varies (Hr/λ=0.03 of Al electrode is set as a reference). FIG. 40 shows the change of the reflection center frequency of the reflector when the electrode width varies (Lr/Li=0.5 of Al electrode is set as a reference). FIG. 41 shows the change of the reflection center frequency of the reflector when the pitch Pr varies (Pr/Pi=1.000 of Al electrode is set as a reference).

Those figures show that the reflection center frequency is different from that of Al when the electrode material having a different density from that of Al is used. Namely, the reflection characteristic of the reflector differs by the density of electrode material used. Using this effect can suppress the spurious.

Figure 42:
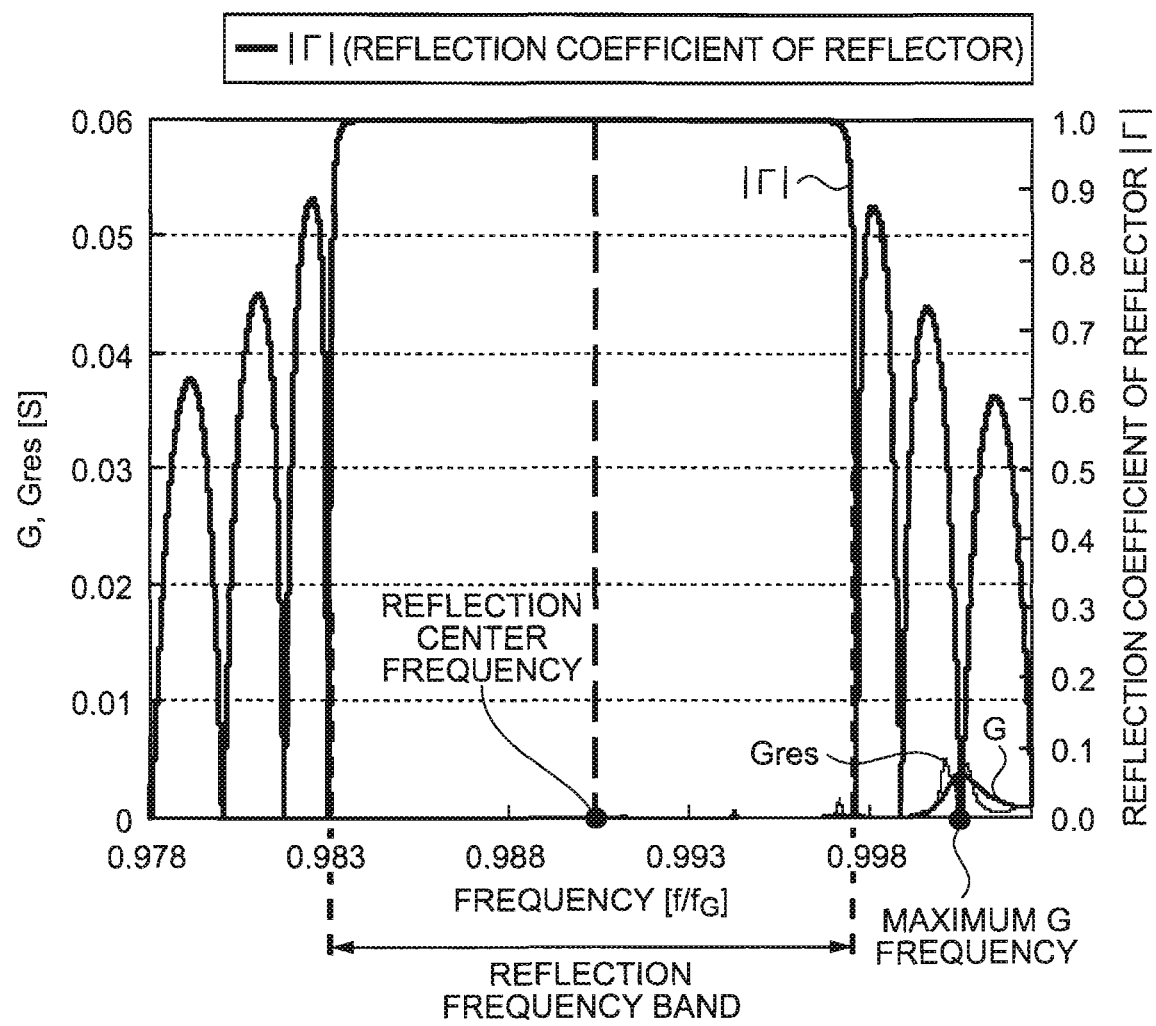
FIG. 42 is a graph illustrating frequency characteristics of a radiation conductance and a reflection coefficient of the reflector, in mode B of the lamb wave type high frequency resonator (pr>pi) according to the tenth embodiment of the invention.
Figure 43:
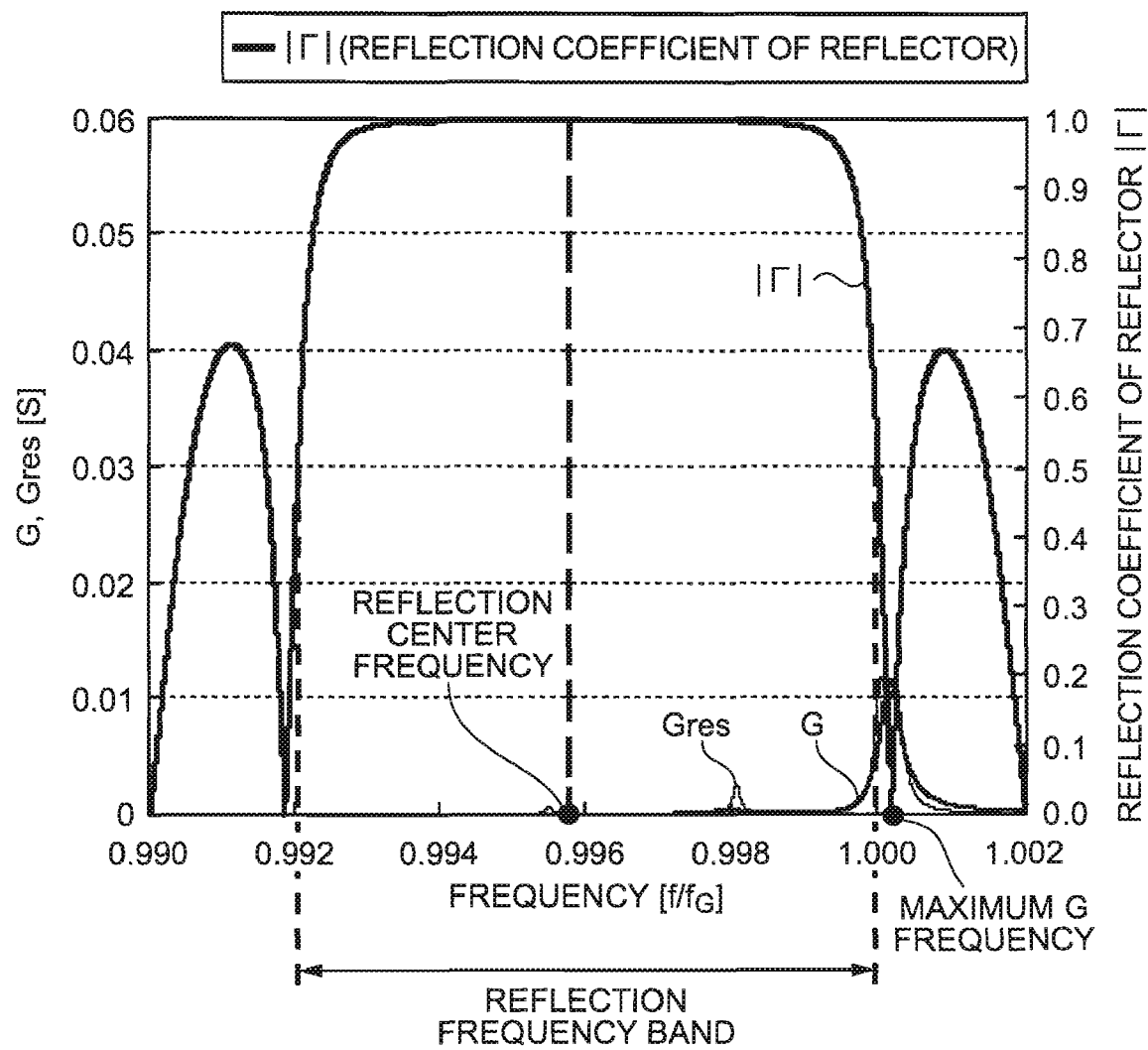
FIG. 43 is a graph illustrating a frequency characteristic of a radiation conductance and a reflection coefficient of the reflector, in mode B of the lamb wave type high frequency resonator (pr<pi) according to the tenth embodiment of the invention.
Figure 44:
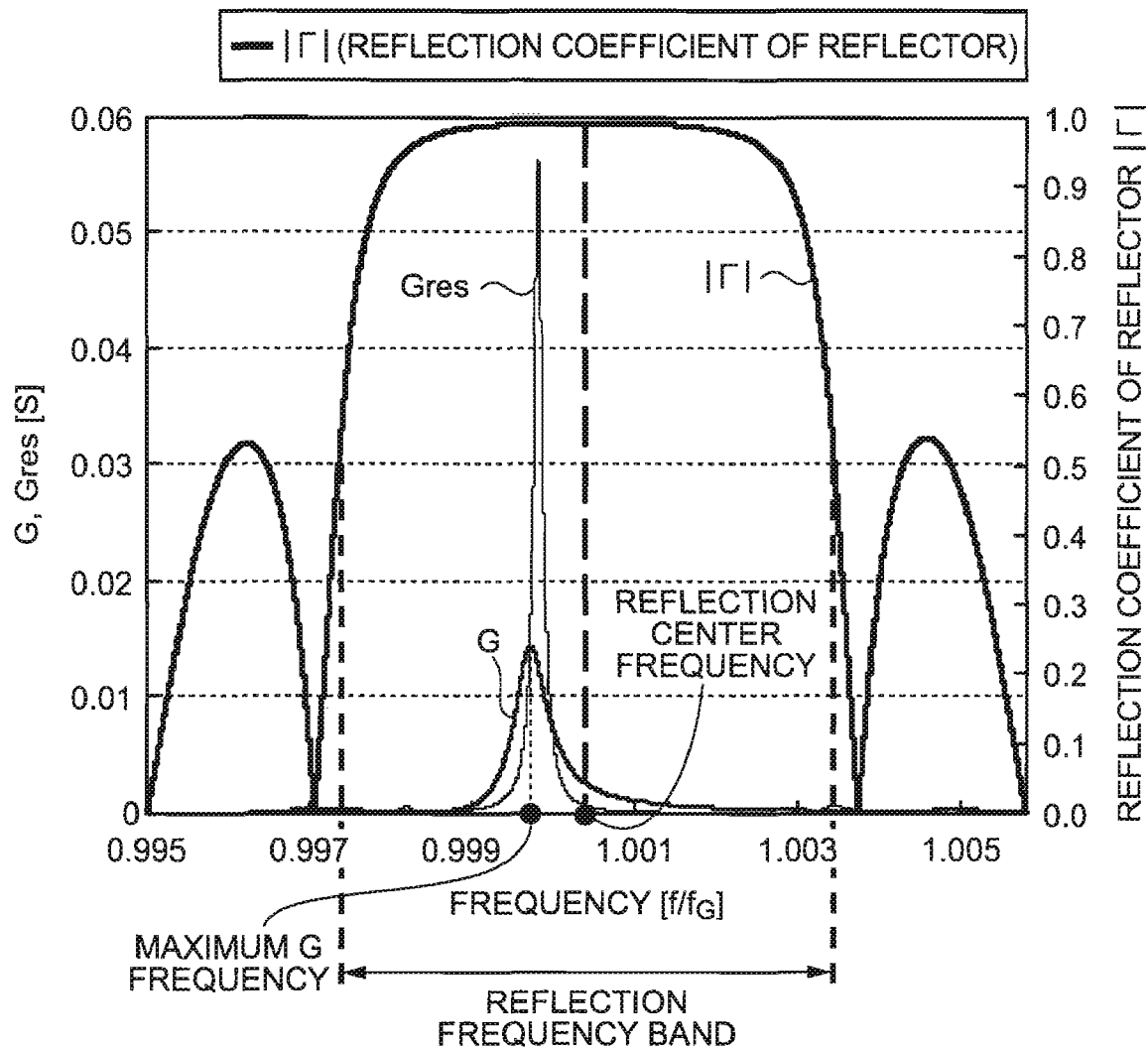
FIG. 44 is a graph illustrating frequency characteristics of a radiation conductance and a reflection coefficient of the reflector in mode F of the lamb wave type high frequency resonator (pr>pi) according to the tenth embodiment of the invention.
Figure 45:
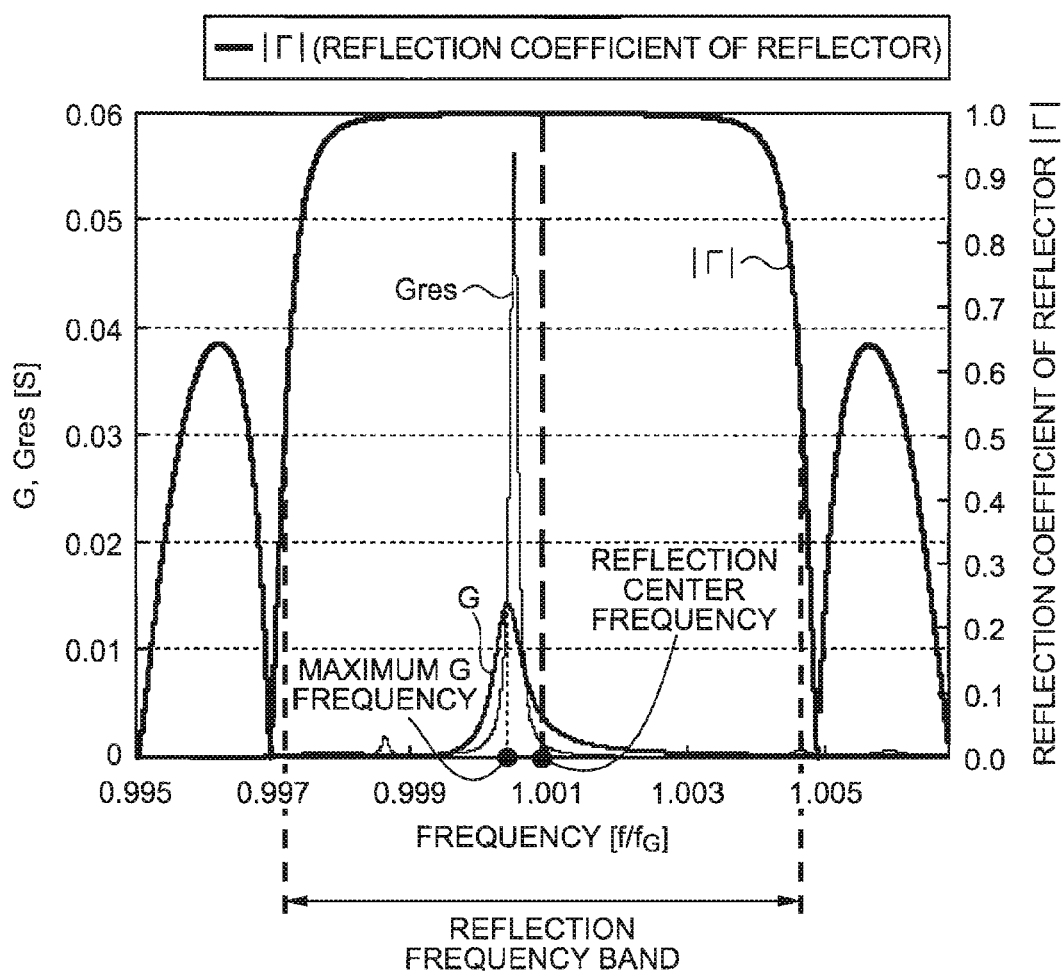
FIG. 45 is a graph illustrating frequency characteristics of a radiation conductance and a reflection coefficient of the reflector, in mode E of the lamb wave type high frequency resonator (Pr<pi) according to the tenth embodiment of the invention.

FIG. 42 shows the frequency characteristics of the radiation conductance and the reflection coefficient of the reflector, in mode B, provided that the densities of the reflector and IDT electrode satisfy the relation of pr>pi. FIG. 43 shows the frequency characteristics of the radiation conductance, and the reflection coefficient of the reflector, provided that pr<pi. FIG. 44 shows the frequency characteristics of the radiation conductance and the reflection coefficient of the reflector, in mode E, provided that pr>pi. FIG. 45 shows the frequency characteristics of the radiation conductance, and the reflection coefficient of the reflector, in mode E, provided that pr<pi.

As shown in FIGS. 42 and 43, the reflection center frequency is shifted to a low frequency side as compared with the known design shown in FIG. 57 when the electrode density of the reflector satisfies the relation of pr≠pi. Accordingly, the maximum G frequency of mode B is out of the reflection frequency band. As a result, the excitation can be depressed. Namely, the spurious can be suppressed. In contrast, as for the mode E, the maximum G frequency is within the reflection frequency band as shown in FIGS. 44 and 45 even though the electrode density of the reflector is designed so as to satisfy the relation of pr≠pi. As a result, the Gres becomes large, resulting in the mode E being intensively excited. Namely, the excitation of mode to be used can be intensified. As described above, if the design is carried out so that the maximum G frequency of the mode to be used is within the reflection frequency band, and the spurious is out of the frequency band, only the excitation of mode to be used can be intensified; simultaneously the spurious can be suppressed.

Figure 46:
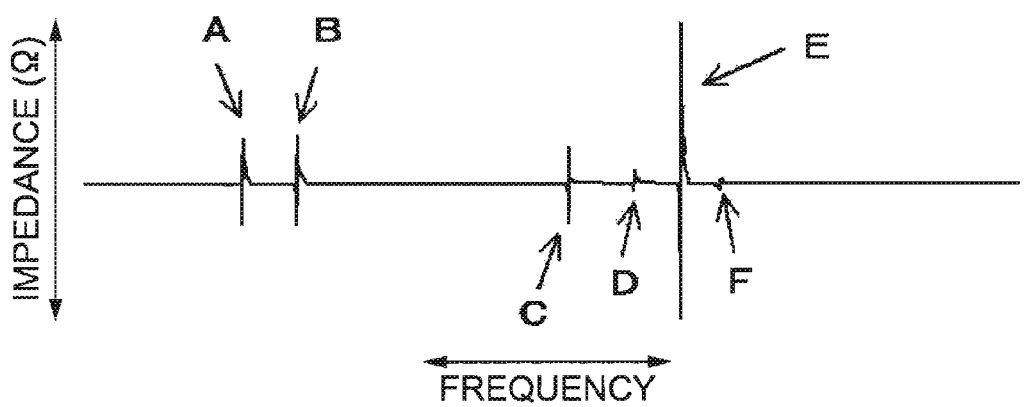
FIG. 46 is a graph illustrating an impedance frequency characteristic of the lamb wave type high frequency resonator according to the tenth embodiment of the invention.

FIG. 46 shows the impedance frequency characteristic of the lamb wave type high frequency resonator of the embodiment, provided that the densities of the reflector and the IDT electrode satisfy the relation of pr>pi as described above. As shown in FIG. 46, only the mode E is extensively excited; modes A, B, C, D, and F, other than the mode E, are suppressed. Consequently, in a case where oscillators are structured by using the lamb wave type high frequency resonator, oscillators having high reliability without abnormal oscillations and frequency jumps can be achieved. In addition, it is known that reflection arises in the IDT electrode in the structure in which two electrode fingers of the IDT electrode are included in the range of the wavelength of the lamb wave. Utilizing the reflection wave allows the excitation of the desired mode to be more intensified, reducing the number of electrode fingers in the reflectors. As a result, the lamb wave type high frequency resonator can be downsized.

Eleventh Embodiment

Next, a lamb wave type high frequency resonator 11 according to an eleventh embodiment of the invention will be described with reference to accompanying drawings. As compared with the tenth embodiment (refer to FIGS. 37 and 38), the eleventh embodiment differs in the structure of the electrode finger of the IDT electrode, and is featured in that four electrode fingers of the IDT electrode are interdigitated in the range of the wavelength λ of the lamb wave.

Figure 47:
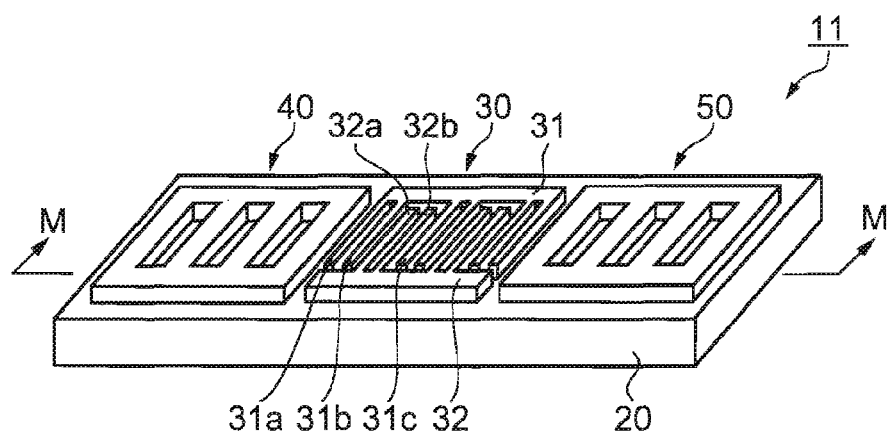
FIG. 47 is a perspective view illustrating a lamb wave type high frequency resonator according to an eleventh embodiment of the invention.
Figure 48:
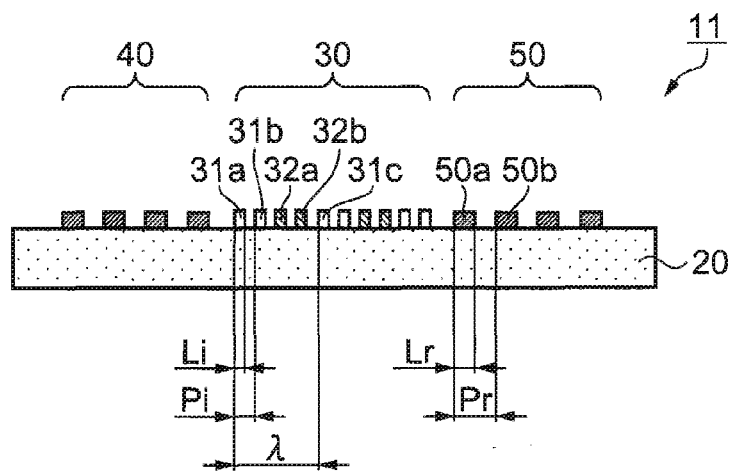
FIG. 48 is a cross-sectional view of the lamb wave type high frequency resonator according to the eleventh embodiment of the invention taking along the line M-M in FIG. 45.

FIGS. 47 and 48 show the structure of the lamb wave type high frequency resonator of the eleventh embodiment. FIG. 47 is a perspective view. FIG. 48 is a cross-sectional view taken along the line M-M in FIG. 47. In FIGS. 47 and 48, the lamb wave type high frequency resonator 11 is composed of the IDT electrode 30, the reflectors 40 and 50 disposed at both sides of the IDT electrode 30, and the piezoelectric substrate 20 made of quartz crystal. The IDT electrode 30 and the reflectors 40 and 50 are fabricated on the surface of the piezoelectric substrate 20. This basic arrangement is the same as that in the tenth embodiment.

Here, from the edge of the first interdigital finger electrode 31, two electrode fingers 31a and 31b are fabricated in parallel with each other in the right direction in the figure. Between the electrode finger 31b and the electrode finger 31c, the electrode fingers 32a and 32b of the second interdigital finger electrode 32 are interdigitated in parallel with each other. The distance from the edge of the electrode finger 31a to the electrode finger 31c is set as the wavelength λ of the lamb wave. Each thickness of the electrode fingers 31a, 31b, 31c, 32a, and 32b is represented as Hi.

Note that other electrodes included in the first interdigital finger electrode 31 and the second interdigital finger electrode 32 are fabricated so as to satisfy the same relations.

The thickness of the electrode fingers 50a and 50b is represented as Hr. Each thickness of other electrode fingers included in the reflector 50 and the electrode fingers included in the reflector 40, is set in the same of Hr while their descriptions are omitted.

Here, the following relation is satisfied: Hi=Hr, where Hi is each thickness of the electrode fingers 31a, 31b, and 32a of the IDT electrode 30, and Hr is each thickness of the electrode fingers 50a and 50b of the reflector 50.

The thicknesses of other electrode fingers, which are not described above, included in the IDT electrode 30, other electrode fingers of the reflector 50, and the electrode fingers included in the reflector 40, are set in the same relation while their descriptions are omitted.

The IDT electrode 30 is made of Al. The reflectors 40 and 50 are made of Ag, Cu, Au, or the like. Here, pr and pi satisfy the relation of pr>pi, where pi is the density of the electrode material of the IDT electrode 30 and pr is the density of the electrode material of the reflectors 40 and 50.

Next, the impedance frequency characteristic, and conductance frequency characteristic of the lamb wave type high frequency resonator 11 structured as above will be described.

Here, the reflector 50 is exemplified for description since the reflectors 40 and 50 function the same way.

Figure 49:
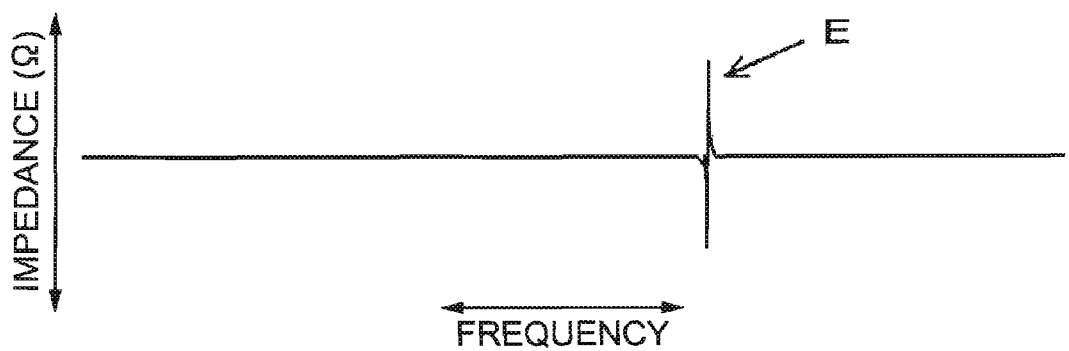
FIG. 49 is a graph illustrating an impedance frequency characteristic of the lamb wave type high frequency resonator according to the eleventh embodiment of the invention.

FIG. 49 shows the impedance frequency characteristic of the lamb wave type high frequency resonator 11 of the embodiment. As shown in FIG. 49, only the mode E is intensively excited, while the modes A, B, C, D, and F, which modes arise in the tenth embodiment (refer to FIG. 46), are suppressed.

Accordingly, in the eleventh embodiment, the reflection wave in the IDT electrode is balanced out by four electrode fingers, which are 31a and 31b included in the first interdigital finger electrode 31, and 32a, and 32b included in the second interdigital finger electrode 32, interdigitated in the range of the wavelength λ of the lamb wave. As a result, the mode having the maximum G frequency out of the reflection frequency band is further suppressed, resulting in the spurious being almost eliminated. As a result, in a case where oscillators are structured by using the lamb wave type high frequency resonator, oscillators having high reliability without abnormal oscillations and frequency jumps can be achieved.

While the density pi of the electrode material of the IDT electrode 30 and the density pr of the electrode of the reflectors 40 and 50 satisfy the relation of pr>pi in the embodiment, electrode materials may be adequately selected so as to satisfy the relation of pr<pi as long as the relation of pr≠pi is satisfied.

Twelfth Embodiment

Next, a lamb wave type high frequency resonator according to a twelfth embodiment of the invention will be described with reference to accompanying drawings. The twelfth embodiment is featured in that insulation film is formed so as to cover the upper surface of the IDT electrode 30 described in the tenth and eleventh embodiments. The IDT electrode 30 and the reflectors 40 and 50 can be structured as the same as those in the tenth and eleventh embodiments. Here, the structure in the tenth embodiment (refer to FIGS. 37 and 38) is exemplified. Common parts are given the same numerals and only different parts will be described.

Figure 50:
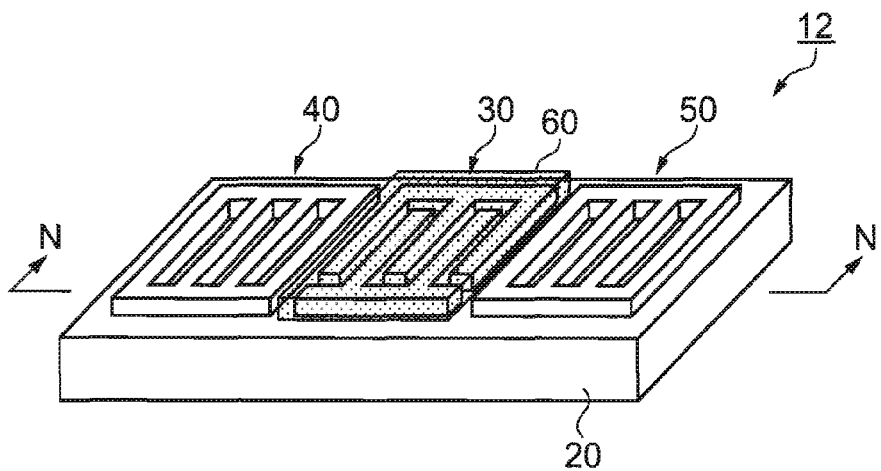
FIG. 50 is a perspective view illustrating a lamb wave type high frequency resonator according to a twelfth embodiment of the invention.
Figure 51:
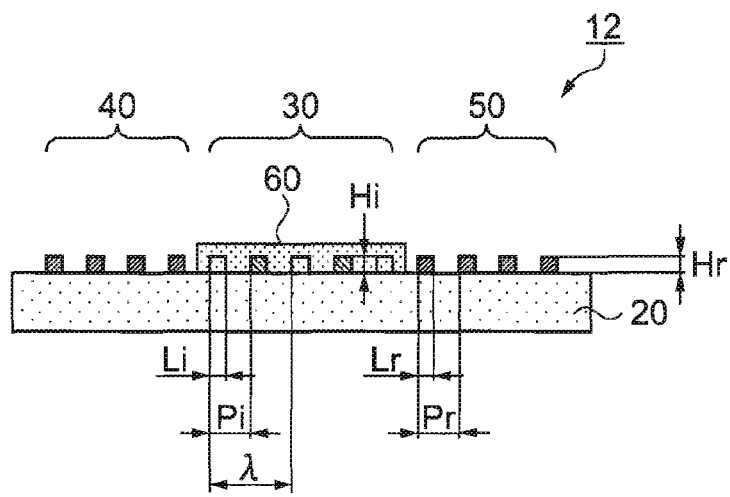
FIG. 51 is a cross-sectional view of the lamb wave type high frequency resonator according to the twelfth embodiment of the invention taking along the line N-N in FIG. 48.

FIGS. 50 and 51 show the lamb wave type high frequency resonator 12 of the twelfth embodiment. FIG. 50 is a perspective view. FIG. 51 is a cross-sectional view taken along the line N-N in FIG. 50. In FIGS. 50 and 51, the insulation film 60 is deposited on the surface of the IDT electrode 30 so as to cover the whole IDT electrode 30. The insulation film 60 is made of $SiO_2$. The IDT electrode 30 is made of Al. The reflectors 40 and 50 are made of Ag, Cu, Au, or the like. Here, pr and pi satisfy the relation of pr>pi, where pi is the density of the electrode material of the IDT electrode 30 and pr is the density of the electrode material of the reflectors 40 and 50.

The detailed description on the film thickness of the insulation film 60 will be omitted since it was described in FIG. 11. In the embodiment, the value of $\Delta t/\lambda$, i.e. $\Delta t$ is divided by the wavelength λ of the lamb wave, is set in the range of $\Delta t/\lambda \leq 0.044$. Here, $\Delta t(=T-t)$ represents the difference of a concavity and a convexity of the surface of the insulation film 60 in FIG. 11.

The reflection coefficient of the IDT electrode can be reduced by depositing the insulation film 60 on the surface of the IDT electrode 30. Further, the reflection coefficient of the IDT electrode can be reduced by setting a concavity and a convexity of the surface to be in the range of $\Delta t/\lambda \leq 0.044$.

This is because that the more $\Delta t/\lambda$ becomes smaller (a concavity and a convexity of the surface of the insulation film 60 are small, i.e. the surface of the insulation film 60 is flat and smooth), the reflection coefficient of the IDT electrode becomes smaller, resulting in the resonance impedance ratio being small, as described in the third embodiment with reference to FIGS. 12 and 13.

In addition, the reflection coefficient of the IDT electrode 30 is smaller than the coefficient in a case where the normalized electrode thickness is 3%, if $\Delta t/\lambda \leq 0.044$.

Figure 52:
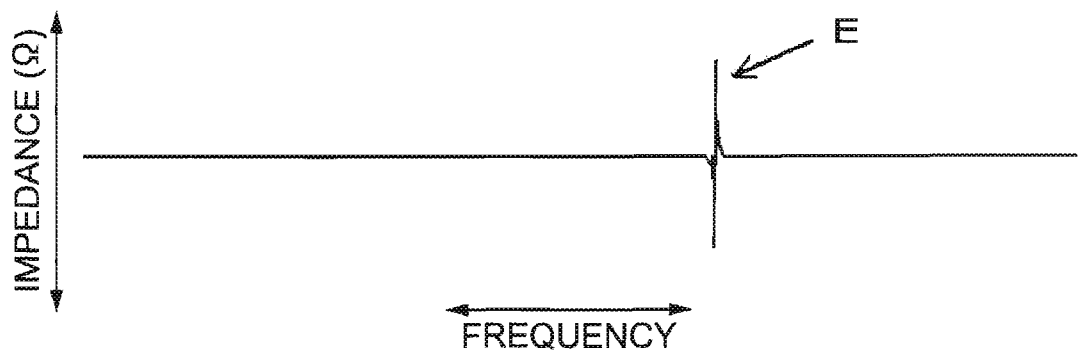
FIG. 52 is a graph illustrating an impedance frequency characteristic of the lamb wave type high frequency resonator according to the twelfth embodiment of the invention.

FIG. 52 shows the impedance frequency characteristic of the lamb wave type high frequency resonator 12 of the twelfth embodiment. Note that FIG. 52 shows a graph, provided that $\Delta t/\lambda=0.005$. As shown in FIG. 52, only the mode E is extensively excited; modes A, B, C, D, and F, other than the mode E, are suppressed and eliminated.

Note that, in the eleventh embodiment in which the IDT electrode 30 and the reflectors 40 and 50 are structured, if the insulation film (not shown) is deposited on the IDT electrode, modes other than the mode to be used can be suppressed from the same reason described above.

According to the twelfth embodiment, depositing the insulation film 60 covering the upper surface of the IDT electrode 30 allows the reflection coefficient of the IDT electrode to be small. Further, setting a concavity and a convexity of the surface of the insulation film 60 in the range of $\Delta t/\lambda \leq 0.044$ allows the reflection coefficient of the IDT electrode to be extremely small, eliminating almost all of reflection. As a result the spurious can be almost suppressed.

In addition, in a case where oscillators are structured by using the lamb wave type high frequency resonator, oscillators having high reliability without abnormal oscillations or frequency jumps can be achieved together with intensifying the excitation of the mode to be used by setting the relation of pi≠pr, where pi is the density of the electrode material of the IDT electrode 30 and pr is the density of the electrode material of the reflectors 40 and 50.

Note that a quartz crystal substrate is used as the piezoelectric substrate 20 in the first through the twelfth embodiments.

Figure 53:
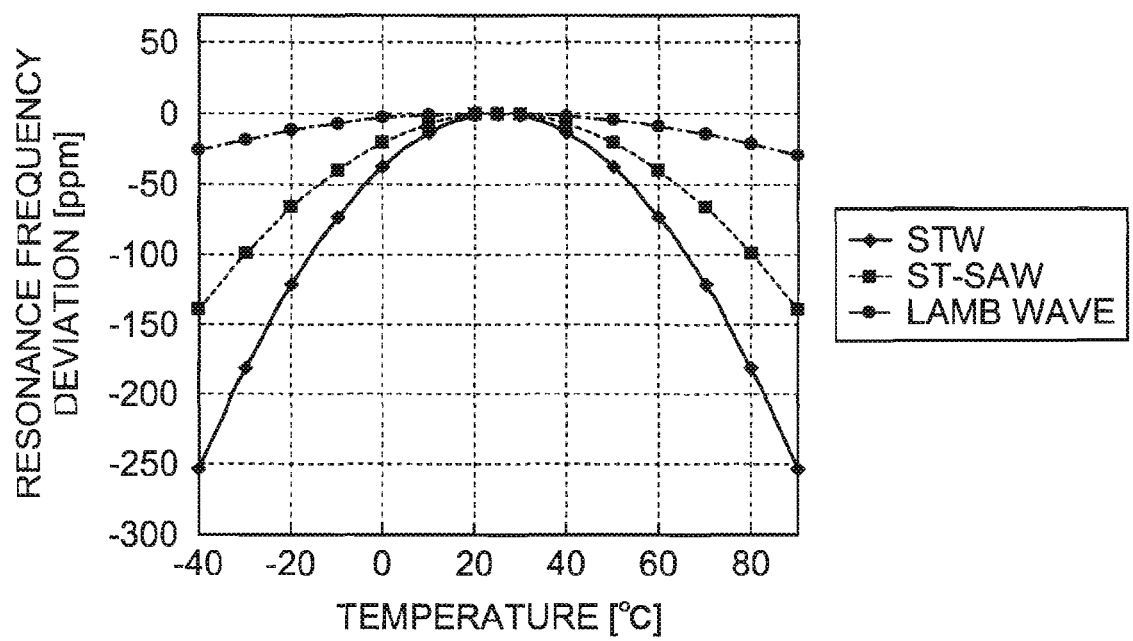
FIG. 53 is a graph illustrating a relation between temperature and resonance frequency deviation of the lamb wave type high frequency resonator according to the embodiments of the invention.

FIG. 53 is a graph illustrating the relation of temperature and a resonance frequency deviation when a quartz crystal substrate is used as the piezoelectric substrate 20. In FIG. 53, the relations of temperature and the resonance frequency deviation are compared with regard to the followings: a Rayleigh wave type surface acoustic wave element, which is known technique as aforementioned, using a quartz crystal substrate of ST cut; an SH wave type surface acoustic wave element, which is known technique as aforementioned, using STW cut quartz crystal; and the lamb wave type high frequency resonators 1 to 12 according to the invention. This graph shows that the lamb wave type high frequency resonators 1 to 12 have small resonance frequency deviation against temperature change.

Accordingly, a lamb wave type high frequency resonator can be achieved that has an excellent frequency-temperature characteristic in addition to being capable of intensifying the excitation of the desired mode and depressing the spurious both of which can obtained by the first through twelfth embodiments.

It should be understood that the invention is not limited to the above-described embodiments. Various modifications and improvements can be made without departing from the spirit and scope of the invention.

While the invention is mainly illustrated and described with respect to a specific exemplary embodiment, it will be apparent that those skilled in the art can made various modifications in shapes, materials, combinations, other detailed structures, and manufacturing methods in fabrication processes that are described in the above-described embodiments without departing from technical ideas and scope of the invention.

Accordingly, the descriptions, in which shapes, materials, fabrication processes are described as limited, disclosed above are only exemplary ones to make the invention easy to understand, do not limit the invention. Thus, descriptions based on names of members free from part of or whole the limitation of shapes, materials, or combinations thereof are included in the invention.

Figure 54:
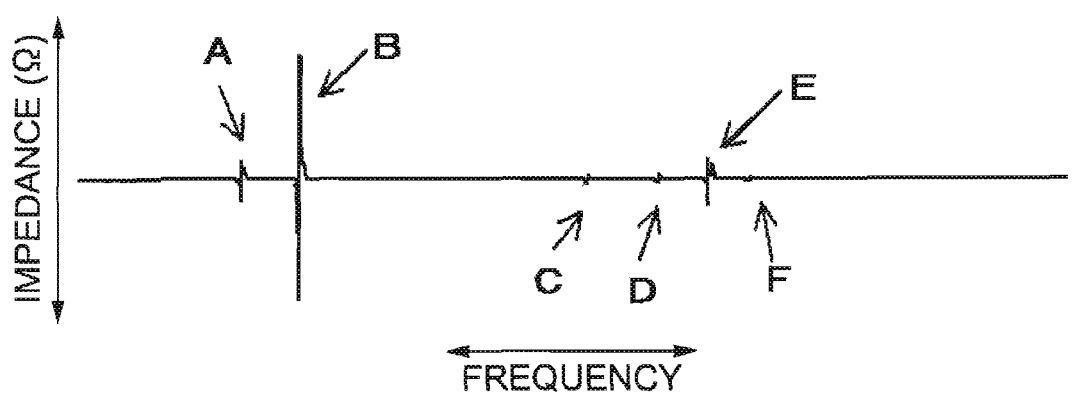
FIG. 54 is a graph illustrating an impedance frequency characteristic of the lamb wave type high frequency resonator according to another embodiment of the invention.
Figure 55A:
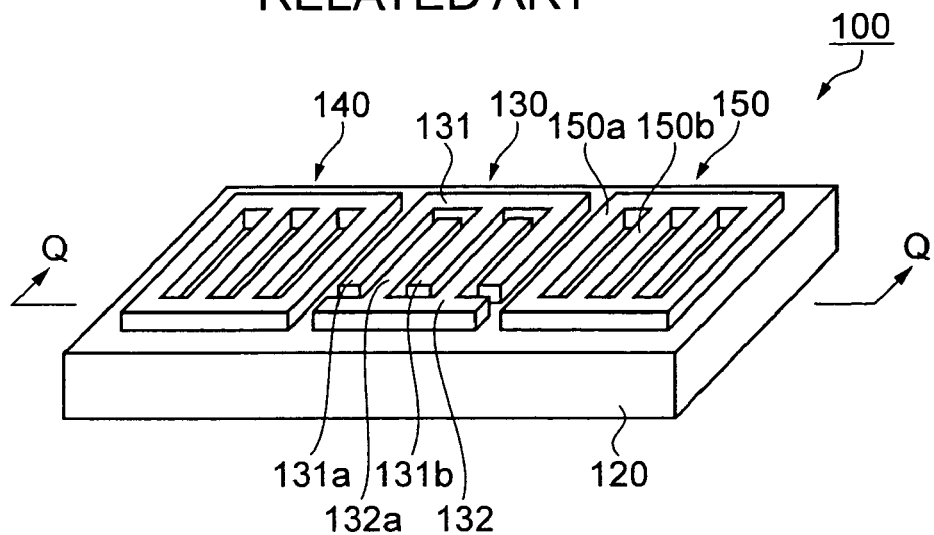
FIGS. 55A and 55B show a structure of the lamb wave type high frequency resonator by related art.
Figure 55B:
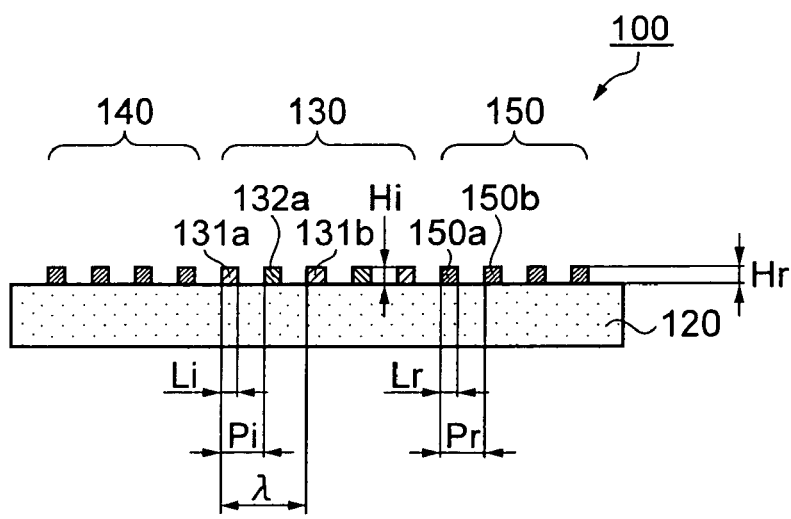
Figure 56:
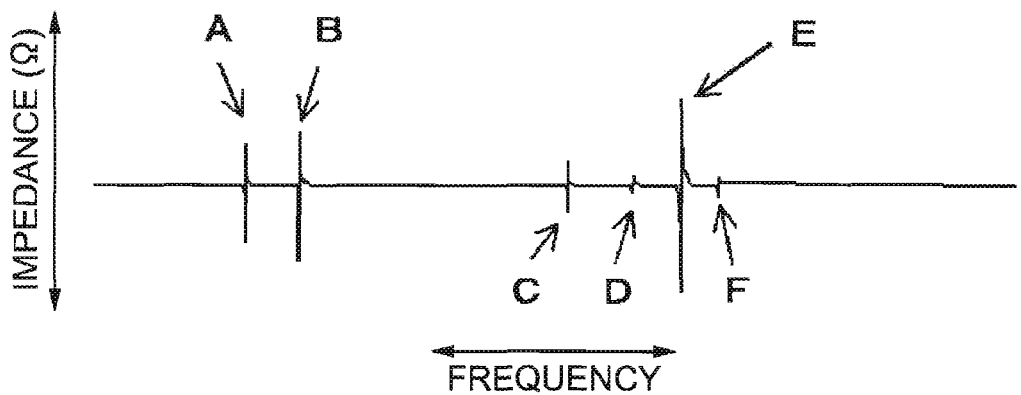
FIG. 56 is a graph illustrating an impedance frequency characteristic of the lamb wave type high frequency resonator of related art.

In the first through the twelfth embodiments, it is described that the mode adequately selected is intensively excited by varying each of the pitch, width, thickness, and density of the electrode finger of the IDT electrode and reflector. However, the modes A, B, C, D, E, and F can be selectively intensified by combining these design factors. For example, the excitation of mode B can be intensified as shown in FIG. 54.

In addition, while $SiO_2$ is employed as the insulation film in the third, sixth, ninth, and twelfth embodiments, Si, SiNx, $Al_2O_3$, ZnO, $Ta_2O_5$, or the like can be employed in addition to $SiO_2$.

In addition, while aluminum, gold, silver, and copper are exemplified as the electrode material of the IDT electrode and reflector in the embodiments, the material is not limited these, but tungsten, tantalum, nickel, chromium, or the like can be employed. Further, alloy of aluminum and copper, or other alloys can be used as the electrode material of the IDT electrode and the reflector.

In the invention, a case is described in which a quartz crystal substrate is used as the piezoelectric substrate. However, the piezoelectric substrate is not limited to the quartz crystal substrate, the followings can be used: piezoelectric substrate such as lithium tantalate, lithium niobate, lithium tetraborate, langasite crystal, langanite crystal, potassium niobate crystal; piezoelectric thin film of zinc oxide, aluminum nitride, tantalum pentoxide, or the like; and piezoelectric semiconductor such as cadmium sulfide, zinc sulfide, gallium arsenide, indium antimonide.

In the invention, while one-port type resonator is exemplified as a lamb wave type high frequency device, but the invention can also be applied to two-port type resonators or filters equipped with the IDT electrode and reflector.

Consequently, a lamb wave type high frequency resonator can be provided in which the excitation of the mode to be used is selectively intensified, the spurious is suppressed, and which has excellent temperature frequency characteristic, according to the first through the twelfth embodiments. Moreover, in a case where the lamb wave type high frequency resonator of the invention is used to oscillators, abnormal oscillations or frequency jumps can be reduced, while in a case where it is used to filters, ripples in frequency bands can be suppressed.

The lamb wave type high frequency device of the invention can be widely used for usage such as frequency selection filters in cellular phones, and oscillators as well as resonators in keyless entry systems.

The entire disclosure of Japanese Patent Application Nos: 2005-138088, filed May 11, 2005, 2005-374470, filed Dec. 27, 2005, 2006-028017, filed Feb. 6, 2006, 2005-292129, filed Oct. 5, 2005, 2005-294431, filed Oct. 7, 2005, are expressly incorporated by reference herein.

What is claimed is:

1. A lamb wave type high frequency device, comprising:
an interdigital transducer (IDT) electrode having an electrode finger interdigitated therein;
a pair of reflectors having an electrode finger and being disposed at both sides of a propagation direction of a lamb wave excited by the IDT electrode; and
a piezoelectric substrate on a surface of which the IDT electrode and the reflectors are disposed,
an insulation film deposited so as to cover the IDT electrode, wherein a pitch of the electrode finger of the IDT electrode and a pitch of the electrode finger of the reflectors are different from one another and $\Delta t/\lambda$ satisfies a relation of $\Delta t/\lambda \leq 0.044$, where $\Delta t$ is a height difference between a first surface of the insulation film disposed on the IDT and a second surface of the insulation film disposed on the piezoelectric substrate, and $\lambda$ is a wavelength of a lamb wave.

2. The lamb wave type high frequency device according to claim 1, wherein two electrode fingers adjacent each other in the IDT electrode are interdigitated in a range of a wavelength $\lambda$ of a lamb wave.

3. The lamb wave type high frequency device according to claim 1, wherein two sets of electrode fingers are interdigitated in a range of a wavelength $\lambda$ of a lamb wave, one set of electrode fingers being composed of two electrode fingers adjacent each other in the IDT electrode.

4. A lamb wave type high frequency device, comprising:
an IDT electrode having an electrode finger interdigitated therein;
a pair of reflectors having an electrode finger and being disposed at both sides of a propagation direction of a lamb wave excited by the IDT electrode;
a piezoelectric substrate on a surface of which the IDT electrode and the reflectors are disposed; and
an insulation film deposited so as to cover the IDT electrode, wherein a width of the electrode finger of the IDT electrode and a width of the electrode finger of the reflectors are different from one another and $\Delta t/\lambda$ satisfies a relation of $\Delta t/\lambda \leq 0.044$, where $\Delta t$ is a height difference between a first surface of the insulation film disposed on the IDT and a second surface of the insulation film disposed on the piezoelectric substrate, and $\lambda$ is a wavelength of a lamb wave.

5. The lamb wave type high frequency device according to claim 4, wherein two electrode fingers adjacent each other in the IDT electrode are interdigitated in a range of a wavelength λ of a lamb wave.

6. The lamb wave type high frequency device according to claim 4, wherein two sets of electrode fingers are interdigitated in a range of a wavelength a of a lamb wave, one set of electrode fingers being composed of two electrode fingers adjacent each other in the IDT electrode.

7. A lamb wave type high frequency device, comprising:
an interdigital transducer (IDT) electrode having an electrode finger interdigitated therein;
a pair of reflectors having an electrode finger and being disposed at both sides of a propagation direction of a lamb wave excited by the IDT electrode;
a piezoelectric substrate on a surface of which the IDT electrode and the reflectors are disposed; and
an insulation film deposited so as to cover the IDT electrode, wherein a thickness of the electrode finger of the IDT electrode and a thickness of the electrode finger of the reflectors are different from one another and $\Delta t/\lambda$ satisfies a relation of $\Delta t/\lambda \leqq 0.044$, where $\Delta t$ is a height difference between a first surface of the insulation film disposed on the IDT and a second surface of the insulation film disposed on the piezoelectric substrate, and λ is a wavelength of a lamb wave.

8. The lamb wave type high frequency device according to claim 7, wherein two electrode fingers adjacent each other in the IDT electrode are interdigitated in the range of a wavelength λ of a lamb wave.

9. The lamb wave type high frequency device according to claim 7, wherein two sets of electrode fingers are interdigitated in a range of a wavelength λ of a lamb wave, one set of electrode fingers being composed of two electrode fingers adjacent each other in the IDT electrode.

10. A lamb wave type high frequency device, comprising:
an interdigital transducer (IDT) electrode having an electrode finger interdigitated therein;
a pair of reflectors having an electrode finger and being disposed at both sides of a propagation direction of a lamb wave excited by the IDT electrode;
a piezoelectric substrate on a surface of which the IDT electrode and the reflectors are disposed; and
an insulation film deposited so as to cover the IDT electrode, wherein a density of the electrode finger of the IDT electrode and a density of an electrode material forming the reflectors are different from one another and $\Delta t/\lambda$ satisfies a relation of $\Delta t/\lambda \leqq 0.044$, where $\Delta t$ is a height difference between a first surface of the insulation film disposed on the IDT and a second surface of the insulation film disposed on the piezoelectric substrate, and λ is a wavelength of a lamb wave.

11. The lamb wave type high frequency device according to claim 10, wherein two electrode fingers adjacent each other in the IDT electrode are interdigitated in a range of a wavelength λ of a lamb wave.

12. The lamb wave type high frequency device according to claim 10, wherein two sets of electrode fingers are interdigitated in a range of a wavelength λ of a lamb wave, one set of electrode fingers being composed of two electrode fingers adjacent each other in the IDT electrode.

\* \* \* \* \*